(12) United States Patent
Lu et al.

(10) Patent No.: US 12,538,675 B2
(45) Date of Patent: Jan. 27, 2026

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yanwei Lu, Beijing (CN); Binyan Wang, Beijing (CN); Shiqi Li, Beijing (CN); Jianchang Cai, Beijing (CN); Yao Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 407 days.

(21) Appl. No.: 18/268,598

(22) PCT Filed: Jul. 19, 2022

(86) PCT No.: PCT/CN2022/106514
§ 371 (c)(1),
(2) Date: Jun. 20, 2023

(87) PCT Pub. No.: WO2024/016165
PCT Pub. Date: Jan. 25, 2024

(65) Prior Publication Data
US 2024/0389409 A1    Nov. 21, 2024

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ............. H10K 59/131; H10K 59/1213; H10K 59/126; H10K 50/10; G09G 3/3225;
(Continued)

(56) References Cited

U.S. PATENT DOCUMENTS 10,068,525 B2 * 9/2018 Shin ..................... H10K 59/805
2004/0140758 A1 * 7/2004 Raychaudhuri ........ H10K 50/17
313/504
(Continued)

FOREIGN PATENT DOCUMENTS

CN       107316873 A       11/2017
CN       108597374 A        9/2018
(Continued)

*Primary Examiner* — Caleb E Henry
(74) *Attorney, Agent, or Firm* — Ling Wu; Stephen Yang; Ling and Yang Intellectual Property

(57) ABSTRACT

Provided are a display panel and a display apparatus. The display panel includes a substrate, a circuit structure layer, a light emitting structure layer and multiple transparent conductive layers. The transparent conductive layer is located between the circuit structure layer and the light emitting structure layer, and includes multiple first type conductive lines and multiple second type conductive lines. The portion of the first type conductive line extending along a first direction overlaps with an orthographic projection of the shield electrode on the substrate, and the portion of the second type conductive line extending along the first direction does not overlap with an orthographic projection of the shield electrode on the substrate.

20 Claims, 28 Drawing Sheets

(58) Field of Classification Search
CPC .............. G09G 3/3266; G09G 3/3233; G09G 2300/0439; G09G 3/3208; G09G 2300/0426; H01L 27/3276; H01L 27/3248; H01L 51/0096; H01L 27/124; H01L 27/3234; H01L 27/3246; H01L 27/3262; H01L 27/3227; H01L 27/3244; H01L 27/32; H01L 51/52; Y02E 10/549
See application file for complete search history.

(56) References Cited

U.S. PATENT DOCUMENTS

| | | | | |
|---|---|---|---|---|
| 2007/0007515 | A1* | 1/2007 | Suh | H10K 59/123 257/40 |
| 2007/0162074 | A1* | 7/2007 | Bartlett | A61B 17/0401 606/232 |
| 2008/0174709 | A1* | 7/2008 | Lim | H10D 86/441 445/47 |
| 2011/0109612 | A1* | 5/2011 | Chaji | G09G 5/18 345/211 |
| 2015/0102316 | A1* | 4/2015 | Park | H10K 59/122 257/40 |
| 2015/0311265 | A1* | 10/2015 | Matsueda | H10K 59/35 257/89 |
| 2015/0364530 | A1* | 12/2015 | Yoon | H10K 59/121 257/40 |
| 2016/0093679 | A1* | 3/2016 | Moon | H10K 59/122 257/40 |
| 2016/0321991 | A1 | 11/2016 | Song et al. | |
| 2016/0329387 | A1* | 11/2016 | Mohanan | H10K 50/11 |
| 2017/0062535 | A1* | 3/2017 | Kim | H10K 59/80524 |
| 2017/0069871 | A1* | 3/2017 | Yim | H10K 50/15 |
| 2017/0084635 | A1* | 3/2017 | Jung | H10D 30/6731 |
| 2017/0179441 | A1* | 6/2017 | Lee | H10K 59/1201 |
| 2017/0185195 | A1* | 6/2017 | Kim | G09G 3/3677 |
| 2017/0192580 | A1* | 7/2017 | Jung | G02F 1/134309 |
| 2017/0199441 | A1* | 7/2017 | Um | G02F 1/134309 |
| 2018/0108677 | A1* | 4/2018 | Yeh | H10D 86/441 |
| 2019/0205596 | A1* | 7/2019 | Kim | H10K 50/80 |
| 2019/0325186 | A1 | 10/2019 | Gao et al. | |
| 2021/0313410 | A1 | 10/2021 | Kim et al. | |
| 2021/0357093 | A1 | 11/2021 | Ma | |
| 2022/0093711 | A1 | 3/2022 | Jia et al. | |
| 2022/0319411 | A1 | 10/2022 | Cheng et al. | |
| 2023/0060545 | A1 | 3/2023 | Du et al. | |
| 2023/0143862 | A1 | 5/2023 | Kunshan | |

FOREIGN PATENT DOCUMENTS

| | | |
|---|---|---|
| CN | 110911438 A | 3/2020 |
| CN | 111381700 A | 7/2020 |
| CN | 111682055 A | 9/2020 |
| CN | 111818264 A | 10/2020 |
| CN | 112038374 A | 12/2020 |
| CN | 112071890 A | 12/2020 |
| CN | 113497109 A | 10/2021 |
| CN | 113763874 A | 12/2021 |
| CN | 114255703 A | 3/2022 |
| CN | 114373774 A | 4/2022 |
| WO | 2022068152 A1 | 4/2022 |

* cited by examiner

DISPLAY PANEL AND DISPLAY APPARATUS

CROSS-REFERENCE TO RELATED APPLICATION

This application is a national stage application of PCT Application No. PCT/CN2022/106514, which is filed on Jul. 19, 2022, and entitled "Display Panel and Display Apparatus", the content of which should be regarded as being incorporated herein by reference.

TECHNICAL FIELD

Embodiments of the present disclosure relate to, but are not limited to, the field of display technologies, and particularly to a display panel and a display apparatus.

BACKGROUND

An Organic Light Emitting Diode (OLED) and a Quantum dot Light Emitting Diode (QLED) are active light emitting display apparatuses and have advantages of self-illumination, a wide angle of view, a high contrast ratio, low power consumption, an extremely high reaction speed, lightness and thinness, bendability, and a low cost, etc. An under screen camera technology is a brand-new technology proposed for increasing a screen-to-body ratio of a display apparatus.

SUMMARY

The following is a summary of subject matters described herein in detail. The summary is not intended to limit the protection scope of claims.

In one aspect, an embodiment of the present disclosure provides a display panel including: a substrate, a circuit structure layer and a light emitting structure layer stacked on the substrate, and multiple conductive layers disposed between the circuit structure layer and the light emitting structure layer; wherein,
the substrate includes a first display region and a second display region, wherein the second display region is located on at least one side of the first display region, and the light transmittance rate of the first display region is greater than the light transmittance rate of the second display region;
the circuit structure layer includes: a first gate signal line located in the second display region, a constant voltage line, multiple shield electrodes and multiple pixel circuits, wherein the pixel circuit includes a drive transistor, the drive transistor includes a gate, and the multiple pixel circuits include multiple first pixel drive circuits; the first gate signal line is connected to the gate of the drive transistor; the constant voltage line is configured to provide a first constant voltage to the multiple pixel circuits; the shield electrode is connected to the constant voltage line, and an orthographic projection of the first gate signal line on the substrate falls into an orthographic projection of the shield electrode on the substrate;
the multiple conductive layers include: multiple conductive lines, the multiple conductive lines include multiple first type conductive lines and multiple second type conductive lines, an orthographic projection of a portion of the first type conductive line extending along a first direction on the substrate overlaps with an orthographic projection of at least one of the multiple shield electrodes on the substrate, and an orthographic projection of a portion of the second type conductive line extending along the first direction on the substrate does not overlap with an orthographic projection of the multiple shield electrodes on the substrate;
the light emitting structure layer includes multiple first light emitting devices located in the first display region, the multiple first light emitting devices include multiple first type first light emitting devices and multiple second type first light emitting devices, at least one of the multiple first type first light emitting devices is connected to at least one of the multiple first pixel drive circuits through at least one of the multiple first type conductive lines, at least one of the multiple second type first light emitting devices is connected to at least one of the multiple first pixel drive circuits through at least one of the multiple second type conductive lines, the first pixel drive circuit is configured to drive the first light emitting device to emit light, the first type first light emitting device is configured to emit light of a first color, the second type light emitting device is configured to emit light of a second color, and the light of the second color is different from the light of the first color.

In another aspect, an embodiment of the present disclosure further provides a display apparatus, including: the display panel described in the above embodiment.

Other characteristics and advantages of the present disclosure will be group forth in the following specification, and moreover, partially become apparent from the specification or are understood by implementing the present disclosure. Other advantages of the present disclosure may be achieved and obtained through solutions described in the specification and drawings.

Other aspects will become apparent upon reading and understanding the accompanying drawings and the detailed description.

BRIEF DESCRIPTION OF DRAWINGS

The drawings are used for providing understanding of technical solutions of the present disclosure, constitute a part of the specification and together with the embodiments of the present disclosure, are used for explaining the technical solutions of the present disclosure but do not form limitations on the technical solutions of the present disclosure. Shapes and sizes of one or more components in the drawings do not reflect true scales, and are only intended to schematically describe contents of the present disclosure.

DETAILED DESCRIPTION

Figure 1:
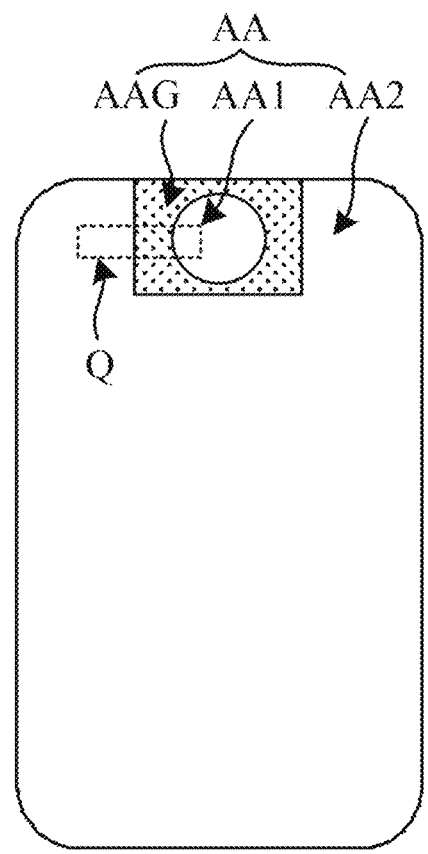
FIG. 1 is a schematic diagram of a structure of a display panel according to an embodiment of the present disclosure.

Many embodiments are described herein, but the description is exemplary rather than restrictive, and there may be more embodiments and implementation solutions within the scope contained in the embodiments described herein. Although many possible feature combinations are shown in the drawings and discussed in exemplary implementations, many other combinations of the disclosed features are possible. Unless expressly limited, any feature or element of any embodiment may be used in combination with, or may replace, any other feature or element in any other embodiment.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect a true proportion. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity. In the present disclosure, "plurality" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but also include a switching element such as a transistor, a resistor, an inductor, a capacitor, another element with multiple functions, etc.

In the specification, a transistor refers to an element that at least includes three terminals, i.e., a gate electrode (gate or control electrode), a drain electrode (drain electrode terminal, drain region, or drain), and a source electrode (source electrode terminal, source region, or source). A transistor has a channel region between a drain electrode and a source electrode, and a current can flow through the drain electrode, the channel region, and the source electrode. It is to be noted that, in the specification, the channel region refers to a region through which the current mainly flows.

In the specification, in order to distinguish two electrodes of a transistor other than a gate electrode (gate electrode or control electrode), one of the two electrodes is directly described as a first electrode, while the other is described as a second electrode. The first electrode may be a drain electrode, and the second electrode may be a source electrode. Or, the first electrode may be a source electrode, and the second electrode may be a drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

Transistors in embodiments of the present disclosure may be Thin Film Transistors (TFTs), or Field Effect Transistors (FETs), or other devices with same characteristics. For example, a thin film transistor used in embodiments of the present disclosure may include, but is not limited to, an oxide TFT or a Low Temperature Poly-silicon TFT (LTPS TFT). Here, no limitation is made thereto in embodiments of the present disclosure.

In the specification, "parallel" refers to a state in which an angle formed by two straight lines is −10° or more than −10° and 10° or lower than 10°, and thus also includes a state in which the angle is −5° or more than −5° and 5° or lower than 5°. In addition, "perpendicular" refers to a state in which an angle formed by two straight lines is 80° or more than 80° and 100° or less than 100°, and thus also includes a state in which the angle is 85° or more than 85° and 95° or more than 95°.

In the present disclosure, "about", "approximate" and "approximately" refer to a case that a boundary is defined not so strictly and a process and measurement error within a range is allowed. For example, in the present disclosure, "substantially the same" refers to a case where values differ by less than 10%.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In an embodiment of the present disclosure, a first direction X may refer to an extending direction of a grid line in a display region or a horizontal direction, a second direction Y may refer to an extending direction of a data line in the display region or a vertical direction, and a third direction Z may refer to a direction perpendicular to a plane of a display panel or a thickness direction of a display panel, etc. Herein, the first direction X and the second direction Y may be perpendicular to each other, and the first direction X and the third direction Z may be perpendicular to each other.

With the development of display technology, full-screen or narrow-bezel products have gradually become the development trend of display products with their large screen-to-body ratio and ultra-narrow bezels. For products such as smart terminals, cameras or fingerprint sensors are usually set up. In order to increase the proportion of screens, full-screen or narrow-bezel products usually adopt Full display with camera (FDC) or under-screen fingerprint technology, and sensors such as cameras are placed in the Under Display Camera (UDC) of the display panel. The under-screen camera region not only has a certain transmittance rate, but also has a display function, achieving Full Display in Camera (FDC) region.

FIG. 1 is a schematic structural diagram of a display panel. As shown in FIG. 1, on a plane parallel to the display panel, a display region AA of the display panel may include a first display region AA1 and a second display region AA2, and the second display region AA2 may be located on at least one side of the first display region AA1. For example, the second display region AA2 may at least partially surround the first display region AA1. For example, the second display region AA2 may include a transition display region AAG close to the first display region AA1. For example, the position of the first display region AA1 may correspond to the position of the sensor and be configured to display a picture and transmit light, and the transmitted light is received by the sensor. The first display region AA1 may also be referred to as a sensor corresponding region, an off-screen camera display region, a light transmitting display region, or the like. For example, the second display region AA2 is configured to display a picture, and may also be referred to as a normal resolution display region, a normal sub-pixel region, a low transmission display region, or the like. For example, the transition display region AAG is configured to display a picture and configure signal traces connected to signal lines in the light transmitting display region to lead out these signal lines, and the transition display region AAG may also be referred to as a Dummy sub-pixel region.

In an exemplary embodiment, the light transmittance rate of the first display region AA1 is higher than the light transmittance rate of the second display region AA2. The light transmittance rate of the first display region AA1 is higher than the light transmittance rate of the transition display region AAG. A "light transmittance rate" in the present disclosure refers to an ability of light to pass through a medium, and is a percentage of luminous flux passing through a transparent or translucent body to its incident luminous flux. In this way, since the position of the first display region AA1 can correspond to the position of the sensor, an orthographic projection of the sensor on the display panel and the first display region AA1 have an overlapping region, so that more light can pass through the display panel and be received by the sensor. For example, "there is an overlapping region between an orthographic projection of the sensor on the display panel and the first display region AA1" may mean that part of an orthographic projection of the sensor on the display panel is located within the first display region AA1, or all of an orthographic projection of the sensor on the display panel is located within the first display region AA1, or an orthographic projection of the photosensitive window of the sensor is located within the first display region AA1, etc. Here, no limitation is made thereto in embodiments of the present disclosure.

In an exemplary embodiment, the resolution of the first display region AA1 and the second display region AA2 may be the same, or the resolution of the first display region AA1 may be lower than that of the second display region AA2.

Pixels Per Inch (PPI) refers to the number of pixels per unit area, which may be called pixel density. The higher the PPI value, a picture with the higher density the display panel can display, and the richer the details of the picture.

In an exemplary embodiment, the first display region AA1 may be located at an upper, lower, or edge position or the like of the display region of the display panel. For example, the first display region AA1 may be located in the middle of the top of the display region of the display panel, and the second display region AA2 may surround the first display region AA1. Alternatively, the first display region AA1 may be located at other positions such as an upper left corner or an upper right corner of the display region of the display panel, and the second display region AA2 may surround at least one side of the first display region AA1 (for example, one side, upper and lower sides, left and right sides, etc.). Here, no limitation is made thereto in embodiments of the present disclosure.

In an exemplary embodiment, in a plane parallel to the display panel, the shape of the first display region AA1 may be any one or more of the following: square, rectangle, polygon, circle, elliptic semicircle, pentagon, etc. For example, the shape of the display region of the display panel may be rectangular such as a rounded rectangle and the first display region AA1 may be circular. Here, no limitation is made thereto in embodiments of the present disclosure.

In an exemplary embodiment, in a plane parallel to the display panel, the shape of the outer contour of the transition display region AAG may be any one or more of the following: rectangular, polygonal, circular, elliptical, and the like. Here, no limitation is made thereto in embodiments of the present disclosure.

In an exemplary embodiment, the sensors may include, but are not limited to, a camera sensor, a fingerprint sensor, a light sensor, an infrared sensor, an ultrasonic sensor, a LIDAR (Light Detection and Ranging) sensor, or a Radar sensor, etc. Here, no limitation is made thereto in embodiments of the present disclosure.

In an exemplary embodiment, on a plane perpendicular to the display panel, the first display region AA1 may include a first circuit structure layer disposed on a substrate and a first light emitting structure layer disposed on a side of the first circuit structure layer away from the substrate. The second display region AA2 may include a second circuit structure layer disposed on a substrate and a second light emitting structure layer disposed on a side of the second circuit structure layer away from the substrate.

In an exemplary embodiment, the first circuit structure layer of the first display region AA1 includes multiple insulating layers stacked, and the first circuit structure layer may be referred to as a composite insulating layer. The first light emitting structure layer of the first display region AA1 may include multiple functional sub-pixels, the functional sub-pixels may include a first light emitting device sp1, the first light emitting device sp1 may at least include a first anode, the first anode of at least one functional sub-pixel is connected to at least one first pixel drive circuit QD1 in the transition display region AAG in the second display region AA2 through a conductive line (e.g. a transparent conductive line). The first pixel drive circuit QD1 is configured to output a corresponding current to the connected first light emitting device sp1 through the conductive line, and the first light emitting device sp1 is configured to emit light of a corresponding brightness in response to the current output by the connected pixel drive circuit.

In an exemplary embodiment, the second circuit structure layer of the second display region AA2 may include multiple first pixel drive circuits QD1 and multiple second pixel drive circuits QD2, and the second circuit structure layer may be referred to as a drive structure layer. A region in the second display region AA2 where the first pixel drive circuit QD1 is provided may be referred to as a transition display region AAG. The second light emitting structure layer of the second display region AA2 may include multiple normal sub-pixels, the normal sub-pixel may include a second light emitting device sp2, the second light emitting device sp2 may at least include a second anode, the second anode of at least one normal sub-pixel is connected to at least one second pixel drive circuit QD2. The second pixel drive circuit QD2 is configured to directly output a corresponding current to the connected second light emitting device sp2, and the second light emitting device sp2 is configured to emit light of a corresponding brightness in response to the current output by the connected pixel drive circuit.

For example, the first light emitting device sp1 is located in a different display region from the first pixel drive circuit QD1 driving it, so the first light emitting device sp1 may be referred to as a non-in-situ drive light emitting device, and the first pixel drive circuit QD1 may be referred to as a non-in-situ pixel drive circuit. For example, the second light emitting device sp2 and the second pixel drive circuit QD2 driving it are both located in the second display region AA2, so the second light emitting device sp2 may be referred to as an in-situ drive light emitting device, and the second pixel drive circuit QD2 may be referred to as an in-situ pixel drive circuit.

In an exemplary embodiment, the display region of the display panel may include: multiple pixel units P arranged in a matrix, and at least one of the multiple pixel units P may include: multiple sub-pixels. A sub-pixel may be a smallest part with controllable brightness. At least one sub-pixel may include a light emitting device and an image drive circuit connected to the light emitting device, the pixel drive circuit is configured to drive the connected light emitting device to emit light.

In an exemplary embodiment, the light emitting device may be any one of a Light Emitting Diode (LED), an Organic Light Emitting Diode (OLED), a Quantum Dot Light Emitting Diodes (QLED), a micro LED (including a mini-LED or a micro-LED), and the like. For example, the light emitting device may be an OLED, and the light emitting device emits red light, green light, blue light, or white light, etc. under driving by its corresponding pixel drive circuit.

In an exemplary embodiment, taking the light emitting device as an OLED as an example, the light emitting device may include an anode, a cathode, and an organic light emitting layer located between the anode and the cathode. The anode of the light emitting device may be electrically connected with the corresponding pixel drive circuit.

In an exemplary embodiment, the color in which the light emitting device emits light may be determined by a person skilled in the art depending on the actual application scenario. For example, at least one of the multiple pixel units P may include three sub-pixels, which may include a red (R) sub-pixel, a green (G) sub-pixel, and a blue (B) sub-pixel. For another example, at least one of the multiple pixel units P may include: four sub-pixels, and the four sub-pixels may be red sub-pixels, green sub-pixels, blue sub-pixels and white sub-pixels respectively. Here, no limitation is made thereto in embodiments of the present disclosure.

In an exemplary embodiment, a shape of each light emitting device may be a rectangle, a diamond, a pentagon, or a hexagon.

Figure 2:
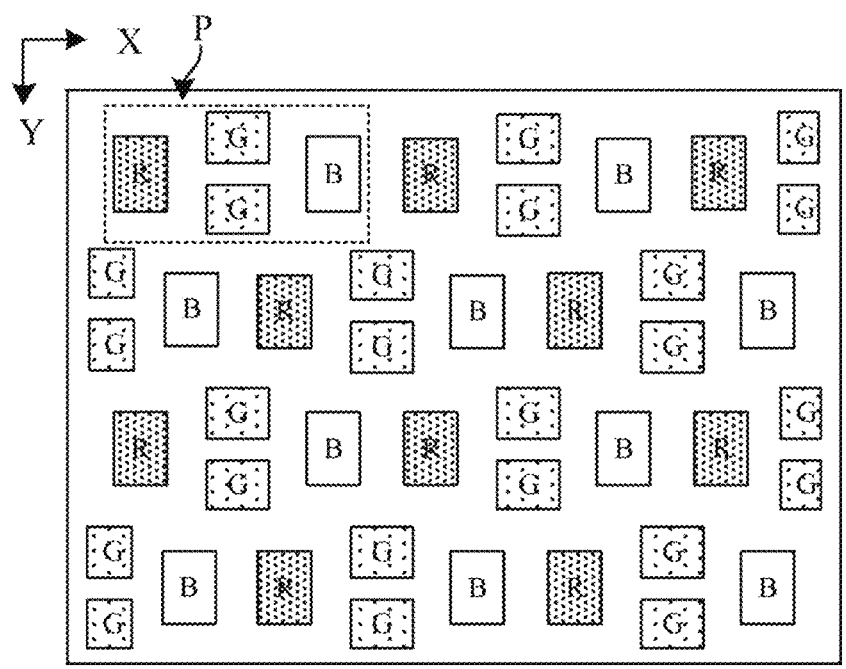
FIG. 2 is a schematic planar view of a structure of a display panel according to an embodiment of the present disclosure.

In an exemplary embodiment, the multiple sub-pixels in the pixel unit may be arranged in a manner, such as standing side by side horizontally, standing side by side vertically, an X shape, a cross shape, a shape like a pyramid, or the like. For example, taking a pixel unit including three sub-pixels as an example, the three sub-pixels may be arranged in a manner, such as standing side by side horizontally, standing side by side vertically, a shape like a pyramid, or the like. For example, taking a pixel unit including four sub-pixels as an example, the four sub-pixels may be arranged in a horizontal juxtaposition, a vertical juxtaposition, a Square or a Diamond manner, etc. For example, as shown in FIG. 2, taking four sub-pixels including one red sub-pixel, one blue sub-pixel and two green sub-pixels as an example, the four sub-pixels may be arranged in a Diamond manner to form an RGGB pixel arrangement. Here, no limitation is made thereto in embodiments of the present disclosure.

In an exemplary embodiment, the arrangement of the pixel units in the first display region AA1 and the arrangement of the pixel units in the second display region AA2 may be the same or may be different. The number of sub-pixels included in the pixel unit in the first display region AA1 and the number of sub-pixels included in the pixel unit in the second display region AA2 may be the same or may be different. The arrangement of the sub-pixels included in the pixel units in the first display region AA1 and the arrangement of the sub-pixels included in the pixel units in the second display region AA2 may be the same or may be different. Here, no limitation is made thereto in embodiments of the present disclosure.

In an exemplary embodiment, the pixel drive circuit may have a structure of 3T1C, 4T1C, 5T1C, 5T2C, 6T1C, 7T1C or 8T1C.

Figure 3:
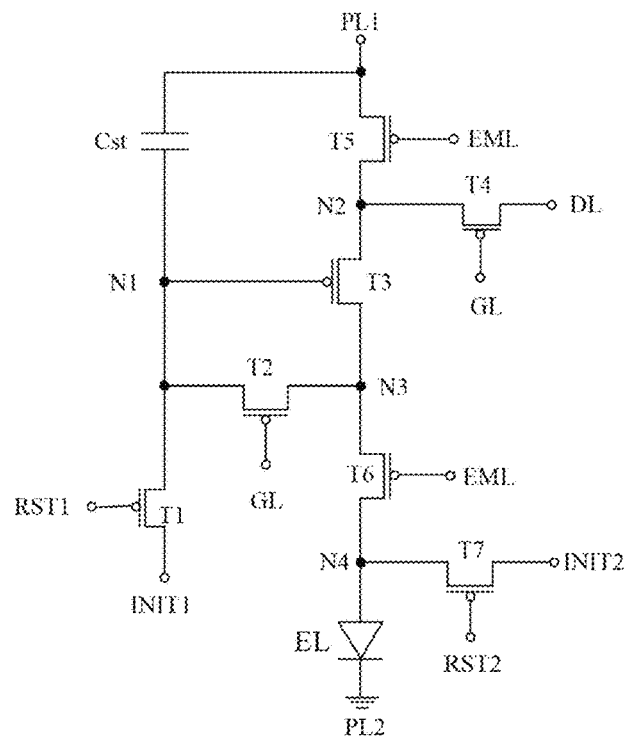
FIG. 3 is an equivalent circuit diagram of a pixel drive circuit according to an embodiment of the present disclosure.

In an exemplary embodiment, the pixel drive circuit of the present exemplary embodiment is described as an example adopting a 7T1C structure. FIG. 3 is an equivalent circuit diagram of the pixel drive circuit in the embodiment of the present disclosure. As shown in FIG. 3 the pixel drive circuit may include seven transistors (first transistor T1 to seventh transistor T7) and a storage capacitor Cst. The pixel drive circuit may be connected to eight signal lines (scan signal line GL, data signal line DL, first power supply line PL1, second power supply line PL2, light emitting control line EML, first initial signal line INIT1, second initial signal line INIT2, first reset control line RST1 and second reset control line RST2). The third transistor T3 may also be referred to as a drive transistor, the fourth transistor T4 may be referred to as a data write transistor, the second transistor T2 may be referred to as a threshold compensation transistor, the fifth transistor T5 may be referred to as a first light emitting control transistor, the sixth transistor T6 may be referred to as a second light emitting control transistor, the first transistor T1 may be referred to as a first reset transistor, and the seventh transistor T7 may be referred to as a second reset transistor.

In an exemplary embodiment, transistors may be divided into N type transistors and P type transistors according to their characteristics. When the transistor is a P type transistor, its turn-on voltage is a low-level voltage (e.g., 0V, −5V, −10V or other suitable voltages) and its turn-off voltage is a high-level voltage (e.g., 5V, 10V or other suitable voltages). When the transistor is an N type transistor, its turn-on voltage is a high-level voltage (e.g., 5V, 10V or other suitable voltages) and its turn-off voltage is a low-level voltage (e.g., 0V, −5V, −10V or other suitable voltages).

In an exemplary embodiment, the first transistor T1 to the seventh transistor T7 may be P type transistors or N type transistors. Use of a same type of transistors in a pixel drive circuit may simplify a process flow, reduce process difficulties of a display panel, and improve a product yield. In some possible implementations, the first transistor T1 to the seventh transistor T7 may include P type transistors and N type transistors.

In an exemplary embodiment, the first transistor T1 to the seventh transistors T7 may adopt low temperature polysilicon thin film transistors, or oxide thin film transistors, or low temperature polysilicon thin film transistors and oxide thin film transistors. An active layer of a Low Temperature Poly-Silicon thin film transistor is made of Low Temperature Poly-Silicon (LTPS), and an active layer of an oxide thin film transistor is made of an oxide semiconductor (Oxide). A low-temperature poly-silicon thin film transistor has advantages such as a high mobility and fast charging, while an oxide thin film transistor has an advantage such as a low leakage current. The low temperature poly-silicon thin film transistor and the oxide thin film transistor are integrated on one display panel to form a low temperature polycrystalline oxide (LTPO) display panel, and advantages of both the low temperature poly-silicon thin film transistor and the oxide thin film transistor may be utilized, which may achieve low frequency drive, reduce power consumption, and improve display quality.

In some exemplary embodiments, as shown in FIG. 3, a display panel may include a scan signal line GL, a data signal line DL, a first power supply line PL1, a second power supply line PL2, an emitting control line EML, a first initial signal line INIT1, a second initial signal line INIT2, a first reset control line RST1, and a second reset control line RST2. In some exemplary embodiments, the first power supply line PL1 may be configured to provide a constant first voltage signal VDD to the pixel drive circuit, the second power supply line PL2 may be configured to provide a constant second voltage signal VSS to the pixel drive circuit, and the first voltage signal VDD is greater than the second voltage signal VSS. The scan signal line GL may be configured to provide a scan signal SCAN to a pixel drive circuit, the data signal line DL may be configured to provide a data signal DATA to a pixel drive circuit, the light emitting control line EML may be configured to provide a light emitting control signal EM to a pixel drive circuit, the first reset control line RST1 may be configured to provide a first reset control signal RESET1 to a pixel drive circuit, and the second reset control line RST2 may be configured to provide a second reset control signal RESET2 to a pixel drive circuit. In an exemplary embodiment, in a pixel drive circuit of an n-th row, a first reset control line RST1 may be electrically connected to a scan signal line GL of a pixel drive circuit of an (n−1)-th row to allow a scan signal SCAN(n−1) to be inputted into the first reset control line RST1, that is, a first reset control signal RESET1(n) is the same as the scan signal SCAN(n−1). A second reset control line RST2 may be electrically connected to a scan signal line GL of the pixel drive circuit of the n-th row to be allow a scan signal SCAN(n) to be inputted into the second reset control line RST2, that is, a second reset control signal RESET2(n) is the same as the scan signal SCAN(n). In an exemplary embodiment, the second reset control line RST2 with which the pixel drive circuit of the n-th row is electrically connected and a first reset control line RST1 with which a pixel drive circuit of an (n+1)-th row is electrically connected may be in an integral structure. Herein, n is an integer greater than 0. In this way, signal lines of the display panel may be reduced to achieve a narrow bezel design of the display panel. However, this embodiment is not limited thereto.

In an exemplary embodiment, the first initial signal line INIT1 may be configured to provide a first initial signal to the pixel drive circuit, the second initial signal line INIT2 may be configured to provide a second initial signal to the pixel drive circuit. For example, the first initial signal may be different from the second initial signal. The first initial signal and the second initial signal may be constant voltage signals, and their magnitudes may be between the first voltage signal VDD and the second voltage signal VSS, but are not limited to this. In other examples, the first initial signal and the second initial signal may be the same, and only the first initial signal line may be set to provide the first initial signal.

In an exemplary embodiment, the first power supply line PL1 may act as a constant voltage line in order to save wiring. For example, in other examples, the first initial signal line INIT1 may also be used as a constant voltage line in order to save wiring. Examples of the constant voltage line are not limited to the first power supply line PL1 and the first initial signal line INIT1 and as long as the signal line is supplying a constant voltage in the pixel circuit may be used as the constant voltage line.

In an exemplary embodiment, the scan signal line GL, the light emitting control line EML, the first initial signal line INIT1, the second initial signal line INIT2, the first reset control line RST1 and the second reset control line RST2 may extend in a horizontal direction, and the first power supply line PL1, the second power supply line PL2 and the data signal line DL may extend in a vertical direction.

In an exemplary embodiment, as shown in FIG. 3, the third transistor T3 is electrically connected with the light emitting device EL, and outputs a drive current to drive the light emitting device EL to emit light under control of the scan signal SCAN, the data signal DATA, the first voltage signal VDD, and the second voltage signal VSS, etc. A gate of the fourth transistor T4 is electrically connected with the scan signal line GL, a first electrode of the fourth transistor T4 is electrically connected with the data signal line DL, and a second electrode of the fourth transistor T4 is electrically connected with the first electrode of the third transistor T3. A gate electrode of the second transistor T2 is electrically connected with the scan signal line GL, a first electrode of the second transistor T2 is electrically connected with the gate electrode of the third transistor T3, and a second electrode of the second transistor T2 is electrically connected with a second electrode of the third transistor T3. A gate electrode of the fifth transistor T5 is electrically connected with the light emitting control line EML, a first electrode of the fifth transistor T5 is electrically connected with the first power supply line PL1, and a second electrode of the fifth transistor T5 is electrically connected with the first electrode of the third transistor T3. A gate electrode of a sixth transistor T6 is electrically connected with the light emitting control line EML, a first electrode of the sixth transistor T6 is electrically connected with the second electrode of the third transistor T3, and a second electrode of the sixth transistor T6 is electrically connected with an anode of the light emitting device EL. A first transistor T1 is electrically connected with the gate electrode of the third transistor T3 and configured to reset the gate electrode of the third transistor T3, and a seventh transistor T7 is electrically connected with the anode of the light emitting device EL and configured to reset the anode of the light emitting device EL. A gate of the first transistor T1 is electrically connected with a first reset control line RST1, a first electrode of the first transistor T1 is electrically connected with a first initial signal line INIT1, and a second electrode of the first transistor T1 is electrically connected with the gate of the third transistor T3. A gate electrode of the seventh transistor T7 is electrically connected with a second reset control line RST2, a first electrode of the seventh transistor T7 is electrically connected with a second initial signal line INIT2, and a second electrode of the seventh transistor T7 is electrically connected with the anode of the light emitting device EL. A first capacitor electrode plate of the storage capacitor Cst is electrically connected with the gate of the third transistor T3, and a second capacitor electrode plate of the storage capacitor Cst is electrically connected with the first power supply line PL1.

In an exemplary embodiment, as shown in FIG. 3, the pixel drive circuit may include a first node N1, a second node N2, a third node N3, and a fourth node N4. Wherein, the first node N1 is a connection point of the storage capacitor Cst, the first transistor T1, the third transistor T3, and the second transistor T2, the second node N2 is a connection point of the fifth transistor T5, the fourth transistor T4, and the third transistor T3, the third node N3 is a connection point of the third transistor T3, the second transistor T2, and the sixth transistor T6, and the fourth node N4 is a connection point of the sixth transistor T6, the seventh transistor T7, and the light emitting device EL. The fourth node N4 is an anode connection node.

In an exemplary embodiment, the light emitting device EL may be an organic electroluminescent diode (OLED) including an anode, a cathode, and an organic light emitting layer disposed between the anode and the cathode.

The operation process of the pixel drive circuit shown in FIG. 3 will be described below by taking an example that multiple transistors included in the pixel drive circuit shown in FIG. 3 are all P type transistors.

In an exemplary embodiment, during one frame of display period, the operating process of the pixel drive circuit may include a first stage S1, a second stage S2, and a third stage S3.

The first stage S1 is referred to as a reset stage. A first reset control signal RESET1 provided by the first reset control line RST1 is a low-level signal, so that the first transistor T1 is turned on, and a first initial signal provided by the first initial signal line INIT1 is provided to the first node N1 to initialize the first node N1 and clear an original data voltage in the storage capacitor Cst. The scan signal SCAN provided by the scan signal line GL is a high-level signal and the light control signal EM provided by the light control line EML is a high-level signal, which disconnects the fourth transistor T4, the second transistor T2, the fifth transistor T5, the sixth transistor T6, and the seventh transistor T7. At this stage, the light emitting device EL does not emit light.

The second stage S2 is referred to as a data write stage or a threshold compensation stage. A scan signal SCAN provided by the scan line GL is a low-level signal, a first reset control signal RESET1 provided by the first reset control line RST1 and an emitting control signal EM provided by the emitting control line EML are both high-level signals, and the data signal line DL outputs a data signal DATA. At this stage, the third transistor T3 is turned on because the first capacitor electrode plate of the storage capacitor Cst is low-level. The scan signal line SCAN is a low-level signal, so that the second transistor T2, the fourth transistor T4, and the seventh transistor T7 are turned on. The second transistor T2 and the fourth transistor T4 are turned on, so that a data voltage Vdata output by the data signal line DL is provided to the first node N1 through the second node N2, the turned-on third transistor T3, the third node N3, and the turned-on second transistor T2, and the storage capacitor Cst is charged with a difference between the data voltage Vdata output by the data signal line DL and a threshold voltage of the third transistor T3. A voltage of the first capacitor electrode plate (i.e., the first node N1) of the storage capacitor Cst is Vdata−|Vth|, wherein Vdata is the data voltage output by the data signal line DL, and Vth is the threshold voltage of the third transistor T3. The seventh transistor T7 is turned on, so that a second initial signal provided by the second initial signal line INIT2 is provided to the anode of the light emitting device EL to initialize (reset) the anode of the light emitting device EL and clear a pre-stored voltage therein, so as to complete initialization, thereby ensuring that the light emitting device EL does not emit light. The first reset control signal RESET1 provided by the first reset control line RST1 is a high-level signal, so that the first transistor T1 is turned off. The light emitting control signal EM provided by the light emitting control signal line EML is a high-level signal, so that the fifth transistor T5 and the sixth transistor T6 are turned off.

The third stage S3 is referred to as a light emitting stage. A light emitting control signal EM provided by the light emitting control signal line EML is a low-level signal, and a scan signal SCAN provided by the scan signal line GL and a first reset control signal RESET1 provided by the first reset control line RST1 are high-level signals. The light emitting control signal EM provided by the light emitting control signal line EML is a low-level signal, so that the fifth transistor T5 and the sixth transistor T6 are turned on, and the first voltage signal VDD output from the first power supply line PL1 provides drive voltage to the anode of the light emitting device EL through the turned-on fifth transistor T5, the third transistor T3 and the sixth transistor T6 to drive the light emitting device EL to emit light.

In a drive process of the pixel circuit, a drive current flowing through the third transistor T3 is determined by a voltage difference between the gate and the first electrode of the third transistor T3. Since the voltage of the first node N1 is Vdata−|Vth|, the drive current of the third transistor T3 is as follows.

$$I = K \times (Vgs - Vth)^2 = K \times [(VDD - Vdata + |Vth|) - Vth]^2 = K \times [VDD - Vdata]^2.$$

herein, I is the drive current flowing through the third transistor T3, that is, a drive current for driving the light emitting device EL, K is a constant, Vgs is the voltage difference between the gate and the first electrode of the third transistor T3, Vth is the threshold voltage of the third transistor T3, Vdata is the data voltage outputted by the data signal line DL, and VDD is the first voltage signal outputted by the first power supply line PL1.

It may be seen from the above formula that a current flowing through the light emitting device EL is independent of the threshold voltage of the third transistor T3. Therefore, the pixel drive circuit according to the present embodiment may better compensate the threshold voltage of the third transistor T3.

Figure 4:
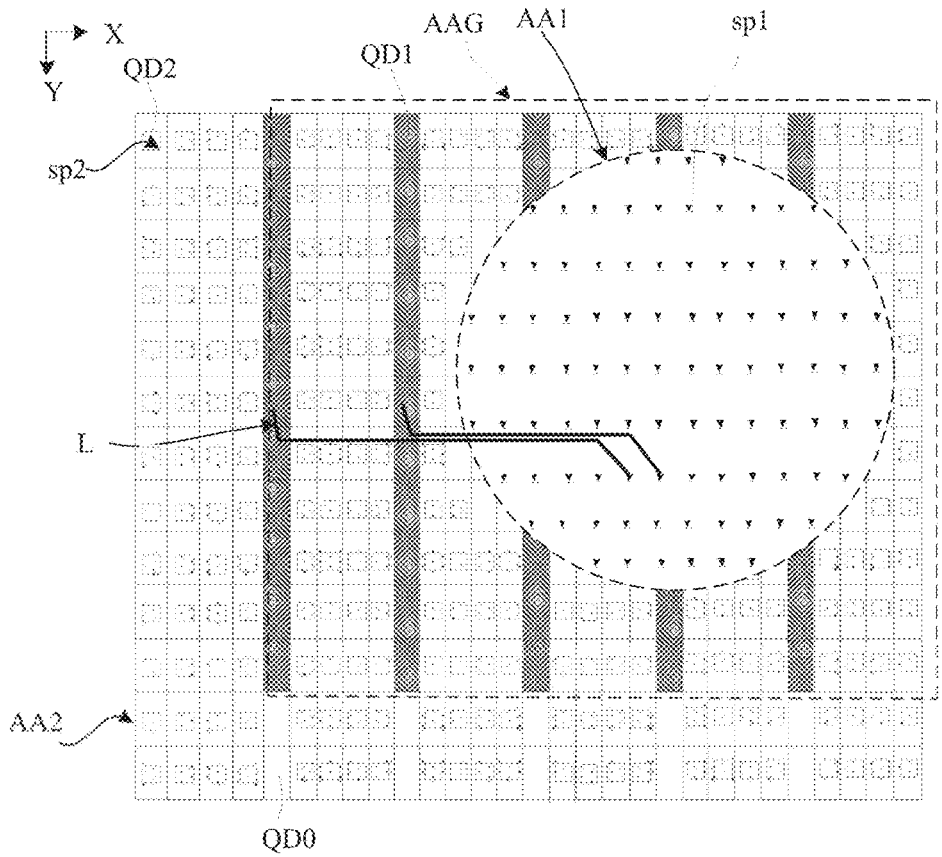
FIG. 4 is a first partial schematic diagram of a display panel according to an embodiment of the present disclosure.

FIG. 4 is a first partial schematic diagram of a display panel according to an embodiment of the present disclosure. It is an enlarged view of the Q region in FIG. 1, illustrating the planar structure of the region close to the transition display region AAG in the first display region AA1, and illustrating the planar structure of the transition display region AAG and its vicinity in the second display region AA2.

In an exemplary embodiment, as shown in FIG. 4, the first display region AA1 may only be provided with the first light emitting device sp1 without providing the first pixel drive circuit QD1 for driving the first light emitting device sp1, so that the first display region AA1 can both display and transmit light. For example, the first light emitting device sp1 may at least include a first anode, and at least one first pixel drive circuit QD1 in the transition display region AAG in the second display region AA2 is connected to the first anode of the at least one first light emitting device sp1 through a conductive line L (for example, a transparent conductive line). The conductive line L may extend from the first display region AA1 to a transition display region AAG in the second display region AA2. In this way, by setting the first pixel drive circuit QD1 that drives the first light emitting device sp1 in the transition display region AAG in the second display region AA2, it is possible to reduce the shield of light by the pixel drive circuit, so that the transmittance rate of the first display region AA1 may be increased. For example, taking the first pixel drive circuit QD1 as a pixel drive circuit of 7T1C shown in FIG. 3 as an example, one terminal of the conductive line L (for example, a transparent conductive line) may be electrically connected to the fourth node N4 (i.e., an anode connection node) of the first pixel drive circuit QD1, and the other terminal of the conductive line L may be electrically connected to the first anode of the first light emitting device sp1.

In an exemplary embodiment, as shown in FIG. 4, the second display region AA2 may include multiple first pixel drive circuits QD1, multiple second pixel drive circuits QD2, and multiple second light emitting device sp2, at least one of the multiple second pixel drive circuits QD2 is configured to be connected to at least one second light emitting device sp2 in the second display region AA2. The second pixel drive circuit QD2 is configured to output a corresponding current directly to the connected second light emitting device sp2, so that second light emitting device sp2 emit light of corresponding brightness. That is, both the second light emitting device sp2 electrically connected to the second pixel drive circuit QD2 and the second pixel drive circuit QD2 may be located in the second display region AA2, and all or part of the second light emitting device sp2 may be located in the second display region AA2. For example, an orthographic projection of the at least one second pixel drive circuit QD2 on the substrate and an orthographic projection of the at least one second light emitting device sp2 on the substrate may at least partially overlap.

In an exemplary embodiment, as shown in FIG. 4, the transition display region AAG in the second display region AA2 may include multiple first pixel drive circuits QD1, at least one of the multiple first pixel drive circuits QD1 may be connected to at least one first light emitting device sp1 in the first display region AA1 through a conductive line L, and the at least one first pixel drive circuit QD1 is configured to output a corresponding current to the connected first light emitting device sp1 through the conductive line L, so that the first light emitting device sp1 emits light of a corresponding brightness. That is, the first light emitting device sp1 electrically connected to the first pixel drive circuit QD1 may be located in a different display region from the first pixel drive circuit QD1. For example, an orthographic projection of the at least one first pixel drive circuit QD1 on the substrate and an orthographic projection of the at least one first light emitting device sp1 on the substrate may not overlap. In an exemplary embodiment, as shown in FIG. 4, the transition display region AAG may further include multiple second pixel drive circuits QD2 and multiple second light emitting devices sp2. At least one of the multiple second pixel drive circuits QD2 may be connected to at least one second light emitting device sp2 in the transition display region AAG, and the second pixel drive circuit QD2 is configured to directly output a corresponding current to the connected second light emitting device sp2 so that the second light emitting device sp2 emits light of a corresponding brightness. In an exemplary embodiment, one or more second pixel drive circuits QD2 may be provided between adjacent first pixel drive circuits QD1, for example, two second pixel drive circuits QD2 may be provided between adjacent first pixel drive circuits QD1, or, as shown in FIG. 4, four second pixel drive circuits QD2 may be provided between adjacent first pixel drive circuits QD1, etc. Here, no limitation is made thereto in embodiments of the present disclosure.

In an exemplary embodiment, as shown in FIG. 4, the transition display region AAG may further include an invalid pixel drive circuit QD0, which may facilitate improving the uniformity of components of multiple film layers in the etching process and ensuring the uniformity of the display panel. For example, a structure of the invalid pixel drive circuit may be substantially the same as that of the first pixel drive circuit QD1 or the second pixel drive circuit QD2 of the row or column where the invalid pixel circuit is located, except that invalid pixel circuit is not electrically connected to any light emitting device.

In an exemplary embodiment, the conductive line L may be made of a transparent conductive material. For example, the transparent conductive material may be a conductive oxide material such as indium tin oxide (ITO) or the like. Here, no limitation is made thereto in embodiments of the present disclosure.

The pixel drive circuit in the exemplary embodiment of the present disclosure is a region divided according to a substrate structure layer, and the light emitting device in the present disclosure is a region divided according to a light emitting structure layer. For example, the positions of both the light emitting device and the pixel drive circuit driving the light emitting device may correspond, or the positions of both the light emitting device and the pixel drive circuit driving the light emitting device may not correspond. For example, multiple second light emitting devices sp2 of the transition display region AAG may be normally arranged in a conventional spacing arrangement, while a portion of the second pixel drive circuit QD2 of the transition display region AAG may be compactly arranged in a small spacing arrangement, leaving an arrangement space for the first pixel drive circuit QD1 driving the first light emitting device sp1. At this time, the positions of the second light emitting device sp2 of the transition display region AAG and the second pixel drive circuit QD2 do not correspond. For another example, multiple first light emitting devices sp1 are provided in the first display region AA1 and the first pixel drive circuit QD1 is provided in the transition display region AAG, at this time, the positions of both the first light emitting device sp1 of the first display region AA1 and the first pixel drive circuit QD1 driving the first light emitting device sp1 do not correspond.

In an exemplary embodiment, in the transition display region AAG, a region where the first pixel drive circuit QD1 is provided may be obtained by reducing the size of the second pixel drive circuit QD2. For example, the region in which the first pixel drive circuit QD1 is provided may be obtained by reducing the size of the second pixel drive circuit QD2 in the first direction X; alternatively, the region in which the first pixel drive circuit QD1 is provided may be obtained by reducing the size of the second pixel drive circuit QD2 in the second direction Y; alternatively, the region in which the first pixel drive circuit QD1 is provided may be obtained by reducing the size of the second pixel drive circuit QD2 in the first direction X and the second direction Y. Here, no limitation is made thereto in embodiments of the present disclosure.

For example, taking the region where the first pixel drive circuit QD1 is provided by reducing the size of the second pixel drive circuit QD2 in the first direction X as an example, for example, as shown in FIG. 4, the original pixel drive circuit per a-column may be compressed in the first direction X, thereby adding an arrangement space of one column of pixel drive circuits, and the space occupied by the a-column of pixel drive circuits before compression and the (a+1)-column of pixel drive circuits after compression may be the same. Wherein, "a" may be an integer greater than 1, for example, "a" may be equal to 2 3 or 4 and the like. For example, the second pixel drive circuit QD2 and the first pixel drive circuit QD1 can usually be arranged in a 2-press 1, 3-press 1 or 4-press 1 manner in the first direction X. 2, 3 or 4 second pixel driver circuits QD2 are compressed in the first direction X, leaving 1 position for providing the first pixel drive circuit QD1. Here, no limitation is made thereto in embodiments of the present disclosure. At this time, the size of the second pixel drive circuit QD2 in the first direction X may be smaller than the size of the second light emitting device sp2 in the first direction X.

For another example, taking the region where the first pixel drive circuit QD1 is provided by reducing the size of the second pixel drive circuit QD2 in the second direction Y as an example, the original b-row of pixel drive circuit may be compressed in the second direction Y, thereby increasing the arrangement space of one-row of pixel drive circuit, and the space occupied by the b-row of pixel drive circuit before compression and the (b+1)-row of pixel drive circuit after compression is the same. Herein, "b" may be an integer greater than 1. For example, for example, "b" may be equal to 2, 3 or 4, etc. At this time, the size of the second pixel drive circuit QD2 in the second direction Y may be smaller than the size of the second light emitting device sp2 in the second direction Y.

In an exemplary embodiment, since the transition display region AAG is provided with not only the first pixel drive circuit QD1 electrically connected with the first light emitting device sp1, but also the second pixel drive circuit QD2 electrically connected with the second light emitting device sp2, the number of pixel drive circuits of the transition display region AAG may be greater than the number of the first light emitting devices sp1 of the first display region AA1.

Figure 5:
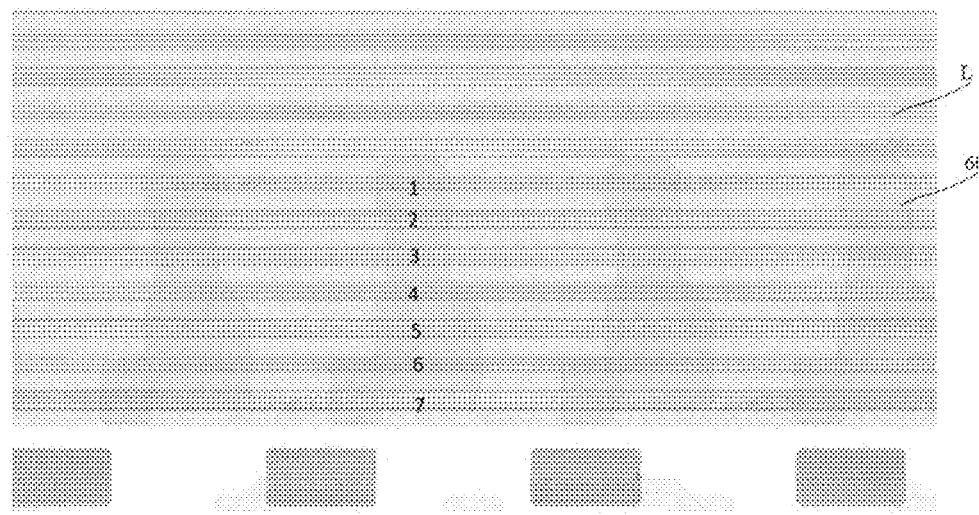
FIG. 5 is a schematic diagram of a conductive line passing through a shield electrode in a first display region in some techniques.

In an exemplary embodiment, a shield electrode 60 is provided in the display panel in order to reduce crosstalk to the first node N1 by capacitance between conductive lines (e.g. ITO traces). FIG. 5 is a schematic diagram of a conductive line passing through a shield electrode in a first display region AA1 in some techniques. As shown in FIG. 5, the shield electrode 60 below the conductive line is irregularly shaped and the shield electrode 60 reflects light, resulting in uneven critical dimensions of multiple conductive lines L (1 to 7) passing through the shield electrode 60, wherein the critical dimensions of the conductive lines passing through wider positions of the shield electrode 60 are thinner and the critical dimensions of the conductive lines passing through narrower positions of the shield electrode 60 are wider. In this way, the capacitance difference between conductive lines of adjacent pixels in the same row will be large, resulting in the problem of uneven display (mura).

As shown in FIG. 5, taking the conductive line passing through the wider position of the shield electrode 60 as conductive line 7 and the conductive line passing through the narrower position of the shield electrode 60 as conductive line 3 as an example, the inventors of the present disclosure measured the critical dimension of the conductive line passing through the wider position of the shield electrode 60 and the critical dimension of the conductive line passing through the narrower position of the shield electrode 60 as shown in Table 1. In Table 1, CD (7) refers to the critical dimension of the conductive line 7 of different display panels passing through the shield electrode 60, indicating the critical dimension of the conductive line passing through the widest part of the shield electrode 60; CD (3) refers to the critical dimension of the conductive line 3 of different display panels passing through the shield electrode 60, and denotes the critical dimension of the conductive line passing through the narrowest point of the shield electrode 60.

TABLE 1

Measured critical dimension of conductive line L passing through shield electrode

| Display panel | CD (7) | CD (3) |
| --- | --- | --- |
| Panel1 | 1.85 | 1.90 |
| Panel2 | 1.76 | 2.03 |
| Panel3 | 1.67 | 1.89 |
| Panel4 | 1.71 | 1.94 |
| Panel5 | 1.82 | 1.98 |
| Panel6 | 1.85 | 1.98 |
| Panel7 | 1.80 | 1.98 |
| Average critical dimension | 1.78 | 1.96 |

By analyzing the data shown in Table 1, it may be seen that due to the irregular shape of the shield electrode 60, that is, the width of the shield electrode 60 is inconsistent, the critical dimension (CD) of the conductive lines differs by about 0.2 um (micron), thereby resulting in a capacitance difference of about 0.1 fF between the conductive lines (such as ITO traces) in a pixel unit. Further, taking the pixel drive circuit of 7T1C shown in FIG. 3 as an example, one terminal of the conductive line L may be electrically connected to the fourth node N4 (i.e., the anode connection node) of the first pixel drive circuit QD1, and the other terminal of the conductive line L may be electrically connected to the anode of the first light emitting device sp1. Since the conductive line L extends from the first display region AA1 to the transition display region AAG to achieve the electrical connection between the first pixel drive circuit QD1 and the first light emitting device sp1, the length of the conductive line L is long, and finally the capacitance between the conductive lines (such as ITO traces) in a pixel unit may differ by about several hundred fF. In this way, under the low gray scale, due to the long illumination time, the capacitance of the fourth node N4 (i.e., the anode connection node) is large, and the capacitance difference between the conductive lines (such as ITO traces) of the same row and adjacent pixels is large, which will greatly affect the illumination time and lead to mura problem.

In some examples, in the display panel, the capacitance of the conductive lines varies greatly. Different lengths of conductive lines of multiple light emitting devices located in the first display region AA1 will cause different capacitance differences of light emitting devices emitting light of different colors. Compared with the capacitance difference of the conductive lines connected to the light emitting devices emitting red light and the capacitance difference of the conductive lines connected to the light emitting device emitting blue light, the capacitance difference of the conductive lines connected to the light emitting devices emitting green light is larger. Because the capacitance difference of the conductive lines connected to the light emitting devices emitting green light is larger, luminous time of the light emitting devices emitting green light will be reduced, thus the brightness difference of the display panel will appear, resulting in poor display. At a low gray scale, a defective degree of the light emitting devices emitting green light is greater than that of the light emitting devices emitting red light, and the defective degree of the light emitting devices emitting red light is greater than that of the light emitting devices emitting blue light. For example, at a same gray scale, a drive current for driving a light emitting device emitting blue light may be greater than a drive current for driving a light emitting device emitting red light, and a drive current for driving a light emitting device emitting red light may be greater than a drive current for driving a light emitting device emitting green light. The drive current for driving the green-emitting light emitting device is the smallest of the three primary-color light emitting devices, and therefore, the green-emitting light emitting device lights up later than the red-emitting light emitting device and the blue-emitting light emitting device when the capacitance of the fourth node N4 (i.e., the anode connection node) of the light emitting device emitting different light is the same. Under the low gray scale, the near-to-far connection mode will cause some green light emitting devices not to be turned on, which will affect the display effect.

An embodiment of the disclosure provides a display panel, which may include a substrate, a circuit structure layer and a light emitting structure layer stacked on the substrate, and multiple conductive layers disposed between the circuit structure layer and the light emitting structure layer; wherein, the substrate includes a first display region and a second display region, wherein the second display region is located on at least one side of the first display region, and the light transmittance rate of the first display region is greater than the light transmittance rate of the second display region; the circuit structure layer includes: a first gate signal line located in the second display region, a constant voltage line, multiple shield electrodes and multiple pixel circuits, wherein the pixel circuit includes a drive transistor, the drive transistor includes a gate, and the multiple pixel circuits include multiple first pixel drive circuits; the first gate signal line is connected to the gate of the drive transistor; the constant voltage line is configured to provide a first constant voltage to the multiple pixel circuits; the shield electrode is connected to the constant voltage line, and an orthographic projection of the first gate signal line on the substrate falls into an orthographic projection of the shield electrode on the substrate; the multiple conductive layers include: multiple conductive lines, the multiple conductive lines include multiple first type conductive lines and multiple second type conductive lines, an orthographic projection of a portion of the first type conductive line extending along a first direction on the substrate overlaps with an orthographic projection of at least one of the multiple shield electrodes on the substrate, and an orthographic projection of a portion of the second type conductive line extending along the first direction on the substrate does not overlap with an orthographic projection of the multiple shield electrodes on the substrate; the light emitting structure layer includes multiple first light emitting devices located in the first display region, the multiple first light emitting devices include multiple first type first light emitting devices and multiple second type first light emitting devices, at least one of the multiple first type first light emitting devices is connected to at least one of the multiple first pixel drive circuits through at least one of the multiple first type conductive lines, at least one of the multiple second type first light emitting devices is connected to at least one of the multiple first pixel drive circuits through at least one of the multiple second type conductive lines, the first pixel drive circuit is configured to drive the first light emitting device to emit light, and the first type first light emitting device is configured to emit light of a first color, and the second type first light emitting device is configured to emit light of a second color, wherein the light of the second color is different from the light of the first color.

Thus, in the display panel provided by the exemplary embodiment of the present disclosure, on the one hand, uniformity of the critical dimension of the first type of conductive lines may be maintained by arranging that the first type of conductive lines connected to the first type first light emitting device and an orthographic projection of the shield electrode on the substrate overlap, and the capacitance difference of the first type of conductive lines can be made small. On the other hand, by arranging the second type conductive line connected to the second type first light emitting device without overlapping an orthographic projection of the shield electrode on the substrate, the uniformity of the critical dimension of the second type conductive line can be maintained, and the capacitance difference of the second type conductive line can be made small. In this way, by optimizing the wiring setting, the brightness difference may be improved and the display effect may be improved.

In an exemplary embodiment, the shape of the shield electrode may be a regular shape, for example, the shape of the shield electrode may be rectangular. In this way, by setting the shape of the shield electrode as a rectangle, the routing environment of the first type of conductive lines may be ensured to be consistent, the uniformity of the critical dimension of the first type of conductive lines may be improved, and the capacitance difference of the first type of conductive lines may be made small.

In an exemplary embodiment, the multiple first light emitting devices of the first display region may include multiple groups of first light emitting devices. The first light emitting devices in each of the multiple groups of first light emitting devices may be arranged in a first direction X, and the multiple groups of first light emitting devices may be arranged in a second direction Y. The second direction Y crosses the first direction X, for example, the second direction and the first direction are perpendicular to each other. Wherein, in at least one group of first light emitting devices sp1, multiple first pixel drive circuits QD1 electrically connected to the multiple first type first light emitting devices are closer to the first display region than each of multiple first pixel drive circuits QD1 electrically connected to the multiple second type first light emitting devices. In this way, the length difference of the conductive line to which the first light emitting device of the first type is connected may be reduced, so that display defects may be alleviated or avoided.

In an exemplary embodiment, taking the conductive layer is a transparent conductive layer as an example, the display panel may include three transparent conductive layers, and the three transparent conductive layers may include a first transparent conductive layer, a second transparent conductive layer, and a third transparent conductive layer arranged in sequence on a side away from the substrate. The first transparent conductive layer may include multiple first transparent conductive lines, the second transparent conductive layer may include multiple second transparent conductive lines, and the third transparent conductive layer may include multiple third transparent conductive lines. For example, an orthographic projection of a portion of the first transparent conductive line extending in the first direction on the substrate, an orthographic projection of a portion of the second transparent conductive line extending in the first direction on the substrate and an orthographic projection of a portion of the third transparent conductive line extending in the first direction on the substrate may not overlap, i.e., there are no overlapping traces. For example, an orthographic projection of a portion of the third transparent conductive line extending in the first direction on the substrate and an orthographic projection of a portion of the second transparent conductive line extending in the first direction on the substrate may not overlap, i.e., there are no overlapping traces. For example, the size of the portion of the first transparent conductive line extending in the first direction X in the second direction Y, the size of the portion of the second transparent conductive line extending in the first direction X in the second direction Y and the size of the portion of the third transparent conductive line extending in the first direction X in the second direction Y may be substantially the same.

In an exemplary embodiment, in at least one group of first light emitting devices in the first display region, multiple first type first light emitting devices close to the center of the first display region are electrically connected to multiple first pixel drive circuits through the first transparent conductive line, and multiple first type first light emitting devices close to the edge of the first display region are electrically connected to multiple first pixel drive circuits through the third transparent conductive line.

In an exemplary embodiment, in at least one group of first light emitting devices in the first display region, multiple first type first light emitting devices close to the center of the first display region are electrically connected to multiple first pixel drive circuits through the first transparent conductive line, and multiple first type first light emitting devices close to the edge of the first display region are electrically connected to multiple first pixel drive circuits through the second transparent conductive line.

In an exemplary embodiment, in at least one group of first light emitting devices in the first display region, multiple first type first light emitting devices close to the center of the first display region are electrically connected to multiple first pixel drive circuits through the second transparent conductive line, and multiple first type first light emitting devices close to the edge of the first display region are electrically connected to multiple first pixel drive circuits in the second display region through the first transparent conductive line.

In an exemplary embodiment, in at least one group of first light emitting devices in the first display region, multiple first type first light emitting devices close to the center of the first display region are electrically connected to multiple first pixel drive circuits through the third transparent conductive line, and multiple first type first light emitting devices close to the edge of the first display region are electrically connected to multiple first pixel drive circuits in the second display region through the first transparent conductive line.

In an exemplary embodiment, in at least one group of first light emitting devices in the first display region, multiple second type first light emitting devices close to the center of the first display region are electrically connected to multiple first pixel drive circuits through the first transparent conductive line, and multiple second type first light emitting devices close to the edge of the first display region are electrically connected to multiple first pixel drive circuits through the third transparent conductive line.

In an exemplary embodiment, in the at least one group of first light emitting devices of the first display region, the transparent conductive line electrically connected to multiple second type first light emitting devices close to the center of the first display region are of the same type as the transparent conductive line electrically connected to multiple first type first light emitting devices close to the center of the first display region, or the transparent conductive line electrically connected to multiple second type first light emitting devices close to the edge of the first display region are of the same type as the transparent conductive line electrically connected to multiple first type first light emitting devices close to the edge of the first display region.

In an exemplary embodiment, in the at least one group of first light emitting devices of the first display region, the transparent conductive line electrically connected to multiple second type first light emitting devices close to the center of the first display region are different in type from multiple first type first light emitting devices close to the center of the first display region, or the transparent conductive line electrically connected to multiple second type first light emitting devices close to the edge of the first display region are of different type from the transparent conductive line electrically connected to multiple first type first light emitting devices close to the edge of the first display region.

In an exemplary embodiment, in at least one group of first light emitting devices in the first display region, multiple second type first light emitting devices close to the center of the first display region are electrically connected to multiple first pixel drive circuits through the first transparent conductive line, and multiple second type first light emitting devices close to the edge of the first display region are electrically connected to multiple first pixel drive circuits through the third transparent conductive line.

In an exemplary embodiment, in the at least one group of first light emitting devices of the first display region, multiple first type first light emitting devices close to the center of the first display region are electrically connected to multiple first pixel drive circuits through the first transparent conductive line, multiple first type first light emitting devices close to the edge of the first display region are electrically connected to multiple first pixel drive circuits through the third transparent conductive line, and multiple first type first light emitting devices located between the multiple first type first light emitting devices close to the center of the first display region and the multiple first type first light emitting devices close to the edge of the first display region are electrically connected to multiple first pixel drive circuits through the second transparent conductive line; in the at least one group of first light emitting devices of the first display region, multiple second type first light emitting devices close to the center of the first display region are electrically connected to multiple first pixel drive circuits through the first transparent conductive line, multiple second type first light emitting devices close to the edge of the first display region are electrically connected to multiple first pixel drive circuits through the third transparent conductive line, and multiple second type first light emitting devices located between the multiple second type first light emitting devices close to the center of the first display region and the multiple second type first light emitting devices close to the edge of the first display region are electrically connected to multiple first pixel drive circuits through the second transparent conductive line.

In an exemplary embodiment, in at least one group of first light emitting devices in a first display region, transparent conductive lines to which multiple first type first light emitting devices are electrically connected are located on a side of a transfer electrode of the group of first light emitting devices in a second direction.

In an exemplary embodiment, in at least one group of first light emitting devices in a first display region, transparent conductive lines to which multiple second type first light emitting devices are electrically connected are located on the other side of the transfer electrode of the group of first light emitting devices in a second direction.

In an exemplary embodiment, the first display region includes a first sub-region and a second sub-region, the second sub-region is located on at least one side of the first sub-region and close to the second display region; at least one first light emitting device located in the first sub-region of the multiple first light emitting devices is connected to at least one of the multiple first pixel drive circuits through conductive lines of the multiple conductive layers; and at least one first light emitting device located in the second sub-region of the multiple first light emitting devices is connected to at least one first pixel drive circuit of the multiple first pixel drive circuits through a conductive line of a metal conductive layer in the circuit structure layer.

In an exemplary embodiment, the metal conductive layer and the shield electrode are located in the same film layer.

In an exemplary embodiment, the shape of the shield electrode may be rectangular.

In an exemplary embodiment, the light emitting structure layer may further include multiple second light emitting devices located in the second display region; the multiple pixel circuits further includes multiple second pixel drive circuits, at least one of the multiple second pixel drive circuits is electrically connected to at least one of the multiple second light emitting devices, and the at least one second pixel drive circuit is configured to drive the at least one second light emitting device to emit light.

In an exemplary embodiment, the second display region may include a transition display region and a normal display region, and the transition display region is located on at least one side of the normal display region and close to the first display region; the transition display region may include multiple first pixel drive circuits; and the normal display region includes at least portions of the multiple second light emitting devices and at least portions of the multiple second pixel drive circuits, at least portions of the multiple second light emitting devices are connected to at least portions of the multiple second pixel drive circuits.

In an exemplary embodiment, the transition display region may include multiple sub-transition regions; the light emitting structure layer may further include multiple second light emitting devices located in at least one sub-transition region close to the first display region among the multiple sub-transition regions; the circuit structure layer may further include multiple second pixel drive circuits located in at least one sub-transition region close to the first display region among the multiple sub-transition regions; at least one of the multiple second pixel drive circuits is electrically connected to at least one of the multiple second light emitting devices, and the at least one second pixel drive circuit is configured to drive the at least one second light emitting device to emit light.

In an exemplary embodiment, the light emitting structure layer may further include multiple second light emitting devices located in the second display region; the circuit structure layer may further include multiple second pixel drive circuits located in the second display region, at least one of the multiple second pixel drive circuits is electrically connected to at least one of the multiple second light emitting devices, and the at least one second pixel drive circuit is configured to drive the at least one second light emitting device to emit light.

In an exemplary embodiment, the first color light may be green light and the second color light may at least include one of red light and blue light. For example, the first type first light emitting device may include a green first light emitting device sp1_g configured to emit green light; the second type first light emitting device may include a blue first light emitting device sp1_b configured to emit blue light and a red first light emitting device sp1_r configured to emit red light.

The display panel in the embodiment of the present disclosure will be described below with reference to the drawings as an example that the display panel includes three transparent conductive layers, the first type first light emitting device includes a green first light emitting device sp1_g, and the second type first light emitting device includes a blue first light emitting device sp1_b and a red first light emitting device sp1_r.

In an exemplary embodiment, the capacitance of the anode connection node of the green first light emitting device sp1_g may be reduced by reducing the length of the conductive line connected to the anode connection node of the green first light emitting device sp1_g, thereby ensuring that the green first light emitting device sp1_g may be normally turned on. In the following example, taking the first pixel drive circuit QD1 electrically connected to the green first light emitting device sp1_g is nearest to the first display region AA1 as an example, that is, the first pixel drive circuit QD1 electrically connected to the green first light emitting device sp1_g is preferentially arranged close to the first display region AA1. Wherein, in an exemplary embodiment of the present disclosure, "Element A is close to Element B" may mean that there are no other Elements A or other Elements B between Element A and Element B, but there may be other elements other than Elements A and B. For example, the "first pixel drive circuit QD1 electrically connected to the green first light emitting device sp1_g is close to the first display region AA1" described in the exemplary embodiment of the present disclosure may mean that between the first pixel drive circuit QD1 electrically connected to the green first light emitting device sp1_g and the first display region AA1, there is no first pixel drive circuit QD1 electrically connected to the red first light emitting device sp1_r or the blue first light emitting device sp1_b, but there may be other pixel drive circuits such as the second pixel drive circuit QD2 or the invalid pixel drive circuit QD0.

In an exemplary embodiment, the multiple first light emitting devices sp1 of the first display region AA1 may include multiple green first light emitting devices sp1_g, multiple blue first light emitting devices sp1_b, and multiple red first light emitting devices sp1_r. The green first light emitting device sp1_g is configured to emit green light, the blue first light emitting device sp1_b is configured to emit blue light, and the red first light emitting device sp1_r is configured to emit red light. Among the at least one group of first light emitting devices sp1, multiple second pixel drive circuits QD2 electrically connected to the green first light emitting device sp1_g are closer to the first display region AA1 than each of the multiple second pixel drive circuits QD2 electrically connected to the blue first light emitting device sp1_b or the red first light emitting device sp1_r. In this way, the length difference of the conductive line electrically connected to the green first light emitting device sp1_g may be reduced, and thus display defects may be alleviated or avoided.

Figure 6A:
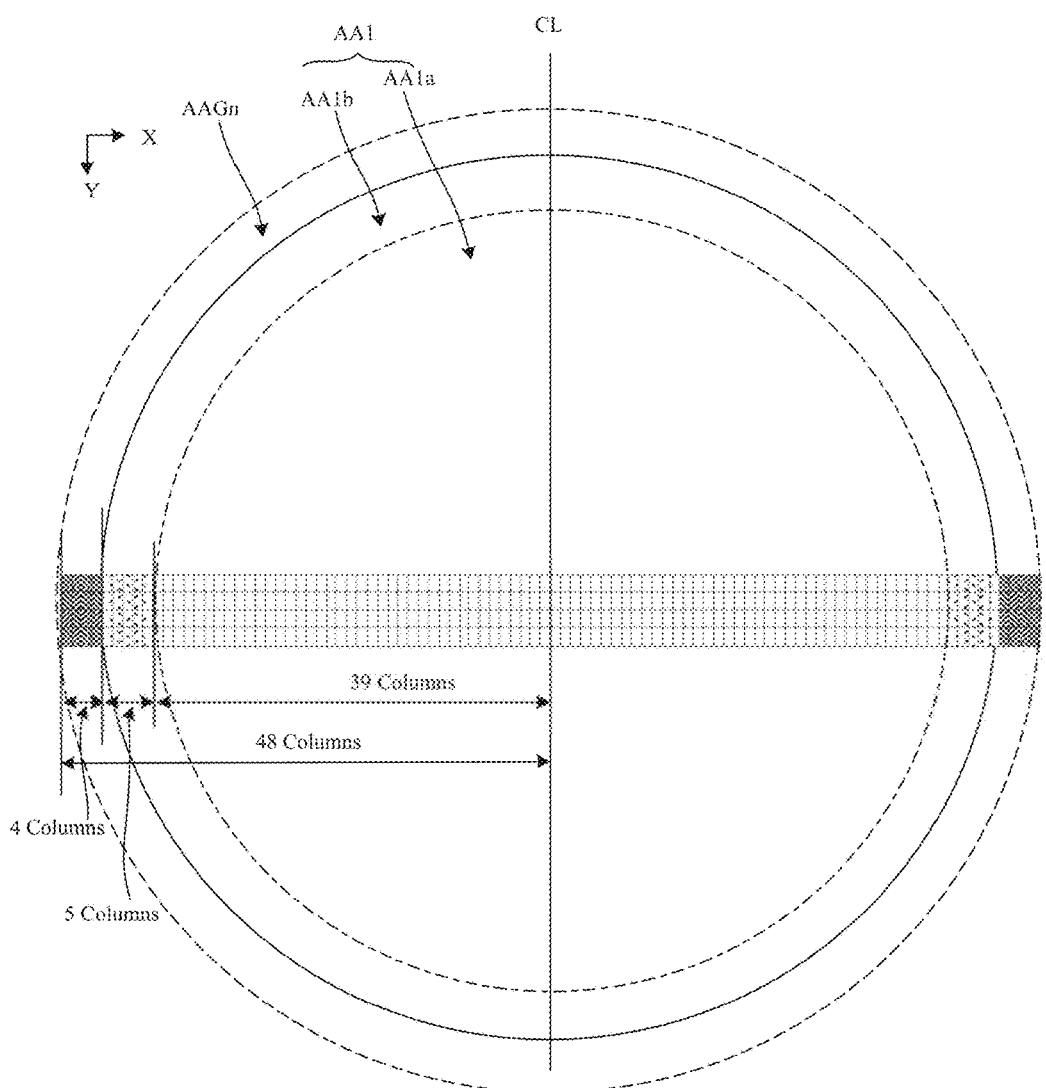
FIG. 6A is a second partial schematic diagram of a display panel according to an embodiment of the present disclosure.
Figure 6B:
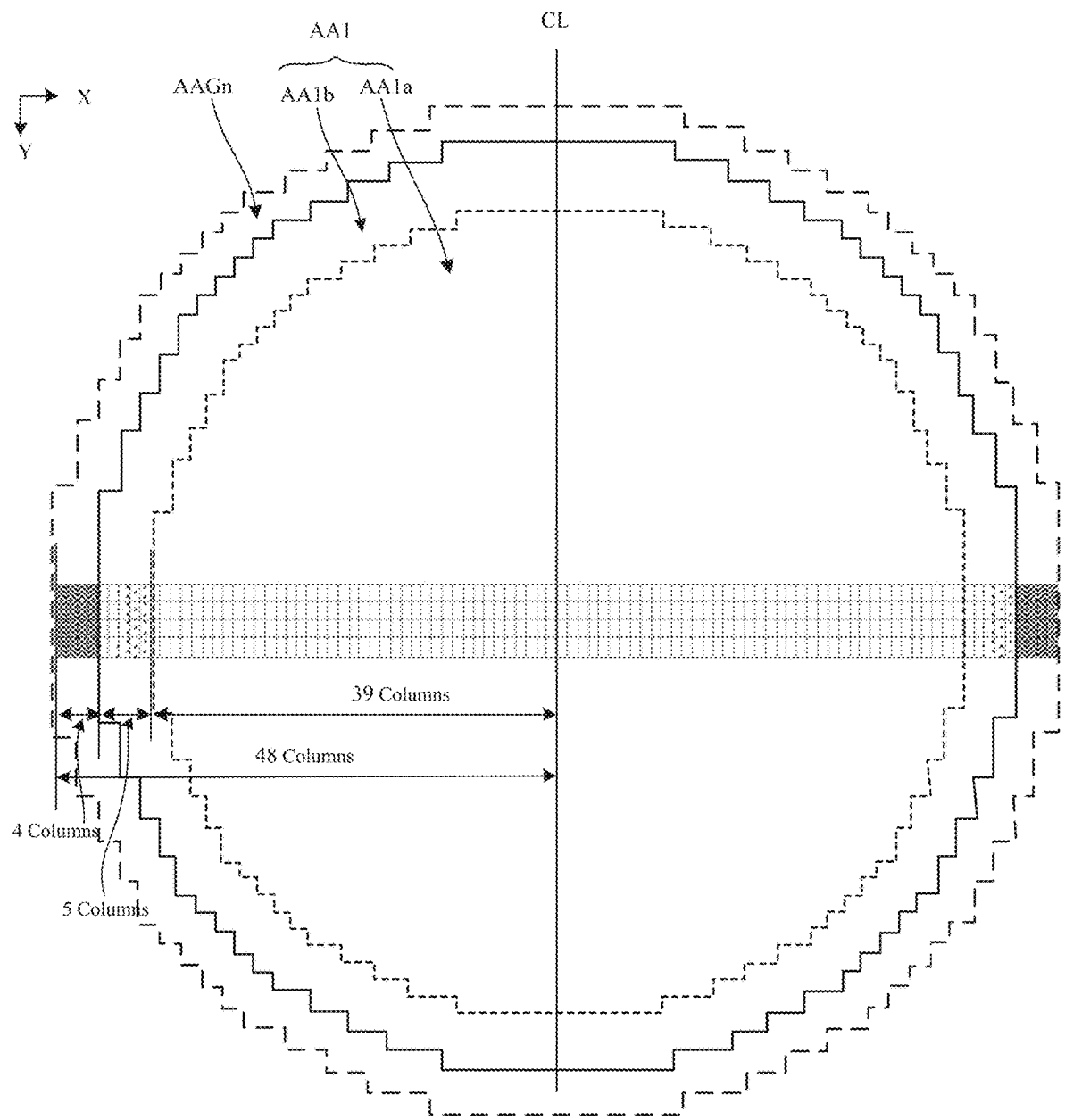
FIG. 6B is a third partial schematic diagram of a display panel according to an embodiment of the present disclosure.
Figure 6C:
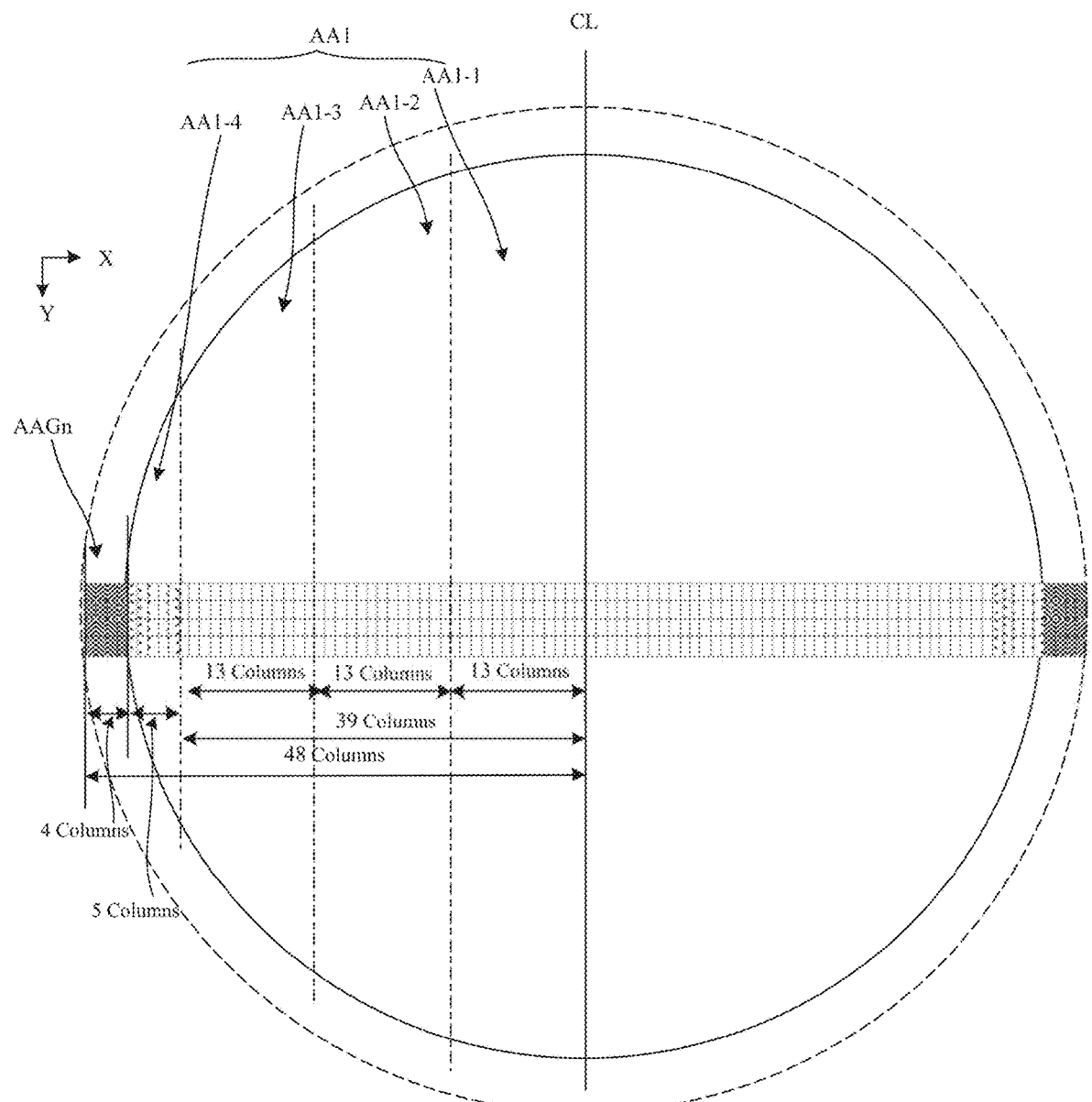
FIG. 6C is a fourth partial schematic diagram of a display panel according to an embodiment of the present disclosure.

FIG. 6A is a second partial schematic diagram of a display panel according to an embodiment of the present disclosure. FIG. 6B is a third partial schematic diagram of a display panel according to an embodiment of the present disclosure. FIG. 6C is a fourth partial schematic diagram of the display panel according to an embodiment of the present disclosure, illustrating a portion of the display region. As shown in FIGS. 6A to 6C, the first display region AA1 may have a center line CL extending in the second direction Y, the first display region AA1 may be divided into a left half region and a right half region along the center line CL, and conductive lines to which the first light emitting devices are connected in the left half region and the right region may be substantially symmetrical about the center line CL. Wherein, in addition to the partial light emitting devices in the first display region AA1, the partial light emitting devices in the sub-transition region close to the first display region AA1 in the transition display region AAG are also illustrated in FIGS. 6A to 6C.

In an exemplary embodiment, as shown in FIGS. 6A and 6B, the first display region AA1 may include a first sub-region AA1a and a second sub-region AA1b. The second sub-region AA1b may surround the first sub-region AA1a and be adjacent to the transition display region AAG. That is, the second sub-region AA1b may be located between the first sub-region AA1a and the transition display region AAG. The second sub-region AA1b may be an edge region of the first display region AA1, and the first sub-region AA1a may be a center region of the first display region AA1.

In an exemplary embodiment, as shown in FIG. 6A, the shape of the first display region AA1 may be approximately circular, the shape of the first sub-region AA1a may be a circle with a diameter smaller than that of the first display region AA1, and the first sub-region AA1a may be a ring around the first sub-region AA1a. As shown in FIG. 6B, the shape of the first display region AA1 may be approximately circular, the first sub-region AA1a may be approximately circular with a diameter smaller than that of the first display region AA1, and the first sub-region AA1a may be an approximately ring around the first sub-region AA1a. Here, no limitation is made thereto in embodiments of the present disclosure.

In an exemplary embodiment, as shown in FIGS. 6A and 6B, the film layer where the conductive line connected to at least one first light emitting device located in the first sub-region AA1a of multiple first light emitting devices is located is different from the film layer where the conductive line connected to at least one first light emitting device located in the first sub-region AA1a of multiple first light emitting devices is located. For example, at least one first light emitting device located in the first sub-region AA1a of the multiple first light emitting devices is electrically connected to at least one first light emitting device of the multiple first light emitting devices through a conductive line of the transparent conductive layer; at least one first light emitting device located in the first sub-region AA1a of the multiple first light emitting devices is connected to at least one first pixel drive circuit of the multiple first pixel drive circuits through a conductive line of a metal conductive layer in the circuit structure layer. For example, the conductive line of the metal conductive layer may be the conductive line of the first source-drain metal layer (SD1) or the conductive line of the second source-drain metal layer (SD2). Here, no limitation is made thereto in embodiments of the present disclosure.

In an exemplary embodiment, the conductive line of the metal conductive layer is located in the same film layer as the shield electrode. For example, the shield electrode and the conductive lines of the metal conductive layer may both be located in the second source-drain metal layer.

In an exemplary embodiment, as shown in FIGS. 6A and 6B, in a group of first light emitting devices, the number of green first light emitting devices sp1_g within the first sub-region AA1a may be greater than or equal to the number of green first light emitting devices sp1_g within the second sub-region AA1b.

In an exemplary embodiment, the transition display region AAG in the second display region AA2 may include multiple sub-transition regions; the light emitting structure layer may further include multiple second light emitting devices located in at least one sub-transition region close to the first display region among the multiple sub-transition regions; the circuit structure layer may further include multiple second pixel drive circuits located in at least one sub-transition region close to the first display region among the multiple sub-transition regions; at least one of the multiple second pixel drive circuits is electrically connected to at least one of the multiple second light emitting devices, and the at least one second pixel drive circuit is configured to drive the at least one second light emitting device to emit light.

For example, 48 columns of light emitting devices on both sides of the center line CL are schematically illustrated in FIGS. 6A and 6B. Wherein, on the left side of the center line CL, the first to 39th columns of light emitting devices may be located in the first sub-region AA1a, the 40th to 44th columns of light emitting devices may be located in the second sub-region AA1b, the first to 39th columns of light emitting devices and the 40th to 44th columns of light emitting devices are the first light emitting devices sp1, which may be laterally arranged from the first display region AA1 to a transition display region AAG in the second display region AA2 through a conductive line L and connected to a first pixel drive circuit QD1 in the transition display region AAG. For example, the film layers of the conductive lines used in the first to 39th columns of light emitting devices may be different from the film layers of the conductive lines used in the 40th to 44th columns of light emitting devices. For example, for the light emitting devices in the first display region AA1, as shown in FIGS. 6A to 13, the first to 39th columns of light emitting devices in the first sub-region AA1a may be driven in a transverse arrangement of conductive lines in the transparent conductive layer, and the 40th to 44th columns of light emitting devices in the second sub-region AA1b may be driven in a transverse arrangement of conductive lines in a metal conductive layer (such as the second source-drain metal layer SD2) after the utilization of the arrangement space of the transparent conductive layer is completed. For example, for the light emitting devices in the transition display region AAG close to the first display region AA1, the 45th to 48th columns of light emitting devices may be located in the sub-transition region AAGn closest to the first display region AA1 in the transition display region AAG, and the 45th to 48th columns of light emitting devices may be the second light emitting devices sp2. In-situ driving mode is adopted, i.e. the 45th to 48th columns of light emitting devices are directly connected with the second pixel drive circuit QD2 located in the transition display region AAG, so that the transmittance rate is not affected and a good transition from the transition display region AAG to the first display region AA1 is ensured.

In an exemplary embodiment, as shown in FIG. 6C, the first display region AA1 may include a first cable region AA1-1, a second cable region AA1-2, a third cable region AA1-3, and a fourth cable region AA1-4 that are sequentially disposed along a center away from the first display region AA1. The first cable region AA1-1 may be a region of the first display region AA1 relatively close to the geometric center of the first display region AA1, and the fourth cable region AA1-4 may be a region of the first display region AA1 relatively close to the edge of the first display region AA1. For example, taking the shape of the first display region AA1 as an approximate circle as an example, the shapes of the first cable region AA1-1, the second cable region AA1-2, the third cable region AA1-3, and the fourth cable region AA1-4 may be part of an approximate semicircle. The size of the first cable region AA1-1 in the second direction Y may be greater than the size of the second cable region AA1-2 in the second direction Y, the size of the second cable region AA1-2 in the second direction Y may be greater than the size of the third cable region AA1-3 in the second direction Y, and the size of the second cable region AA1-2 in the second direction Y may be greater than the size of the fourth cable region AA1-4 in the second direction Y. Here, no limitation is made thereto in embodiments of the present disclosure.

In an exemplary embodiment, as shown in FIG. 6C, the first light emitting device sp1 in the first cable region AA1-1 may be electrically connected using a first conductive line L1 of the first transparent conductive layer, the second cable region AA1-2 may be electrically connected using a second conductive line L2 of the second transparent conductive layer, the third cable region AA1-3 may be electrically connected using a third conductive line L3 of the third transparent conductive layer, and the fourth cable region AA1-4 may be electrically connected using a conductive line of a metal conductive layer (such as a second source-drain metal layer).

For example, 48 columns of light emitting devices on both sides of the center line CL are schematically illustrated in FIG. 6C, wherein, for the left side of the center line CL, the first to thirteenth columns of light emitting devices may be located in the first cable region AA1-1, the fourteenth to twenty-sixth columns of light emitting devices may be located in the second cable region AA1-2, the twenty-seventh to thirty-ninth columns of light emitting devices may be located in the third cable region AA1-3, the fortieth to forty-fourth columns of light emitting devices may be located in the fourth cable region AA1-4, the first to thirty-ninth columns of light emitting devices and the fortieth to forty-fourth columns of light emitting devices are first light emitting devices sp1, may extend from the first display region AA1 to the transition display region AAG in the second display region AA2 via hole the conductive line L arranged laterally, and be connected to the first pixel drive circuit QD1 in the transition display region AAG. For example, for the light emitting devices in the first display region AA1, as shown in FIG. 6C, the first to thirteenth columns of light emitting devices located in the first cable region AA1-1 may be driven by horizontal arrangement of the first transparent conductive lines in the first transparent conductive layer, after the space utilization of the first transparent conductive layer is completed, the fourteenth to twenty-sixth columns of light emitting devices located in the second cable region AA1-2 can be driven by the horizontal arrangement of the second transparent conductive lines in the second transparent conductive layer, after the space utilization of the second transparent conductive layer is completed, the twenty-seventh to thirty-ninth columns of light emitting devices located in the third cable region AA1-3 can be driven by the horizontal arrangement of the third transparent conductive lines in the third transparent conductive layer, after the space utilization of the transparent conductive layer is completed, the fortieth to forty-fourth columns of light emitting devices located in the fourth cable region AA1-4 can adopt the driving mode of horizontal arrangement of conductive lines in the metal conductive layer (such as the second source-drain metal layer SD2). For example, for the light emitting devices in the transition display region AAG close to the first display region AA1, the 45th to 48th columns of light emitting devices may be located in the sub-transition region AAGn closest to the first display region AA1 in the transition display region AAG, and the 45th to 48th columns of light emitting devices may be the second light emitting devices sp2. In-situ driving mode is adopted, i.e. the 45th to 48th columns of light emitting devices are directly connected with the second pixel drive circuit QD2 located in the transition display region AAG, so that the transmittance rate is not affected and a good transition from the transition display region AAG to the first display region AA1 is ensured.

In this example, the first light emitting device sp1 close to the center of the first display region AA1 may be electrically connected by using a conductive line of a transparent conductive layer, and the first light emitting device sp1 close to the edge of the first display region AA1 may be electrically connected by using a conductive line of a metal conductive layer (such as a second source-drain metal layer) after the routing arrangement space of the transparent conductive layer is utilized. In this way, the aperture may be kept unchanged, the routing environment is uniform, and mask (mask electrode plate) will not be added. Moreover, due to the small load of the metal conductive layer (such as the second source-drain metal layer), the impact on the peripheral routing environment is small. In addition, since the light emitting device at the boundary position is electrically connected with a conductive line of a metal conductive layer (such as a second source-drain metal layer), the influence on the transmittance rate of the first display region AA1 is small.

The connection mode of the light emitting devices in the first display region AA1 will be described with reference to the layout shown in FIGS. 6A to 6C in conjunction with the drawings. In the following example, the connection relationship between a part of a group of first light emitting devices in the left half region of the first display region AA1 and a row of first pixel drive circuits QD1 in the transition display region AAG in the second display region AA2 is illustrated as an example, and other configurations are omitted. Transparent conductive lines of different layers are indicated in different line types, the first transparent conductive line L1 is indicated as a solid line, the second transparent conductive line L2 is indicated as a dashed line, and the third transparent conductive line L3 is indicated as a dotted line.

Figure 7:
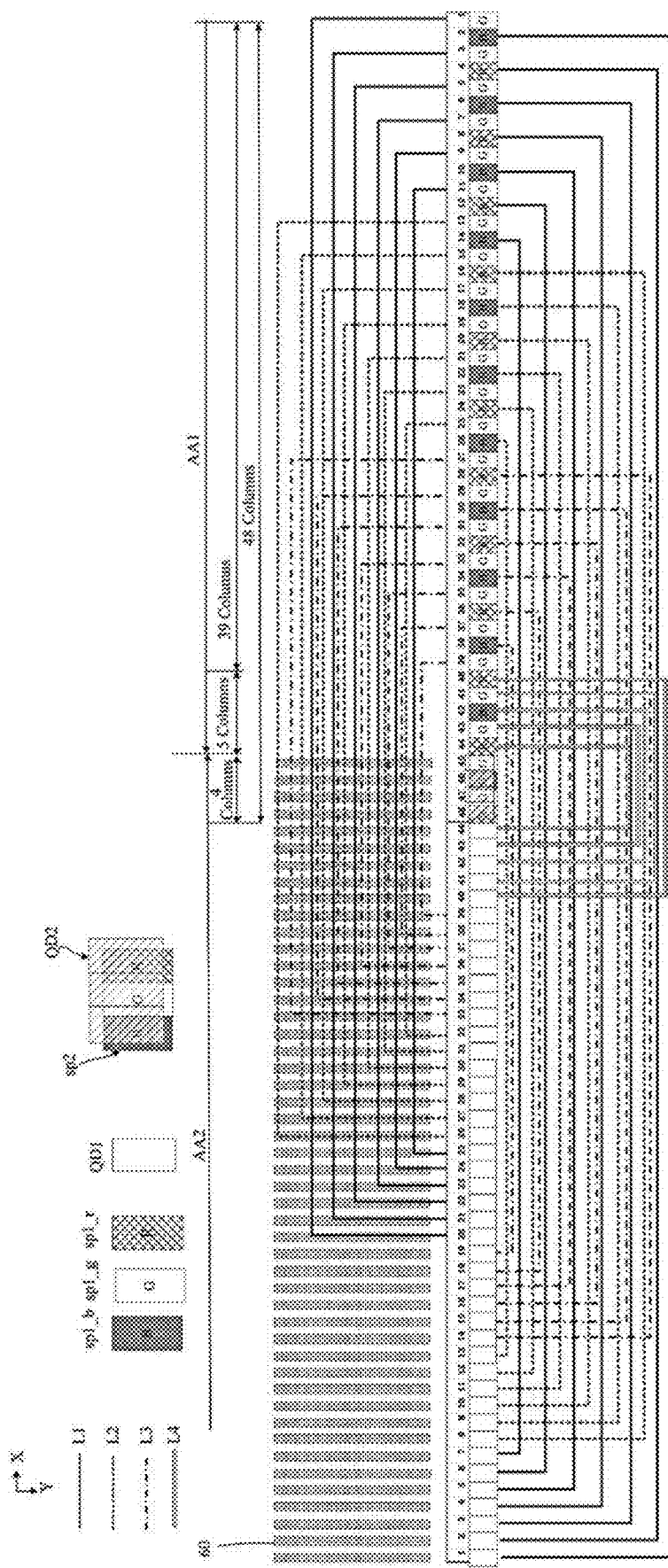
FIG. 7 is a schematic diagram of a first connection between a first light emitting device and a first pixel drive circuit according to an exemplary embodiment of the present disclosure.
Figure 8:
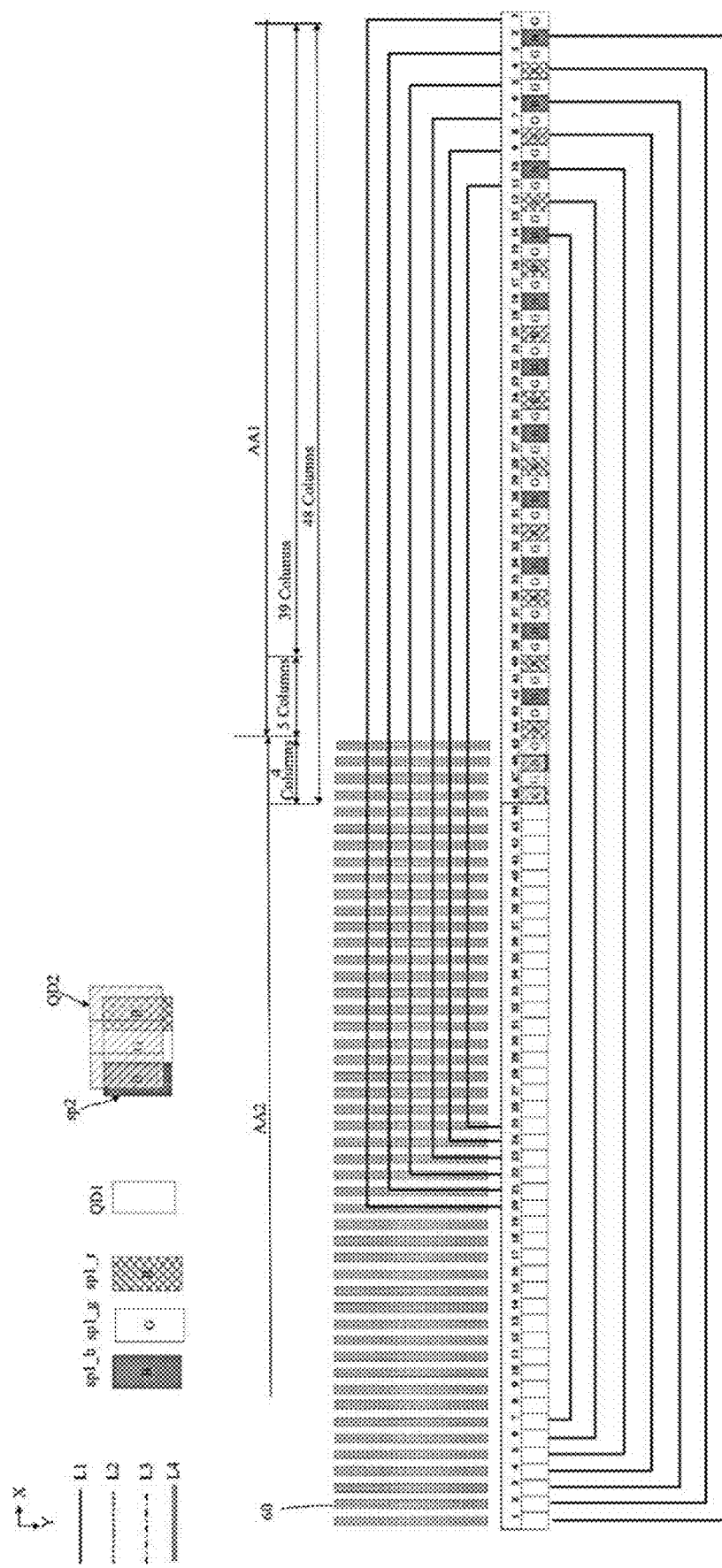
FIG. 8 is a schematic diagram of connection of a first transparent conductive line of a first transparent conductive layer in FIG. 7.
Figure 9:
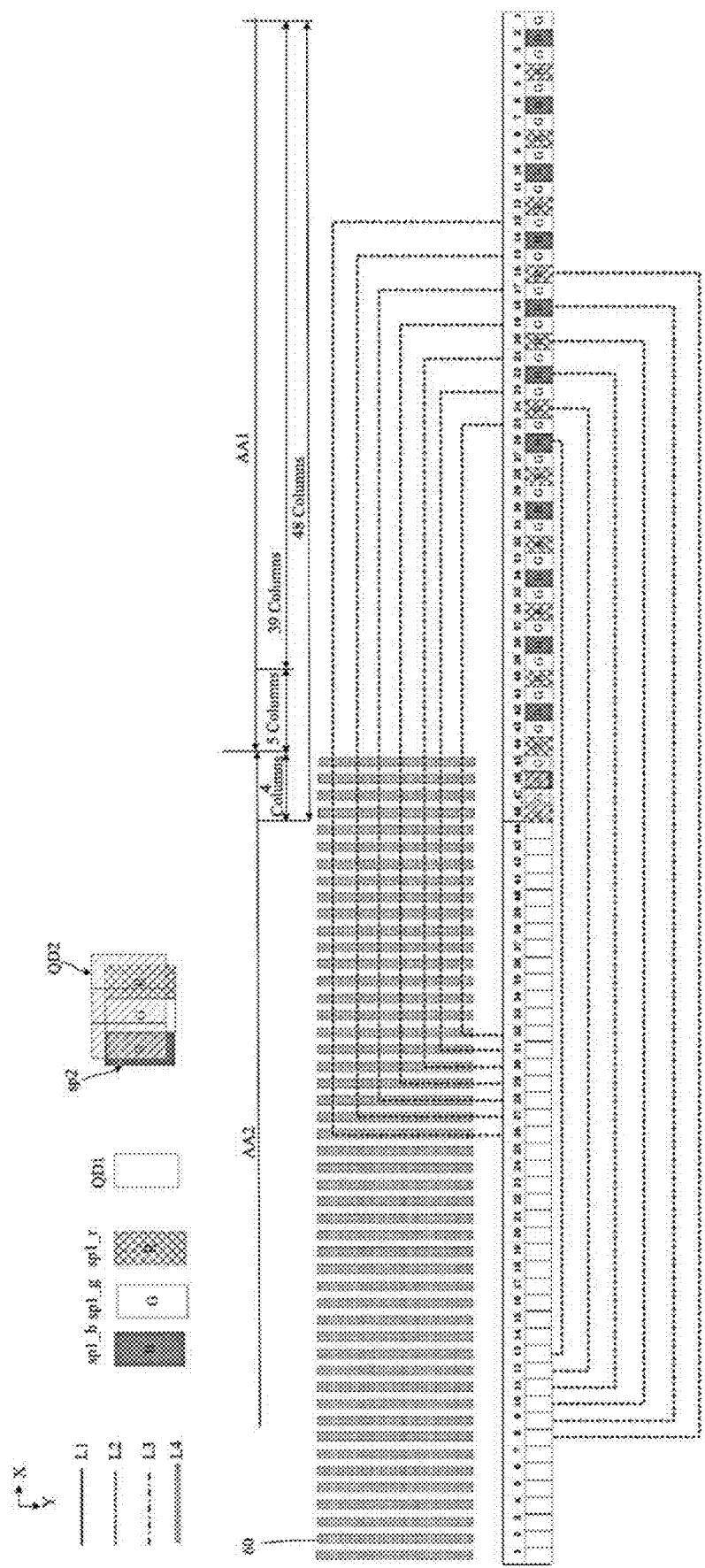
FIG. 9 is a schematic diagram of connection of a second transparent conductive line of a second transparent conductive layer in FIG. 7.
Figure 10:
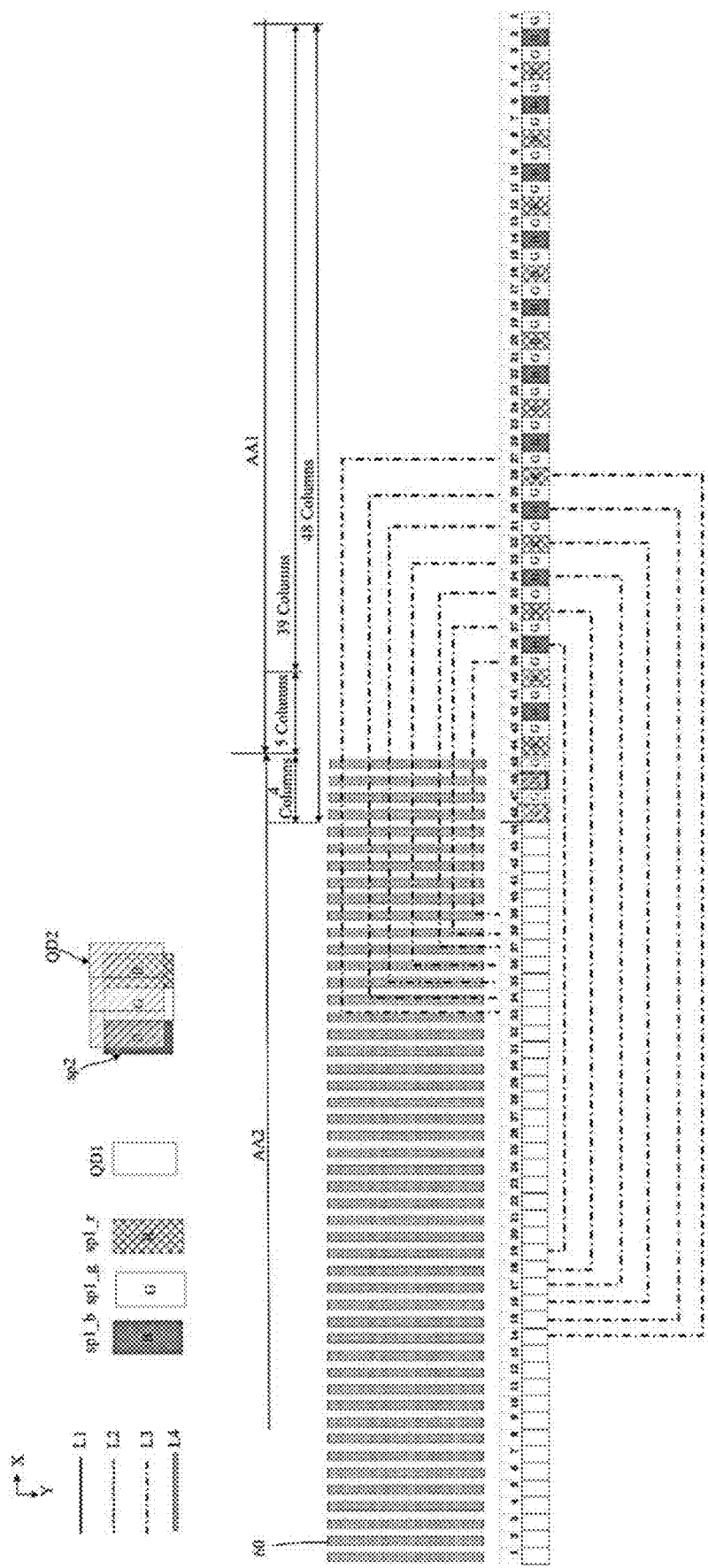
FIG. 10 is a schematic diagram of connection of a third transparent conductive line of a third transparent conductive layer in FIG. 7.
Figure 11:
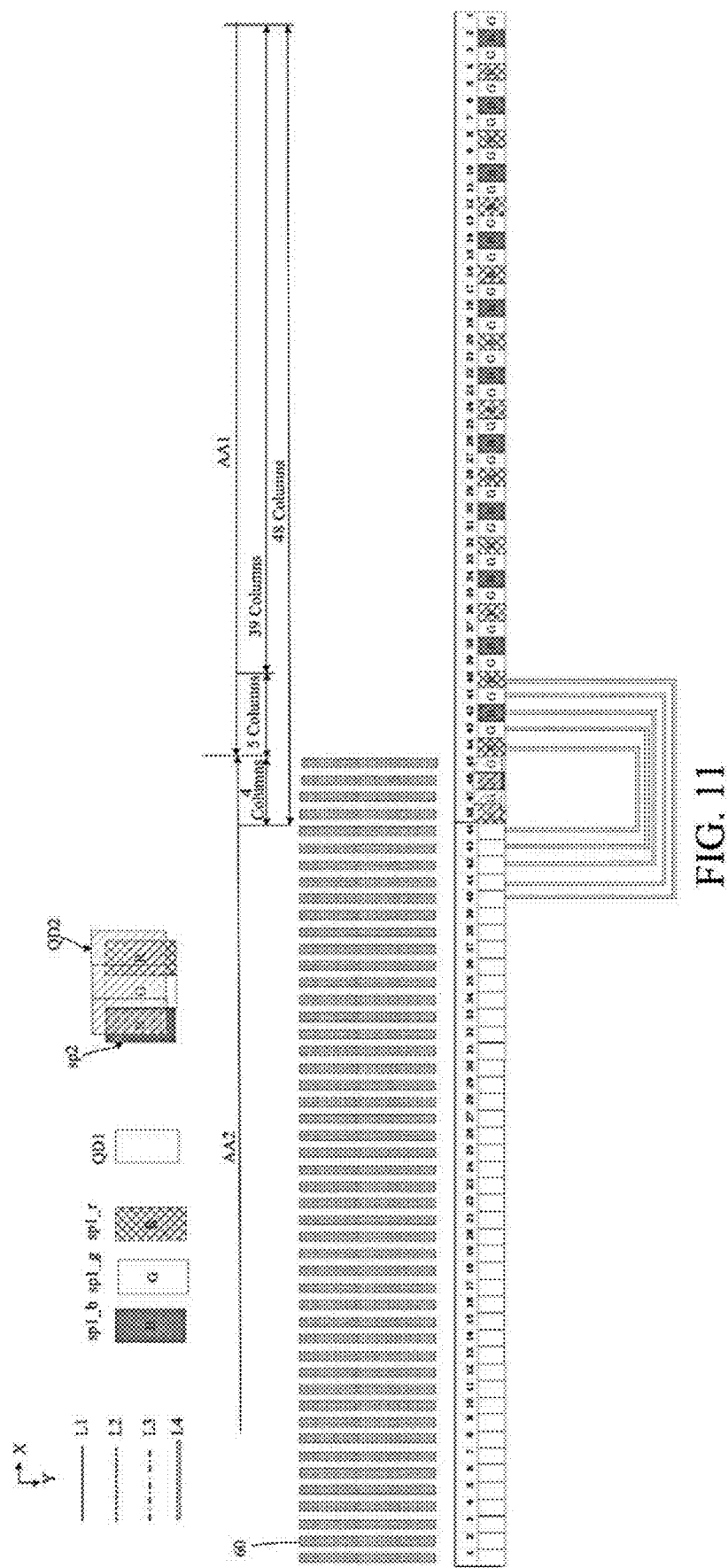
FIG. 11 is a schematic diagram of a connection of a metal conductive line of a metal conductive layer in FIG. 7.
Figure 12:
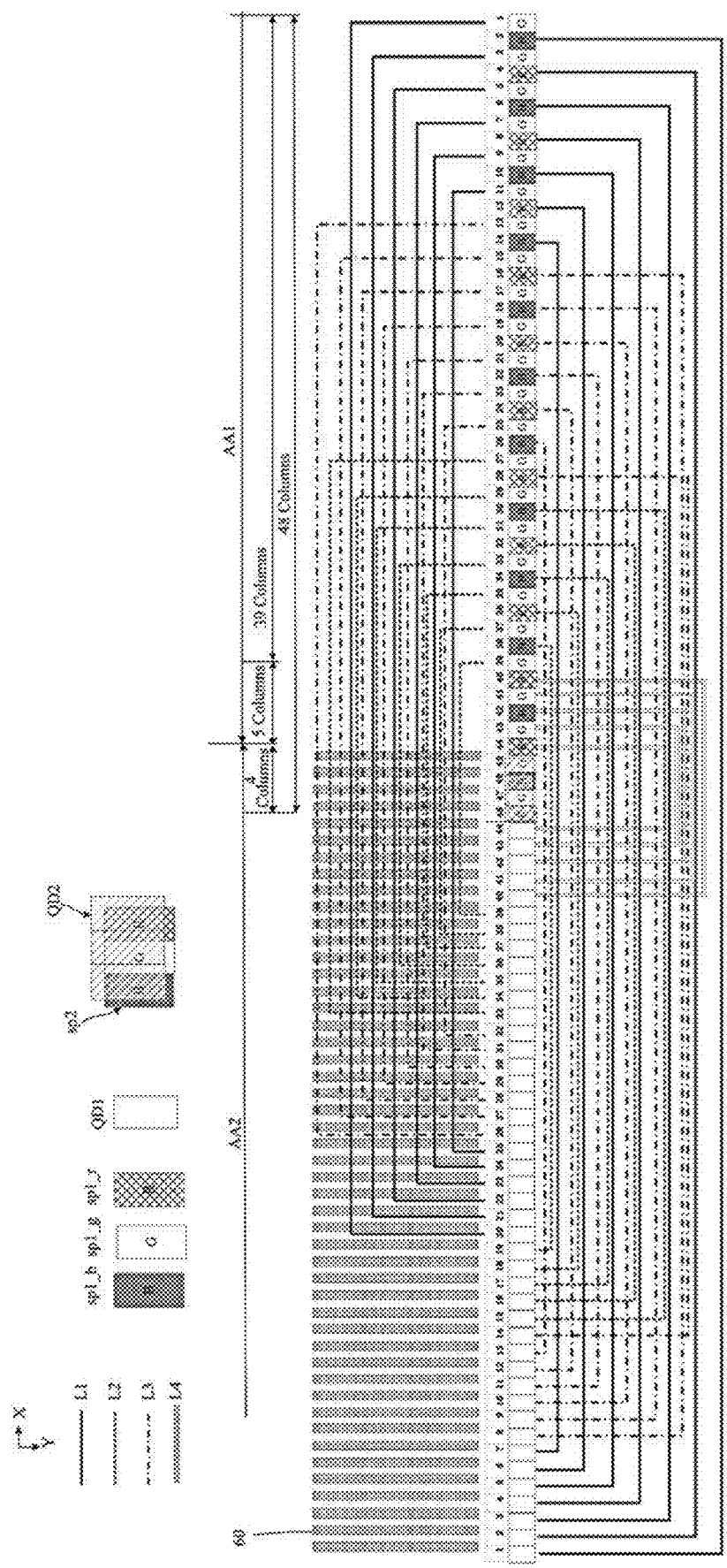
FIG. 12 is a schematic diagram of a second connection between a first light emitting device and a first pixel drive circuit according to an exemplary embodiment of the present disclosure.
Figure 13:
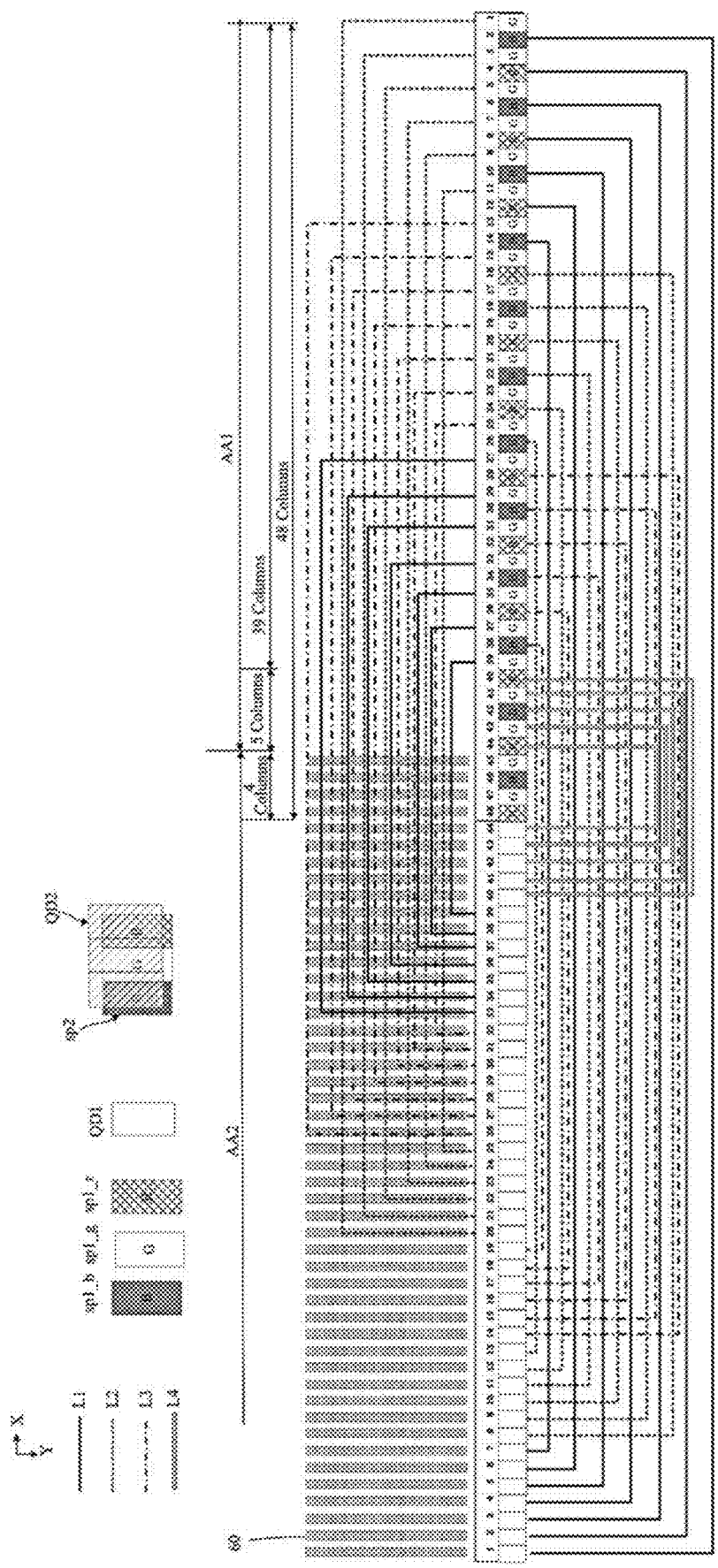
FIG. 13 is a schematic diagram of a third connection between a first light emitting device and a first pixel drive circuit according to an exemplary embodiment of the present disclosure.

FIG. 7 is a schematic diagram of a first connection between a first light emitting device and a first pixel drive circuit QD1 according to an exemplary embodiment of the present disclosure. FIG. 8 is a schematic diagram of connection of a first transparent conductive line L1 of a first transparent conductive layer in FIG. 7. FIG. 9 is a schematic diagram of connection of a second transparent conductive line L2 of a second transparent conductive layer in FIG. 7. FIG. 10 is a schematic diagram of connection of a third transparent conductive line L3 of a third transparent conductive layer in FIG. 7. FIG. 11 is a schematic diagram of a connection of a metal conductive line L4 of a metal conductive layer in FIG. 7. FIG. 12 is a schematic diagram of a second connection between a first light emitting device and a first pixel drive circuit QD1 according to an exemplary embodiment of the present disclosure. FIG. 13 is a schematic diagram of a third connection between a first light emitting device and a first pixel drive circuit QD1 according to an exemplary embodiment of the present disclosure. The connection mode of the light emitting device will be described below with reference to FIGS. 6A to 13.

In an exemplary embodiment, as shown in FIGS. 7 and 8, the green first light emitting device sp1_g in the first sub-region AA1a of the first display region AA1 may be electrically connected with the first pixel drive circuit QD1 in the transition display region AAG in the second display region AA2 through the first transparent conductive line L1 located in the first transparent conductive layer. As shown in FIGS. 7 and 9, the green first light emitting device sp1_g in the first sub-region AA1a may be electrically connected to the first pixel drive circuit QD1 in the transition display region AAG through the second transparent conductive line L2 located in the second transparent conductive layer. As shown in FIGS. 7 and 10, the green first light emitting device sp1_g in the first sub-region AA1a may be electrically connected to the first pixel drive circuit QD1 of the transition display region AAG through a third transparent conductive line L3 located in the third transparent conductive layer. As shown in FIG. 7, multiple green first light emitting devices sp1_g close to the center of the first display region AA1 are electrically connected with the first pixel drive circuit QD1 in the transition display region AAG through a first transparent conductive line L1, and multiple green first light emitting devices sp1_g close to the edge of the second display region AA1 are electrically connected with the first pixel drive circuit QD1 in the transition display region AAG through a third transparent conductive line L3. That is, multiple green first light emitting devices sp1_g away from the transition display region AAG in the first direction X are electrically connected with the first pixel drive circuit QD1 in the transition display region AAG through the first transparent conductive line L1, and multiple green first light emitting devices sp1_g close to the transition display region AAG are electrically connected to the first pixel drive circuit QD1 in the transition display region AAG through the third transparent conductive line L3. As shown in FIG. 7, the first transparent conductive line L1, the second transparent conductive line L2, and the third transparent conductive line L3 to which the green first light emitting device sp1_g is electrically connected are located on the same side, for example the upper side, of the anode connection electrodes of the group of first light emitting devices in the second direction Y. As shown in FIG. 7, an orthographic projection of the first transparent conductive line L1, the second transparent conductive line L2, and the third transparent conductive line L3 to which the green first light emitting device sp1_g is electrically connected on the display panel plane and an orthographic projection of the shield electrode 60 on the display panel plane may overlap. The shield electrode 60 is configured to shield the crosstalk of the capacitance between the conductive lines to the first node N1.

In an exemplary embodiment, as shown in FIGS. 7 and 8, the red first light emitting device sp1_*r* and the blue first light emitting device sp1_*b* within the first sub-region AA1*a* may be electrically connected to the first pixel drive circuit QD1 of the transition display region AAG through the first transparent conductive line L1 located in the first transparent conductive layer. As shown in FIGS. 7 and 9, the red first light emitting device sp1_*r* and the blue first light emitting device sp1_*b* in the first sub-region AA1*a* may be electrically connected to the first pixel drive circuit QD1 of the transition display region AAG through the second transparent conductive line L2 located in the second transparent conductive layer. As shown in FIGS. 7 and 10, the red first light emitting device sp1_*r* and the blue first light emitting device sp1_*b* in the first sub-region AA1*a* may be electrically connected to the first pixel drive circuit QD1 of the transition display region AAG through a third transparent conductive line L3 located in the third transparent conductive layer. As shown in FIGS. 7 to 10, multiple red first light emitting devices sp1_*r* and blue first light emitting devices sp1_*b* in the first sub-region AA1*a* close to the transition display region AAG may be electrically connected to the first pixel drive circuit QD1 of the transition display region AAG through a third transparent conductive line L3 located in the third transparent conductive layer, and multiple red first light emitting devices sp1_*r* and blue first light emitting devices sp1_*b* in the first sub-region AA1*a* away from the transition display region AAG may be electrically connected to the first pixel drive circuit QD1 of the transition display region AAG through the first transparent conductive line L1 located in the first transparent conductive layer. As shown in FIG. 7, the first transparent conductive line L1, the second transparent conductive line L2, and the third transparent conductive line L3 to which the red first light emitting device sp1_*r* is electrically connected are located on the same side of the transfer electrodes of the group of first light emitting devices in the second direction Y, for example, on the lower side. As shown in FIG. 7, the first transparent conductive line L1, the second transparent conductive line L2, and the third transparent conductive line L3 to which the blue first light emitting device sp1_*b* is electrically connected are located on the same side of the group of first light emitting devices in the second direction Y, for example, on the lower side. As shown in FIG. 7, the first transparent conductive line L1, the second transparent conductive line L2 and the third transparent conductive line L32 to which the red first light emitting device sp1_*r* is electrically connected, and the first transparent conductive line L1, the second transparent conductive line L2 and the third transparent conductive line L3 to which the blue first light emitting device sp1_*b* is electrically connected are located on the same side, for example, on the lower side, of the transfer electrodes of the group of first light emitting devices in the second direction Y. As shown in FIG. 7, an orthographic projection of the first transparent conductive line L1, the second transparent conductive line L2 and the third transparent conductive line L3 electrically connected to the red first light emitting device sp1_*r* and the blue first light emitting device sp1_*b* on the display panel plane and an orthographic projection of the shield electrode 60 on the display panel plane may not overlap.

In an exemplary embodiment, as shown in FIG. 7, the second transparent conductive line L2 to which the green first light emitting device sp1_*g* is electrically connected and the second transparent conductive line L2 to which the blue first light emitting device sp1_*b* is electrically connected are located on both sides of the transfer electrodes of the group of first light emitting devices in the second direction Y. The second transparent conductive line L2 to which the green first light emitting device sp1_*g* is electrically connected and the second transparent conductive line L2 to which the red first light emitting device sp1_*r* is electrically connected are located on both sides of the transfer electrodes of the group of first light emitting devices in the second direction Y.

In an exemplary embodiment, as shown in FIGS. 7 and 1,1 the green first light emitting device sp1_*g* within the second sub-region AA1*b* may be electrically connected to the first pixel drive circuit QD1 of the transition display region AAG through the metal conductive line L4 located in the metal conductive layer. As shown in FIGS. 7 and 11, the red first light emitting device sp1_*r* and the blue first light emitting device sp1_*b* in the second sub-region AA1*b* may be electrically connected to the first pixel drive circuit QD1 of the transition display region AAG through a metal conductive line L4 located in the metal conductive layer. As shown in FIGS. 7 and 11, a metal conductive line L4 to which the green first light emitting device sp1_*g*, the red first light emitting device sp1_*r* and the blue first light emitting device sp1_*b* are electrically connected is located on the same side, e.g. the lower side, of the transfer electrodes of the group of first light emitting devices in the second direction Y. As shown in FIGS. 7 and 11, an orthographic projection of the metal conductive line L4 to which the first light emitting device sp1 is electrically connected on the display panel plane and an orthographic projection of the shield electrode 60 on the display panel plane may not overlap. As shown in FIGS. 7 and 11, an orthographic projection of the metal conductive line L4 electrically connected to the first light emitting device sp1 on the display panel plane may overlap with an orthographic projection of the first transparent conductive line L1, the second transparent conductive line L2, and the third transparent conductive line L3 electrically connected to the red first light emitting device sp1_*r* and the blue first light emitting device sp1_*b* on the display panel plane. As shown in FIGS. 7 and 11, an orthographic projection of the metal conductive line L4 electrically connected to the first light emitting device sp1 on the display panel plane and an orthographic projection of the first transparent conductive line L1, the second transparent conductive line L2, and the third transparent conductive line L3 electrically connected to the green first light emitting device sp1_*g* on the display panel plane may not overlap.

In an exemplary embodiment, about 10 to 15 first transparent conductive lines L1 may be arranged in the routing arrangement space of the first transparent conductive layer, for example, as shown in FIGS. 7 and 8, 13 first transparent conductive lines L1 may be arranged in the routing arrangement space of the first transparent conductive layer. About 10 to 15 second transparent conductive lines L2 may be arranged in the routing arrangement space of the second transparent conductive layer, for example, as shown in FIGS. 7 and 9, 13 second transparent conductive lines L2 may be arranged in the routing arrangement space of the second transparent conductive layer. About 10 to 15 third transparent conductive lines L3 may be arranged in the routing arrangement space of the third transparent conductive layer, for example, as shown in FIGS. 7 and 10, 13 third transparent conductive lines L3 may be arranged in the routing arrangement space of the third transparent conductive layer. For example, as shown in FIG. 7 and FIG. 11, about 5 metal conductive lines L4 may be arranged in the routing arrangement space of the metal conductive layer. Here, no limitation is made thereto in embodiments of the present disclosure.

For example, the metal conductive layer may be a first source-drain metal (SD1) layer or a second source-drain metal layer (SD2). For example, the first source-drain metal (SD1) layer may include first electrodes and second electrodes of multiple transistors in the pixel drive circuit, data signal lines, first power supply lines and the like. For example, the second source-drain metal layer (SD2) may include a shield electrode 60.

In an exemplary embodiment, as shown in FIGS. 7, 12 and 13, the second light emitting device sp2 relatively close to the first display region AA1 in the second display region AA2 adopts an in-situ driving mode, that is, the second light emitting device sp2 relatively close to the first display region AA1 in the transition display region and the second pixel drive circuit QD2 driving the second light emitting device sp2 are both located in the transition display region AAG. For example, as shown in FIG. 7, the 45th to 48th light emitting devices are driven in situ.

In an exemplary embodiment, as shown in FIG. 12, multiple green first light emitting devices sp1_g close to the center of the first display region AA1 are electrically connected to the first pixel drive circuit QD1 in the transition display region AAG through a first transparent conductive line L1, and multiple green first light emitting devices sp1_g close to the edge of the first display region AA1 (i.e., relatively close to the second display region AA2 of the first display region AA1) are electrically connected to the first pixel drive circuit QD1 in the transition display region AAG through a second transparent conductive line L2 of the second transparent conductive layer. A plurality of red first light emitting devices sp1_r and blue first light emitting devices sp1_b close to the center of the first display region AA1 are electrically connected to a first pixel drive circuit QD1 in the transition display region AAG through a first transparent conductive line L1, and multiple red first light emitting devices sp1_r and blue first light emitting devices sp1_b close to the edge of the first display region AA1 (i.e., relatively close to the second display region AA2 of the first display region AA1) are electrically connected to the first pixel drive circuit QD1 in the transition display region AAG through a second transparent conductive line L2 of the second transparent conductive layer.

In an exemplary embodiment, as shown in FIG. 13, multiple green first light emitting devices sp1_g close to the center of the first display region AA1 are electrically connected to the first pixel drive circuit QD1 in the transition display region AAG through the second transparent conductive line L2 of the second transparent conductive layer, and multiple green first light emitting devices sp1_g close to the edge of the first display region AA1 (i.e., relatively close to the second display region AA2 of the first display region AA1) are electrically connected to the first pixel drive circuit QD1 in the transition display region AAG through the first transparent conductive line L1 of the first transparent conductive layer. A plurality of red first light emitting devices sp1_r and blue first light emitting devices sp1_b close to the center of the first display region AA1 are electrically connected to the first pixel drive circuit QD1 in the transition display region AAG through a first transparent conductive line L1, and multiple red first light emitting devices sp1_r and blue first light emitting devices sp1_b close to the edge of the first display region AA1 (i.e., relatively close to the second display region AA2 of the first display region AA1) are electrically connected to the first pixel drive circuit QD1 in the transition display region AAG through a third transparent conductive line L3 located in the third transparent conductive layer.

In this example, for the first light emitting device sp1 of the first display region AA1, the first light emitting device sp1 close to the center in the first sub-region AA1a may be electrically connected by using the first transparent conductive line L1 of the first transparent conductive layer, the second transparent conductive line L2 of the second transparent conductive layer may be used for electrical connection after using the routing arrangement space of the first transparent conductive layer, the first light emitting device sp1 relatively close to the transition display region AAG in the first sub-region AA1a may be electrically connected by using the third transparent conductive line L3 of the third transparent conductive layer after using the routing arrangement space of the second transparent conductive layer, and the metal conductive line L4 of the metal conductive layer may be used for electrical connection in the second sub-region AA1b after using the routing arrangement space of the third transparent conductive layer. Of course, other arrangements may be adopted; for example, the first light emitting device sp1 close to the transition display region AAG may be electrically connected using the second transparent conductive line L2 of the second transparent conductive layer. Here, no limitation is made thereto in embodiments of the present disclosure.

A structure of the display panel will now be described through an example of a manufacturing process of the display panel. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. The deposition may be any one or more of sputtering, evaporation, and chemical vapor deposition. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a certain material on a substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern".

In an exemplary embodiment, in a direction perpendicular to the display panel, the display panels of the second display region AA2 and the first display region AA1 may include a substrate, a circuit structure layer disposed on the substrate, a first transparent conductive layer, a second transparent conductive layer, a third transparent conductive layer, and a light emitting structure layer. The circuit structure layer of the first display region AA1 may include multiple insulating layers. The circuit structure layer of the second display region AA2 may include multiple first pixel drive circuits and multiple second pixel drive circuits. A first planarization layer may be disposed between the first transparent conductive layer and the second transparent conductive layer, and a second planarization layer may be disposed between the second transparent conductive layer and the third transparent conductive layer. A third planarization layer may be provided between the third transparent conductive layer and the light emitting structure layer. For example, the first planarization layer and the third planarization layer may be organic material layers. The light emitting structure layer may include an anode layer, a pixel define layer, an organic light emitting layer, and a cathode. The anode layer may include an anode of a first light emitting device located in the first display region AA1 and an anode of a second light emitting device located in the second display region AA2. For example, the area of the anode of the first light emitting device may be smaller than the area of the anode of the second light emitting device emitting light of the same color, so as to increase the light transmittance rate of the first display region AA1. In some other examples, the display panel may include two or more transparent conductive layers. Here, no limitation is made thereto in embodiments of the present disclosure.

In an exemplary embodiment, the preparation process of the display panel may include the following acts. A first pixel drive circuit QD1 and a second pixel drive circuit QD2 of the second display region AA2 are described below as examples. Wherein, the first pixel drive circuit QD1 of the transition display region AAG may employ a pixel drive circuit as shown in FIG. 3. In addition, the structure of the second pixel drive circuit QD2 and the first pixel drive circuit QD1 may be substantially the same, and the structure of the invalid pixel drive circuit and the first pixel drive circuit QD1 may be substantially similar, but the invalid pixel drive circuit has no via hole connection and no signal, which will be understood by those skilled in the art with reference to the relevant description, and the embodiments of the present disclosure will not be described in detail here.

(1) A Substrate is Provided

In an exemplary embodiment, the substrate may be a flexible substrate, or may be a rigid substrate. For example, the rigid substrate may include, but is not limited to, one or more of glass and quartz. For example, the flexible substrate may include, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. For example, the flexible substrate may include a first flexible material layer, a first inorganic material layer, a semiconductor layer, a second flexible material layer, and a second inorganic material layer that are stacked. Materials of the first flexible material layer and the second flexible material layer may be polyimide (PI), polyethylene terephthalate (PET) or a polymer soft thin film with surface treatment. Materials of the first inorganic material layer and the second inorganic material layer may be silicon nitride (SiNx) or silicon oxide (SiOx), for improving water and oxygen resistance of the substrate, and a material of the semiconductor layer may be amorphous silicon (a-si).

(2) A Pattern of a Semiconductor Layer is Formed on the Substrate

Figure 14:
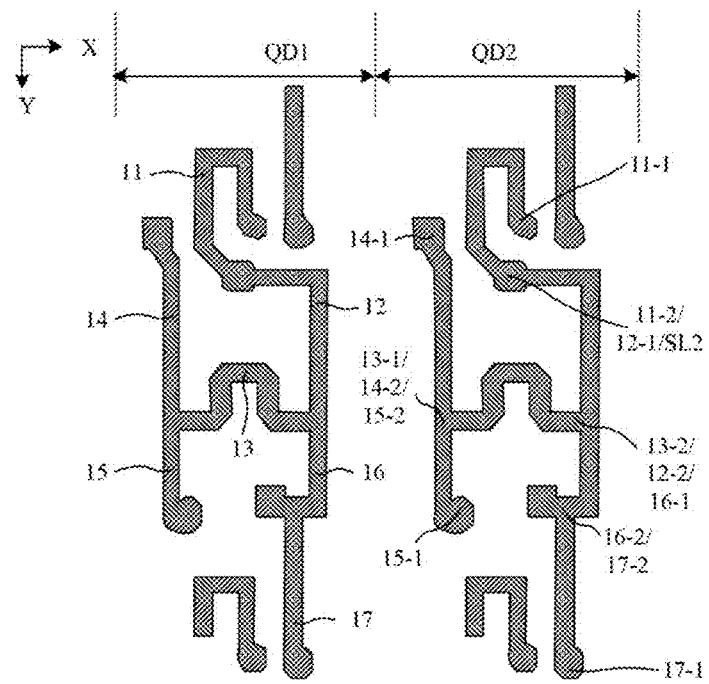
FIG. 14 is a schematic diagram of an embodiment of the present disclosure after a semiconductor layer is formed.

In an exemplary embodiment, forming the pattern of the semiconductor layer on the substrate may include: a first insulating thin film and a semiconductor thin film are sequentially deposited on the substrate, and the semiconductor thin film is patterned through a patterning process to form a first insulating layer that covers the substrate, and the semiconductor layer disposed on the first insulating layer, as shown in FIG. 14.

In an exemplary embodiment, the first insulating layer may be referred to as a Buffer layer and is configured to improve the water oxygen resistance of the substrate. The semiconductor layer may be called an Active (ACT) layer.

In an exemplary embodiment, as shown in FIG. 14, the semiconductor layer of the second display region AA2 may at least include active layers of multiple transistors of the pixel drive circuit, for example, a first active layer 11 of the first transistor T1, a second active layer 12 of the second transistor T2, a third active layer 13 of the third transistor T3, a fourth active layer 14 of the fourth transistor T4, a fifth active layer 15 of the fifth transistor T5, a sixth active layer 16 of the sixth transistor T6, and a seventh active layer 17 of the seventh transistor T7.

In an exemplary embodiment, as shown in FIG. 14, active layers of multiple transistors (for example, the first active layer 11 to the seventh active layer 17) of a pixel drive circuit may be of an integral structure connected to each other.

In an exemplary embodiment, as shown in FIG. 14, the second active layer 12 and the sixth active layer 16 may be located on one side of the first direction X of the third active layer 13, and the fourth active layer 14 and the fifth active layer 15 may be located on the opposite side of the first direction X of the third active layer 13. The fifth active layer 15, the sixth active layer 16, and the seventh active layer 17 are located on the side of the second direction Y of the third active layer 13, and the first active layer 11, the second active layer 12, and the fourth active layer 14 may be located on the opposite side of the second direction Y of the third active layer 13.

In an exemplary embodiment, as shown in FIG. 14, the shape of the first active layer 11 may be an "n" shape. The shape of the second active layer 12 may be in an inverted "L" shape. The shape of the third active layer 13 may be in the shape of an "Ω". The fourth active layer 14, the fifth active layer 15, the sixth active layer 16, and the seventh active layer 17 may all have an "I" shape.

In an exemplary embodiment, an active layer of each transistor may include at least one channel region, and a first region and a second region located on two sides of the channel region. For example, the channel region may not be doped with an impurity, and has characteristics of a semiconductor. The first region and the second region may be disposed on two sides of the channel region and doped with impurities, and thus are conductive. The impurities may be changed according to a type of a transistor. In some examples, a doped region of the active layer may be interpreted as a source or a drain of a transistor. A part of the active layer between the transistors may be interpreted as a wiring doped with an impurity, and may be configured for electrically connecting the transistor.

In an exemplary embodiment, as shown in FIG. 14, the first region 11-1 of the first active layer 11, the first region 14-1 of the fourth active layer 14, the first region 15-1 of the fifth active layer 15 and the first region 17-1 of the seventh active layer 17 may be disposed separately. The second region 11-2 of the first active layer 11 may simultaneously serve as the first region 12-1 and the second gate signal portion SL2 of the second active layer 12, the first region 13-1 of the third active layer 13 may simultaneously serve as the second region 14-2 of the fourth active layer 14 and the second region 15-2 of the fifth active layer 15, the second region 13-2 of the third active layer 13 may simultaneously serve as the second region 12-2 of the second active layer 12 and the first region 16-1 of the sixth active layer 16, and the second region 16-2 of the sixth active layer 16 may simultaneously serve as the second region 17-2 of the seventh active layer 17.

In an exemplary embodiment, the semiconductor layer may be made of a metal oxide material. For example, the metal oxide material may include, but is not limited to: an oxide containing indium and tin, an oxide containing tungsten and indium, an oxide containing tungsten, indium and zinc, an oxide containing titanium and indium, an oxide containing titanium, indium and tin, an oxide containing indium and zinc, an oxide containing silicon, indium and tin, or an oxide containing indium, gallium and zinc, etc. For example, the semiconductor layer may be made of a material, such as an amorphous indium gallium zinc oxide material (a-IGZO), zinc oxynitride (ZnON), indium zinc tin oxide (IZTO), amorphous silicon (a-Si), polycrystalline silicon (p-Si), sexithiophene or polythiophene, that is, the present disclosure is applicable to transistors manufactured based on oxide technology, silicon technology or organic technology. For example, the semiconductor layer may be a single layer, a double layer, or a multi-layer, etc. Here, no limitation is made thereto in embodiments of the present disclosure.

In an exemplary embodiment, the first insulating layer may employ any one or more of silicon oxide (SiOx), silicon nitride (SiNx), and silicon oxynitride (SiON), and may be a single layer, a multi-layer, or a composite layer.

(3) A Pattern of a First Conductive Layer is Formed

Figure 15A:
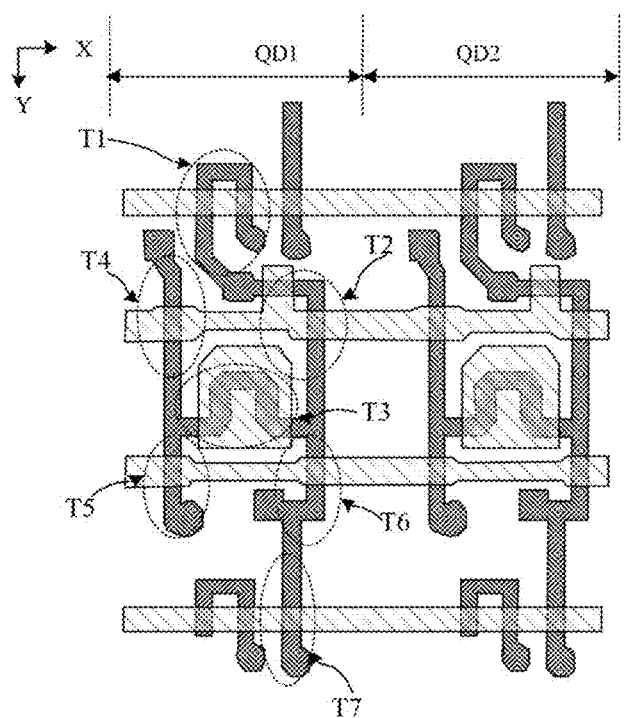
FIG. 15A is a schematic diagram of an embodiment of the present disclosure after a first conductive layer is formed.
Figure 15B:
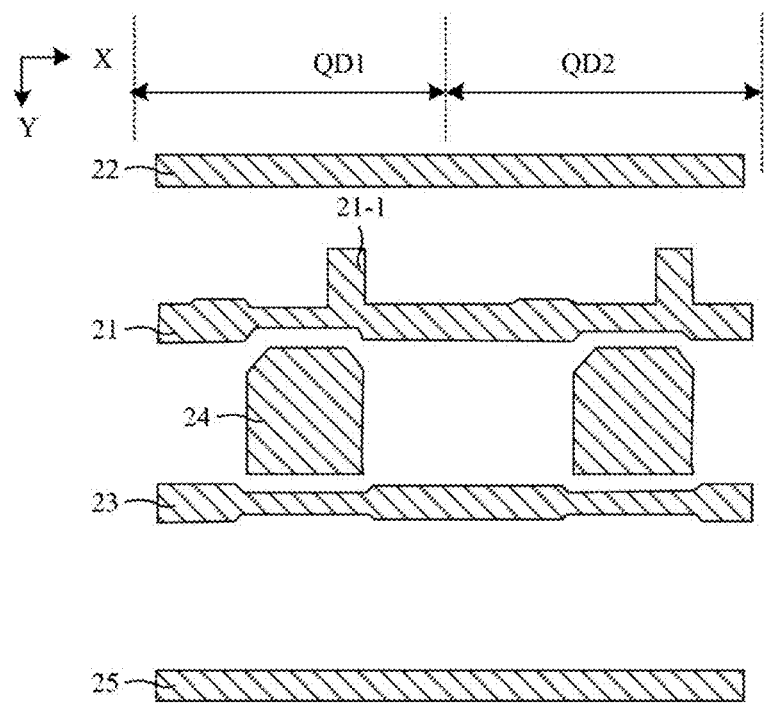
FIG. 15B is a schematic planar diagram of the first conductive layer in FIG. 15A.

In an exemplary embodiment, forming the pattern of the first conductive layer may include: depositing sequentially a second insulating thin film and a first conductive thin film on the substrate on which the aforementioned pattern is formed, and patterning the first conductive thin film through a patterning process to form a second insulating layer that covers a pattern of the semiconductor layer and form the pattern of the first conductive layer disposed on the second insulating layer, as shown in FIG. 15A and FIG. 15B, and FIG. 15B is a planar schematic diagram of the first conductive layer in FIG. 15A.

In an exemplary embodiment, the second insulating layer may be called a gate insulating (GI) layer and the first conductive layer may be called a first gate metal (Gate1) layer.

In an exemplary embodiment, as shown in FIGS. 15A and 15B, the first conductive layer of the second display region AA2 may at least include a scan signal line 21, a first reset control line 22, a light emitting control line 23, a first electrode plate 24 of the storage capacitor Cst and a second reset control line 25.

In an exemplary embodiment, the shape of the first electrode plate 24 of the storage capacitor may be rectangular, the corners of the rectangle may be chamfered, and an orthographic projection of the first electrode plate 24 on the substrate at least partially overlaps an orthographic projection of the third active layer 13 on the substrate. In an exemplary embodiment, the first electrode plate 24 may serve as a first electrode plate of the storage capacitor and a gate electrode of the third transistor T3 at the same time. For example, the transistors employed in the embodiments of the present disclosure may include a variety of structures such as a top gate type, a bottom gate type, or a double gate structure. In an exemplary embodiment, the second transistor T2 and the first transistor T1 connected to the gate electrode of the third transistor T3 may be a double gate type thin film transistor, which may help reduce the leakage current of the gate electrode of the third transistor T3.

In an exemplary embodiment, the shapes of the scan signal line 21, the first reset control line 22, the second reset control line 25, and the light emitting control line 23 may be line shapes in which the main body portion extends along the first direction X. The scan signal line 21 and the light emitting control line 23 may be located on both sides of the first electrode plate 24 in the second direction Y. The first reset control line 22 may be located on a side of the scan signal line 21 away from the first electrode plate 24. The second reset control line 25 may be located on a side of the scan signal line 21 away from the first electrode plate 24.

In an exemplary embodiment, the region where the scan signal line 21 overlaps with the second active layer 12 may serve as a gate electrode of the second transistor T2, and an orthographic projection of the scan signal line 21 on the substrate and an orthographic projection of the second active layer 12 on the substrate have a first overlapping region. For example, the scan signal line 21 is provided with a gate block 21-1 protruding toward the first reset control line 22 side, a region where the gate block 21-1 overlaps with the second active layer 12 may serve as another gate electrode of the second transistor T2, and a second overlapping region exists between an orthographic projection of the gate block 21-1 on the substrate and an orthographic projection of the second active layer 12 on the substrate, so that a second transistor T2 with a double gate structure may be formed. For example, the scan signal line 21 and the gate electrode of the second transistor T2 of the pixel drive circuit in the same row may have an integral structure connected to each other.

In an exemplary embodiment, the region where the scan signal line 21 overlaps with the fourth active layer 14 may serve as the gate electrode of the fourth transistor T4, and an overlapping region exists between an orthographic projection of the scan signal line 21 on the substrate and an orthographic projection of the fourth active layer 14 on the substrate. For example, the scan signal line 21 and the gate electrode of the fourth transistor T4 of the pixel drive circuit in the same row may have an integral structure connected to each other.

In an exemplary embodiment, the region where the first reset control line 22 overlaps with the first active layer 11 may serve as the gate electrode of the first transistor T1 of the double-gate structure, and an overlapping region exists between an orthographic projection of the first reset control line 22 on the substrate and an orthographic projection of the first active layer 11 on the substrate. For example, the first reset control line 22 and the gate electrode of the first transistor T1 of the pixel drive circuit in the same row may have an integral structure connected to each other.

In an exemplary embodiment, the region where the second reset control line 25 overlaps with the seventh active layer 17 serves as the gate electrode of the seventh transistor T7, and an overlapping region exists between an orthographic projection of the second reset control line 25 on the substrate and an orthographic projection of the second active layer 12 on the substrate. For example, the second reset control line 25 and the gate electrode of the seventh transistor T7 of the pixel drive circuit in the same row may have an integral structure connected to each other.

In an exemplary embodiment, a region of the light emitting control line 23 overlapping the fifth active layer 15 serves as a gate electrode of the fifth transistor T5, and a region of the light emitting control line 23 overlapping the sixth active layer 16 serves as a gate electrode of the sixth transistor T6. The orthographic projection of the light emitting control line 23 on the substrate overlaps an orthographic projection of the fifth active layer 15 on the substrate, and an orthographic projection of the light emitting control line 23 on the substrate overlaps an orthographic projection of the sixth active layer 16 on the substrate. For example, the gate electrodes of the fifth transistor T5 and the gate electrodes of the sixth transistor T6 of the pixel drive circuit in the same row of the light emitting control line 23 may have an integral structure connected to each other.

In an exemplary embodiment, after the pattern of the first conductive layer is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first active layer to the seventh active layer are all made to be conductive.

In an exemplary embodiment, the second conductive layer may be made of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. For example, the second conductive layer may be a single-layer structure, or a multi-layer composite structure such as Mo/Cu/Mo or the like.

In an exemplary embodiment, the second insulating layer may employ any one or more of silicon oxide (SiOx), silicon nitride (SiNx), and silicon oxynitride (SiON), and may be a single layer, a multi-layer, or a composite layer.

(4) A Pattern of a Second Conductive Layer is Formed

Figure 16A:
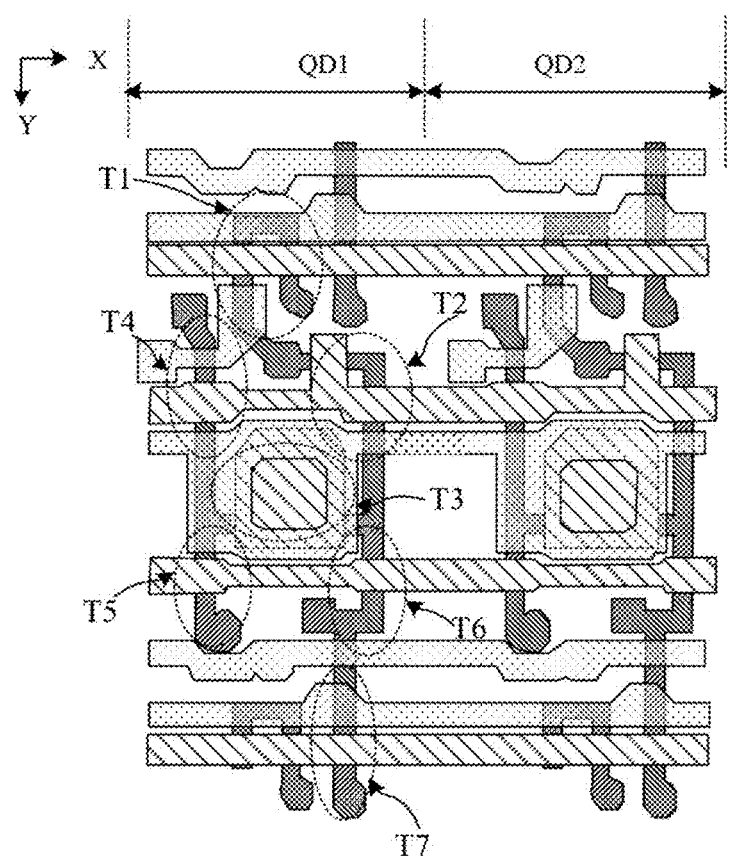
FIG. 16A is a schematic diagram of an embodiment of the present disclosure after a second conductive layer is formed.
Figure 16B:
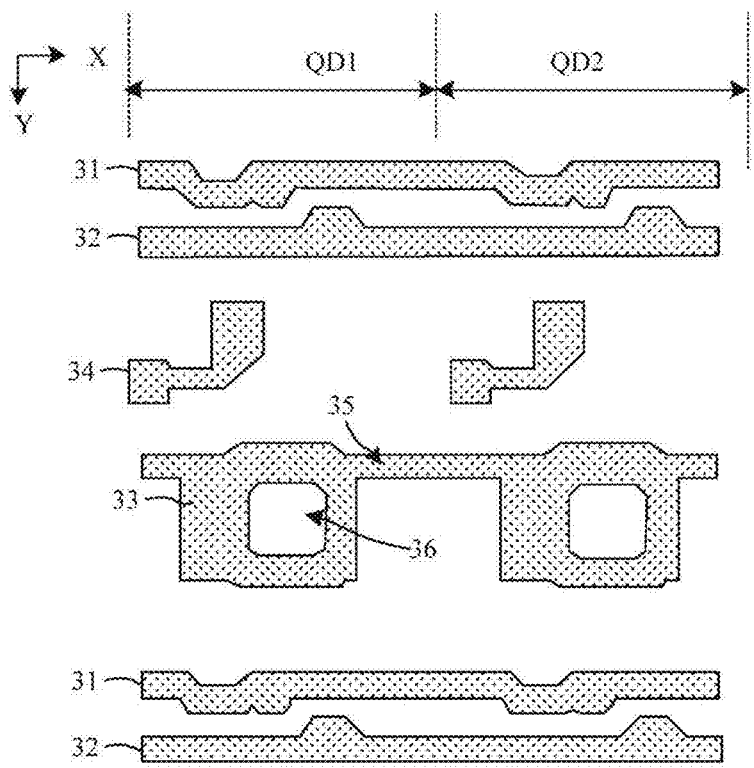
FIG. 16B is a schematic planar view of a second conductive layer in FIG. 16A.

In an exemplary embodiment, forming a pattern of a second conductive layer may include: a third insulating thin film and a second conductive thin film are sequentially deposited on the substrate on which the aforementioned patterns are formed, and the second conductive thin film is patterned through a patterning process to form a third insulating layer that covers the first conductive layer and the pattern of the second conductive layer disposed on the third insulating layer, as shown in FIG. 16A and FIG. 16B. FIG. 16B is a schematic plan view of the second conductive layer in FIG. 16A.

In an exemplary embodiment, the third insulating layer may be called a gate insulating (GI) layer and the second conductive layer may be called a second gate metal (Gate2) layer.

In an exemplary embodiment, as shown in FIGS. 16A and 16B, the second conductive layer of the second display region AA2 may at least include a first initial signal line 31 a second initial signal line 32, a second electrode plate 33 of the storage capacitor Cst, a stopper 34, and an electrode plate connection line 35.

In an exemplary embodiment, the second electrode plate 33 of the storage capacitor may be located between the scan signal line 21 and the light emitting control line 23 of the pixel drive circuit, and the second electrode plates 33 of the adjacent pixel drive circuits in the first direction X or the opposite direction of the first direction X may be connected by an electrode plate connection line 35, the first terminal of the electrode plate connection line 35 is connected to the second electrode plate 33. After the second terminal of the electrode plate connection line 35 extends along the first direction X or the opposite direction of the first direction X, it is connected to the second electrode plate 33 of the adjacent pixel drive circuit. That is, the electrode plate connection line 35 is configured to connect the second electrode plates 33 of adjacent pixel drive circuits on a unit row.

In an exemplary embodiment, second electrode plates of multiple pixel drive circuits in one unit row form an integrated structure connected to each other through the electrode plate connection line, and the second electrode plates with the integrated structure may be reused as a power supply connection line, thus ensuring that multiple second electrode plates in one unit row have a same potential, which is conducive to improving uniformity of the panel, avoiding a poor display of the display panel and ensuring a display effect of the display panel.

In an exemplary embodiment, a profile of second electrode plate 33 may be in the shape of a rectangle, corners of which in shape of the rectangle may be provided with a chamfer. There is at least an overlapped region between an orthographic projection of the second electrode plate 33 on the substrate and an orthographic projection of the first electrode plate 24 on the substrate, the first electrode plate 24 and the second electrode plate 33 form the storage capacitor of the pixel drive circuit.

In an exemplary embodiment, the second electrode plate 33 is provided with an opening 36, and the opening 36 may be located in a middle of the second electrode plate 33. For example, the opening 36 may be rectangular, and the second electrode plate 33 forms an annular structure. For example, the opening 36 exposes the third insulating layer covering the first electrode plate 24, and an orthographic projection of the first electrode plate 24 on the substrate contains an orthographic projection of the opening 36 on the substrate. For example, the opening 36 may be configured to accommodate a subsequently formed first via hole. The first via hole is located in the opening 36 and exposes the first electrode plate 24, so that the second electrode of the first transistor T1 formed later is connected to the first electrode plate 24 through the first via hole.

In an exemplary embodiment, the shape of the first initial signal line 31 and the second initial signal line 32 may be a line shape in which the main body part extends along the first direction X.

In an exemplary embodiment, the stopper 34 may be located between the scan signal line 21 and the first initial signal line 31. For example, the stopper 34 may have a polyline shape. For example, the stopper 34 may include a first electrode segment extending in a first direction X and a second electrode segment extending in a second direction Y. For example, an orthographic projection of the stopper 34 on the substrate overlaps at least partially with an orthographic projection of the subsequently formed data signal line 45 on the substrate, so that the stopper 34 can shield the influence of the data voltage jump on the key node, prevent the data voltage jump from affecting the potential of the key node of the pixel drive circuit, and improve the display effect. For example, an orthographic projection of the stopper 34 on the substrate overlaps at least partially with an orthographic projection of the second region 11-2 of the first active layer 11 (also the first region 12-1 of the second active layer 12 and the second gate signal portion SL2) on the substrate, so that the stopper 34 can shield the second gate signal portion SL2, thereby shielding the influence of voltage jump on key nodes, preventing voltage jump from affecting the potential of key nodes of the pixel drive circuit, and improving the display effect. For example, the second electrode section of the left stopper 34 may extend to the left pixel drive circuit (not shown in the figure) to block the conductive connection portion of the second transistor T2, and the first electrode section of the right stopper 34 may extend to the left pixel drive circuit in the figure to block the conductive connection portion of the second transistor T2. Of course, in other embodiments, the stopper 34 may not be provided or an orthographic projection of the stopper 34 on the substrate does not overlap an orthographic projection of the second gate signal line SL2 on the substrate.

(5) A Pattern of a Fourth Insulating Layer is Formed

Figure 17:
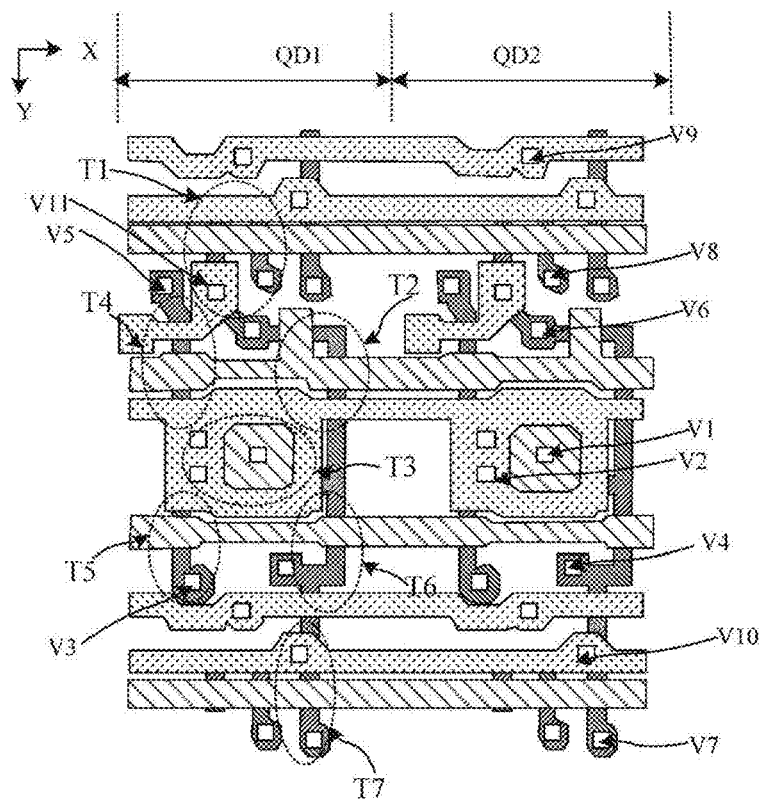
FIG. 17 is a schematic diagram of an embodiment of the present disclosure after a fourth insulating layer is formed.

In an exemplary embodiment, forming a pattern of a fourth insulating layer may include: depositing a fourth insulating thin film on the substrate on which the aforementioned patterns are formed, and patterning the fourth insulating thin film by a patterning process, to form a fourth insulating layer covering the second conductive layer, wherein multiple via holes are provided on the fourth insulating layer, as shown in FIG. 17.

In an exemplary embodiment, the fourth insulating layer may be referred to as an interlayer dielectric (ILD) layer.

In an exemplary embodiment, as shown in FIG. 17, the multiple via holes may include: a first via hole V1, a second via hole V2, a third via hole V3, a fourth via hole V4, a fifth via hole V5, a sixth via hole V6, a seventh via hole V7, an eighth via hole V8, a ninth via hole V9, a tenth via hole V10 and an eleventh via hole V11.

In an exemplary embodiment, an orthographic projection of the first via hole V1 on the substrate is within a range of an orthographic projection of the opening 36 of the second electrode plate 33 on the substrate, the fourth insulating layer and the third insulating layer within the first via hole V1 are etched away to expose a surface of the first electrode plate 24, and the first via hole V1 is configured such that the second electrode of the first transistor T1 to be formed subsequently is connected to the first electrode plate 24 through the via hole V1.

In an exemplary embodiment, an orthographic projection of the second via hole V2 on the substrate is within a range of an orthographic projection of the second electrode plate 33 on the substrate, the fourth insulating layer within the second via hole V2 is etched away to expose a surface of the second electrode plate 33, and the second via hole V2 is configured such that a first electrode of the fifth transistor T5 to be formed subsequently is connected to the second electrode plate 33 through the via hole V2.

In an exemplary embodiment, an orthographic projection of the third via hole V3 on the substrate is within a range of an orthographic projection of the first region of the fifth active layer 55 on the substrate. The fourth insulating layer, the third insulating layer and the second insulating layer in the third via hole V3 are etched away to expose a surface of the first region of the fifth active layer 55, and the third via hole V3 is configured such that a first electrode of the fifth transistor T5 formed subsequently is connected with the first region of the fifth active layer 55 through the via hole V3.

In an exemplary embodiment, an orthographic projection of the fourth via hole V4 on the substrate is within the range of an orthographic projection of the second region of the sixth active layer 66 on the substrate, the fourth insulating layer, the third insulating layer and the second insulating layer in the fourth via hole V4 are etched away, exposing the surface of the second region of the sixth active layer 16 (also the second region of the seventh active layer). The fourth via hole V4 is configured to connect the second electrode of the subsequently formed sixth transistor T6 (also the second electrode of the seventh transistor T7) to the second region of the sixth active layer 16 through the via hole.

In an exemplary embodiment, an orthographic projection of the fifth via hole V5 on the substrate is within a range of an orthographic projection of the first region of the fourth active layer 14 on the substrate. The fourth insulating layer, the third insulating layer and the second insulating layer in the fifth via hole V5 are etched away to expose a surface of the first region of the fourth active layer 14, and the fifth via hole V5 is configured such that a first electrode of the forth transistor T4 formed subsequently is connected with the first region of the fourth active layer 14 through the via hole V5.

In an exemplary embodiment, an orthographic projection of the sixth via hole V6 on the substrate is located within the range of an orthographic projection of the second region of the first active layer 11 on the substrate, the fourth insulating layer, the third insulating layer, and the second insulating layer within the sixth via hole V6 are etched away to expose the surface of the second region of the first active layer 11 (also the first region of the second active layer 12), and the sixth via hole V6 is configured such that the second electrode of the subsequently formed first transistor T1 (and also the first electrode of the second transistor T2) is connected to the second region of the first active layer 11 through this via hole.

In an exemplary embodiment, an orthographic projection of the seventh via hole V7 on the substrate is located within a range of an orthographic projection of the first region of the seventh active layer 17 on the substrate. The fourth insulating layer, the third insulating layer and the second insulating layer in the seventh via hole V7 is etched away to expose a surface of the first region of the seventh active layer 17. The seventh via hole V7 is configured to connect the first electrode of the subsequently formed seventh transistor T7 to the first region of the seventh active layer through the via hole.

In an exemplary embodiment, an orthographic projection of the eighth via hole V8 on the substrate is within the range of an orthographic projection of the first region of the first active layer 11 on the substrate. The fourth insulating layer, the third insulating layer, and the second insulating layer in the eighth via hole V8 are etched away, exposing the surface of the first region of the first active layer 11. The eighth via hole V8 is configured to connect the first electrode of the subsequently formed first transistor T1 to the first region of the first active layer 11 through the via hole.

In an exemplary embodiment, an orthographic projection of the ninth via hole V9 on the substrate is within the range of an orthographic projection of the first initial signal line 31 on the substrate. The fourth insulating layer in the ninth via hole V9 is etched away, exposing the surface of the first initial signal line 31, The ninth via hole V9 is configured to connect the first electrode of the subsequently formed first transistor T1 to the first initial signal line 31 through the via hole.

In an exemplary embodiment, an orthographic projection of the tenth via hole V10 on the substrate is within the range of an orthographic projection of the second initial signal line 32 on the substrate. The fourth insulating layer in the tenth via hole V10 is etched away, exposing the surface of the second initial signal line 32. The tenth via hole V10 is configured to connect the first electrode of the subsequently formed seventh transistor T7 to the second initial signal line 32 through the via hole.

In an exemplary embodiment, an orthographic projection of the eleventh via hole V11 on the substrate is within the range of an orthographic projection of the stopper 34 on the substrate. the fourth insulating layer in the eleventh via hole V11 is etched away, exposing the surface of the stopper 34.

The eleventh via hole V11 is configured to connect the subsequently formed first power supply line to the stopper 34 through the via hole.

In an exemplary embodiment, the pattern of the via holes of the second pixel drive circuit QD2 or the invalid pixel drive circuit may be substantially the same as the pattern of the via hole of the first pixel drive circuit QD1.

(6) A Pattern of a Third Conductive Layer is Formed

Figure 18A:
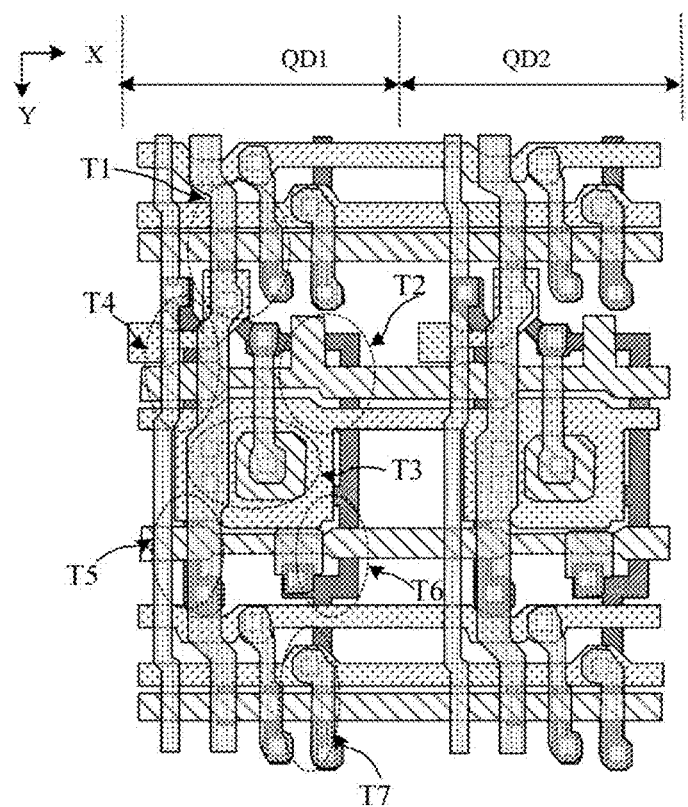
FIG. 18A is a schematic diagram of an embodiment of the present disclosure after a third conductive layer is formed.
Figure 18B:
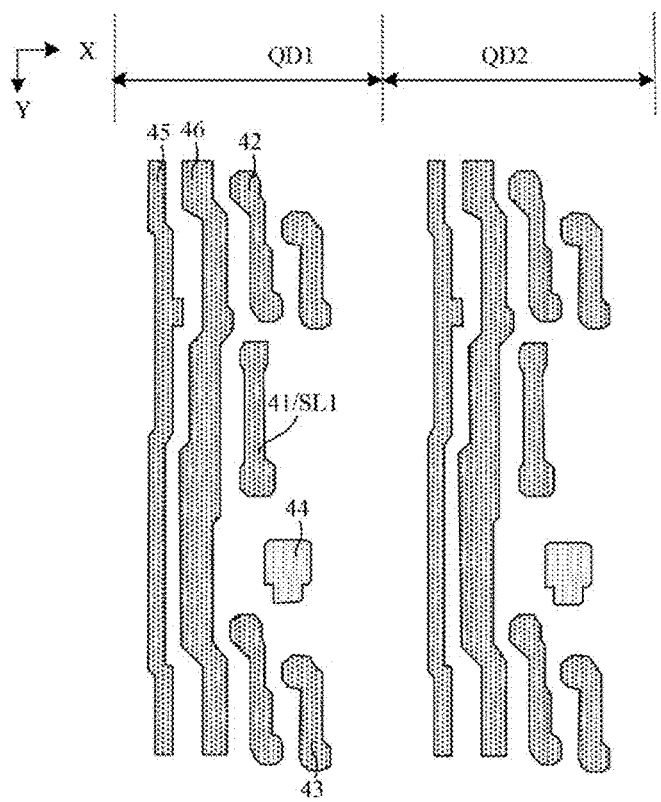
FIG. 18B is a schematic planar diagram of a third conductive layer in FIG. 18A.

In an exemplary embodiment, forming the third conductive layer may include: depositing a third conductive thin film on the substrate on which the aforementioned patterns are formed, and patterning the third conductive thin film through a patterning process to form the third conductive layer disposed on the fourth insulating layer, as shown in FIG. 18A and FIG. 18B, and FIG. 18B is a planar schematic diagram of the third conductive layer in FIG. 18A.

In an exemplary embodiment, the third conductive layer may be referred to as a first source-drain metal layer (SD1).

In an exemplary embodiment, the third conductive layer of the second display region AA2 may include a first connection electrode 41, a second connection electrode 42, a third connection electrode 43, a fourth connection electrode 44, a data signal line 45, and a first power supply line 46.

In an exemplary embodiment, the shape of the first connection electrode 41 may be a strip shape in which the main body portion extends along the second direction Y. In an exemplary embodiment, the first connection electrode 41 can be used as the first gate signal line SL1, and the first gate signal line SL1 is connected to the gate electrode of the third transistor T3. In an exemplary embodiment, the first connection electrode 41 may simultaneously serve as the first gate signal line SL1, the second electrode of the first transistor T1, and the first electrode of the second transistor T2. The first terminal of the first connection electrode 41 is connected to the first electrode plate 24 (also the gate electrode of the third transistor T3) through the first via hole V1 and the opening 36 so that the first gate signal line SL1 and the gate electrode of the third transistor T3 are connected. The second terminal of the first connection electrode 41 is connected to the second region of the first active layer (also the first region of the second active layer) through a sixth via hole V6, so that the second electrode of the first transistor T1 of the first electrode plate 24 (also the gate electrode of the third transistor T3) and the first electrode of the second transistor T2 have the same potential, so that the second electrode of the first transistor T1, the first electrode of the second transistor T2 and the gate electrode of the third transistor T3 are connected, and the second gate signal line SL2 is connected to the first gate signal line SL1.

For example, the materials of the first gate signal line SL1 and the second gate signal line SL2 are different. For example, the material of the first gate signal line SL1 may include a metal and the material of the second gate signal line SL2 may include a conductive material formed by conducting a semiconductor material.

For example, the first gate signal line SL1, the second gate signal line SL2 and the gate electrode of the third transistor T3 are connected to form a first node N1 (also referred to as a gate signal portion). The potential at the first node N1 is the same. Of course, in other embodiments, the second gate signal line SL2 may not be provided in which case the gate electrode of the third transistor T3 and the first gate signal line SL1 constitute the first node N1. For example, the second gate signal line SL2 may be a second electrode of the first transistor T1 or may be a first electrode of the second transistor T2.

In an exemplary embodiment, the shape of the second connection electrode 42 may be a strip shape in which the main body portion extends along the second direction Y. The first terminal of the second connection electrode 42 is connected to the first region of the first active layer 11 through an eighth via hole V8, and the second terminal of the second connection electrode 42 is connected to the first initial signal line 31 through a ninth via hole V9. In an exemplary embodiment, the second connection electrode 42 may serve as the first electrode of the first transistor T1, enabling the first initial signal line 31 to write the first initial signal to the first transistor T1.

In an exemplary embodiment, the shape of the third connection electrode 43 may be a strip shape with a main body portion extending along the second direction Y, the first terminal of the third connection electrode 43 is connected to the first region of the seventh active layer 17 through the seventh via hole V7, and the second terminal of the third connection electrode 43 is connected to the second initial signal line 32 through the tenth via hole V10. In an exemplary embodiment, the third connection electrode 43 may serve as the first electrode of the seventh transistor T7, enabling the second initial signal line 32 to write the second initial signal to the seventh transistor T7.

In an exemplary embodiment, the fourth connection electrode 44 may have a rectangular shape and is connected to a second region of the sixth active layer 16 (also a second region of the seventh active layer 17) through a fourth via hole V4 so that the second region of the sixth active layer 16 and the second region of the seventh active layer 17 have the same potential. For example, the fourth connection electrode 44 may be used as the second electrode of the sixth transistor T6 (or the second electrode of the seventh transistor T7), and the fourth connection electrode 44 is configured to be connected to a subsequently formed anode electrode.

In an exemplary embodiment, the shape of the data signal line 45 may be a line shape in which the main body portion extends along the second direction Y. The data signal line 45 is connected to the first region of the fourth active layer 14 through the fifth via hole V5, so that the data signal line 45 can serve as the first electrode of the fourth transistor T4, enabling the data signal line 45 to write a data signal to the first electrode of the fourth transistor T4. For example, an orthographic projection of the data signal line 45 on the substrate overlaps with an orthographic projection of the stopper 34 on the substrate.

In an exemplary embodiment, the shape of the first power supply line 46 may be a line shape in which the main body portion extends along the second direction Y. The first power supply line 46 is connected to the first region of the fifth active layer 15 through the third via hole V3, and the first power supply line 46 is connected to the second electrode plate 33 through the second via hole V2. Thus, since the first power supply line 46 is connected to the second electrode plate 33 and the first region of the fifth active layer 15 at the same time, it is achieved that the first power supply line 46 writes the first power signal to the first electrode of the fifth transistor T5 and makes the second electrode plate 33 and the first region of the fifth active layer have the same potential. For example, the first power supply line 46 may serve as the first electrode of the fifth transistor T5. An orthographic projection of the first power supply line 46 on the substrate overlaps an orthographic projection of the stopper 34 on the substrate, and the first power supply line 46 is connected to the stopper 34 through the eleventh via hole V11. Thus, since the first power supply line 46 is configured to supply a constant voltage to the pixel drive circuit, the voltage on the stopper 34 may be stabilized and a shielding effect may be played.

In an exemplary embodiment, the first power supply line 46 may have an unequal width design, and the first power supply line 46 with the unequal width design may not only facilitate a layout of the pixel structure, moreover, the parasitic capacitance generated by the first power supply line can be reduced.

In an exemplary embodiment, the third conductive layer may be made of a metal material. For example, the metal material may include, but is not limited to: any one or more of silver (Ag), copper (Cu), aluminum (Al), and molybdenum (Mo), or an alloy material of the metals listed above, such as aluminum-neodymium alloy (AlNd) or molybdenum-niobium alloy (MoNb), etc. The third conductive layer may be a single-layer structure, or a multi-layer composite structure such as Mo/Cu/Mo or the like.

(7) A Pattern of a Fourth Conductive Layer is Formed

Figure 19:
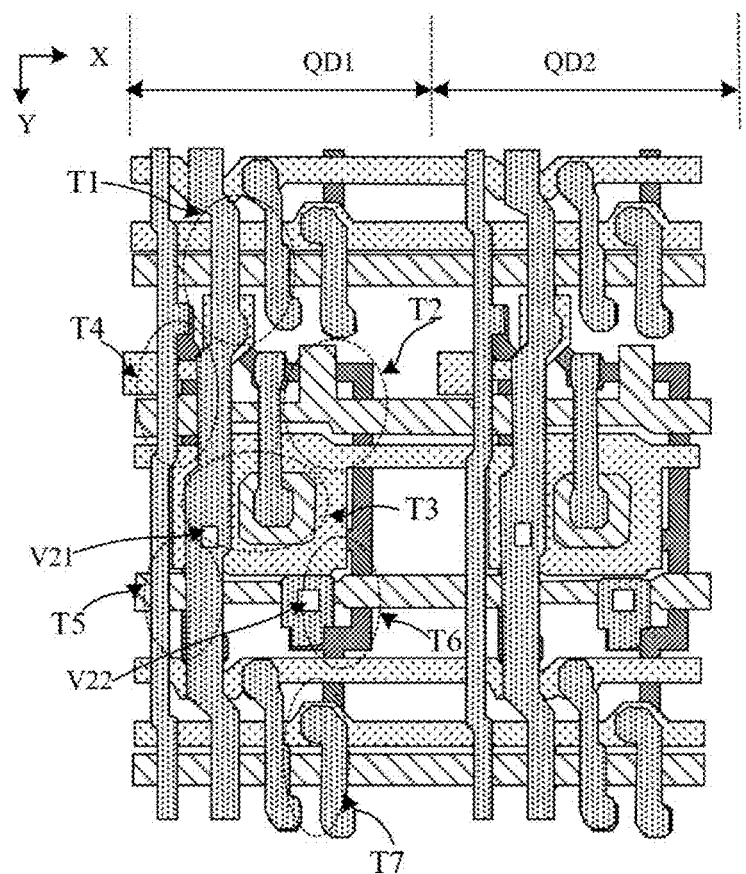
FIG. 19 is a schematic diagram of an embodiment of the present disclosure after a fifth insulating layer is formed.
Figure 20A:
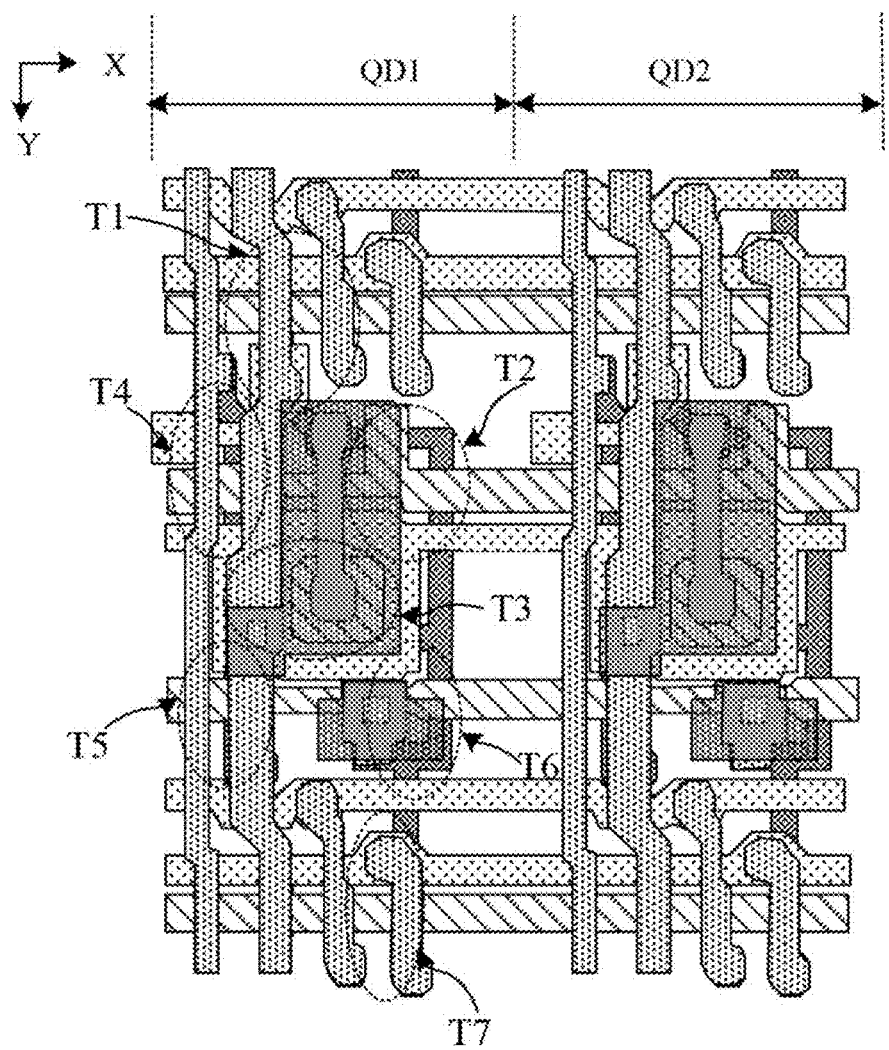
FIG. 20A is a schematic diagram of an embodiment of the present disclosure after a fourth conductive layer is formed.
Figure 20B:
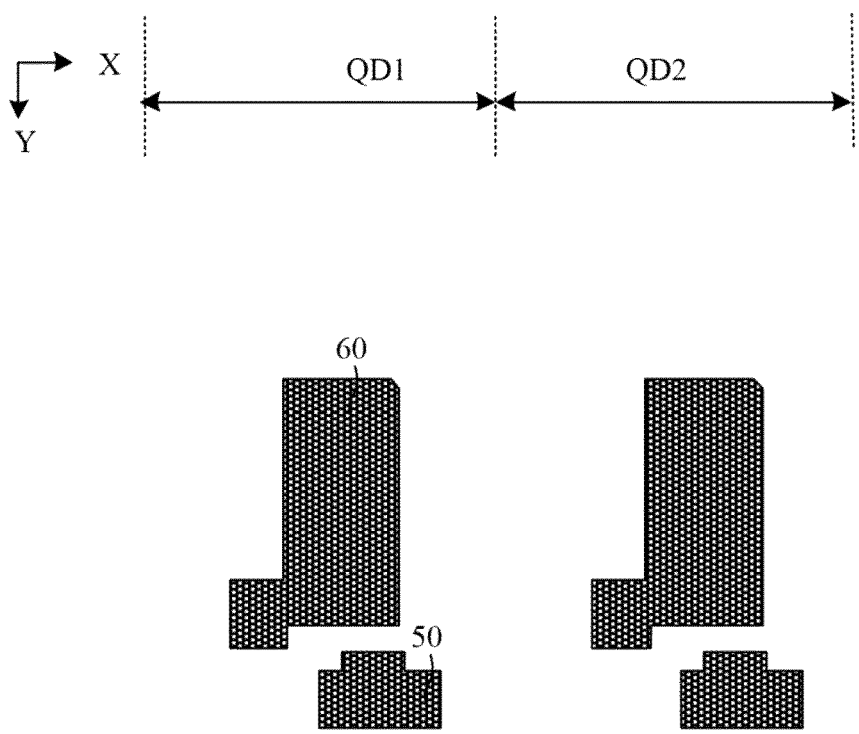
FIG. 20B is a schematic planar view of the fourth conductive layer in FIG. 20A.

In an exemplary embodiment, forming a pattern of a fourth conductive layer may include depositing a fifth insulating thin film and a fourth conductive thin film on a substrate on which the pattern is formed, patterning the fourth conductive thin film using a patterning process to form a fifth insulating layer covering the third conductive layer, as shown in FIG. 19, forming a fourth conductive layer disposed on the fifth insulating layer, as shown in FIG. 20A and FIG. 20B, FIG. 20B is a schematic planar view of the fourth conductive layer in FIG. 20A.

In an exemplary embodiment, the fifth insulating layer may include multiple via holes, and the multiple via holes may include a twenty-first via hole V21 and a twenty-second via hole V22. For example, an orthographic projection of the twenty-first via hole V21 on the substrate overlaps an orthographic projection of the first power supply line 46 on the substrate and is configured to expose the surface of the first power supply line 46. For example, an orthographic projection of the twenty-second via hole V22 on the substrate overlaps an orthographic projection of the fourth connection electrode 44 on the substrate and is configured to expose the surface of the fourth connection electrode 44.

In an exemplary embodiment, the fourth conductive layer may be referred to as a second source-drain metal layer (SD2).

In an exemplary embodiment, the fourth conductive layer of the second display region AA2 may at least include a shield electrode 60 and a fifth connection electrode 50.

In an exemplary embodiment, an orthographic projection of the shield electrode 60 on the substrate overlaps an orthographic projection of the first gate signal line SL1 on the substrate, a shield block 60-1 is provided on one side of the shield electrode 60 in the first direction X, an orthographic projection of the shield block 60-1 on the substrate overlaps at least partially an orthographic projection of the first power supply line 46 on the substrate, the shield block 60-1 is connected to the first power supply line 46 through a second via hole V21, the shield block 60-1 is configured to connect the shield electrode 60 to the first power supply line 46 through the twenty-second via hole V21, the first power supply line 46 is configured to provide a constant voltage to the pixel drive circuit, so that the voltage on the shield electrode 60 is stable and shielding may be performed. Since the light emitting signal of the anode is led out through the conductive line L in the first display region AA1, the shield electrode 60 can avoid the influence of the conductive line L on a key node (such as the first node N1) and improve the display effect. For example, an orthographic projection of the first gate signal line SL1 on the substrate completely falls within the boundary range of an orthographic projection of the shield electrode 60 on the substrate, so that the shield electrode 60 can play a better shielding role. For example, in order to reduce display defect (mura) and improve display effect, the distance between an orthographic projection of the first gate signal line SL1 on the substrate and the boundary of an orthographic projection of the shield electrode 60 on the substrate is greater than or equal to 1.75 mum. Since the area of the region occupied by the pixel unit is limited, the distance of the shield electrode 60 beyond the first gate signal line SL1 may be limited. For example, in some embodiments, in order to obtain a better shielding effect, the distance between an orthographic projection of the first gate signal line SL1 on the substrate and the boundary of an orthographic projection of the shield electrode SE on the substrate is greater than or equal to 2.33 mum.

In an exemplary embodiment, in a case where the display panel includes the second gate signal line SL2, the second gate signal line SL2 is connected to the first gate signal line SL1 to form the first node N1, so that an orthographic projection of the shield electrode 60 on the substrate and an orthographic projection of the second gate signal line SL2 on the substrate overlap.

In an exemplary embodiment, an orthographic projection of the shield electrode 60 on the substrate overlaps at least partially with an orthographic projection of the first electrode plate 24 (also the gate electrode of the third transistor T3) on the substrate, an orthographic projection of the first gate signal line SL1 (also the second electrode of the first transistor T1 and the first electrode of the second transistor T2) on the substrate, and an orthographic projection of the second gate signal line SL2 (also the second region of the first active layer 11, the first region of the second active layer 12) on the substrate.

In an exemplary embodiment, an orthographic projection of the shield electrode 60 on the substrate partially overlaps an orthographic projection of the second gate signal line SL2 on the substrate, and an orthographic projection of the stopper 34 on the substrate partially overlaps an orthographic projection of the second gate signal line SL2 on the substrate. Thus, in the display panel shown in FIG. 20A, the shield electrode 60 and the stopper 34 form a double-layer shield on the second gate signal line SL2.

In an exemplary embodiment, an orthographic projection of the shield electrode 60 on the substrate partially overlaps of an orthographic projection of the stopper 34 on the substrate.

In an exemplary embodiment, an orthographic projection of the shield electrode 60 on the substrate partially overlaps an orthographic projection of the first gate signal line SL1 on the substrate, and an orthographic projection of the stopper 34 on the substrate partially overlaps an orthographic projection of the second gate signal line SL2 on the substrate, so that the shield electrode 60 and the shield electrode SE and the stopper 34 together function as shielding for the first node N1.

Of course, in other embodiments, the stopper 34 may not be provided, or an orthographic projection of the stopper 34 on the substrate and an orthographic projection of the second gate signal line SL2 on the substrate may not overlap.

In an exemplary embodiment, the shape of the shield electrode 60 may be a regular shape, for example, the shape of the shield electrode 60 may be a rectangular shape. Thus, by setting the shield electrode 60 in a regular shape, it is possible to make the width of the shield electrode 60 uniform at different positions, so that the line width of the transparent line passing over the shield electrode 60 is uniform, and the influence on the line width of the transparent line may be reduced. Furthermore, it is beneficial to improve the problem of uneven brightness.

In an exemplary embodiment, the shape of the fifth connection electrode 50 may be a rectangular shape. An orthographic projection of the fifth connection electrode on the substrate overlaps at least partially an orthographic projection of the fourth connection electrode 44 on the substrate. The fifth connection electrode 50 may serve as an anode connection electrode. The fifth connection electrode 50 is connected to the fourth connection electrode 44 through the second via hole V22 and is configured to be connected to the anode electrode formed subsequently.

In an exemplary embodiment, in a plane perpendicular to the display panel, the circuit structure layer of the second display region AA2 may include a substrate and a first insulating layer, a semiconductor layer, a second insulating layer, a first conductive layer, a third insulating layer, a second conductive layer, a fourth insulating layer, a third conductive layer, a fifth insulating layer, and a fourth conductive layer that are sequentially stacked on the substrate. The semiconductor layer may include active layers of multiple transistors in a first pixel drive circuit QD1 and a second pixel drive circuit QD2, the first conductive layer may include gate electrodes of multiple transistors, a first electrode plate of a storage capacitor, a scan signal line, a first reset control line, a light emitting control line and a second reset control line. The second conductive layer may include a second electrode plate of a storage capacitor, an electrode plate connection line, a stopper, a first initial signal line and a second initial signal line. The third conductive layer may include first and second electrodes of multiple transistors, a data signal line, and a first power supply line. The fourth conductive layer may include an anode connection electrode and a shield electrode. That is, the circuit structure layer of the second display region AA2 may include a first pixel drive circuit QD1 and a second pixel drive circuit QD2.

In an exemplary embodiment, in a plane perpendicular to the display panel, the light transmitting region of the first display region AA1 may include a substrate and a first insulating layer, a second insulating layer, a third insulating layer, a fourth insulating layer, and a fifth insulating layer stacked on the substrate in order. The non-light transmitting region of the first display region AA1 may include a substrate and a first insulating layer, a second insulating layer, a third insulating layer, a fourth insulating layer, and a fifth insulating layer stacked on the substrate in order. That is, the circuit structure layer of the first display region AA1 is not provided with a pixel drive circuit.

In an exemplary embodiment, the first conductive layer, the second conductive layer, the third conductive layer and the fourth conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc.

In an exemplary embodiment, the first insulating layer, the second insulating layer, the third insulating layer, the fourth insulating layer and the fifth insulating layer may be made of any one or more of silicon oxide (SiOx), silicon nitride (SiNx) and silicon oxynitride (SiON), and may be a single layer, multiple layers or a composite layer.

So far, the circuit structure layer is prepared on the substrate.

(8) A First Transparent Conductive Layer is Formed

Figure 21A:
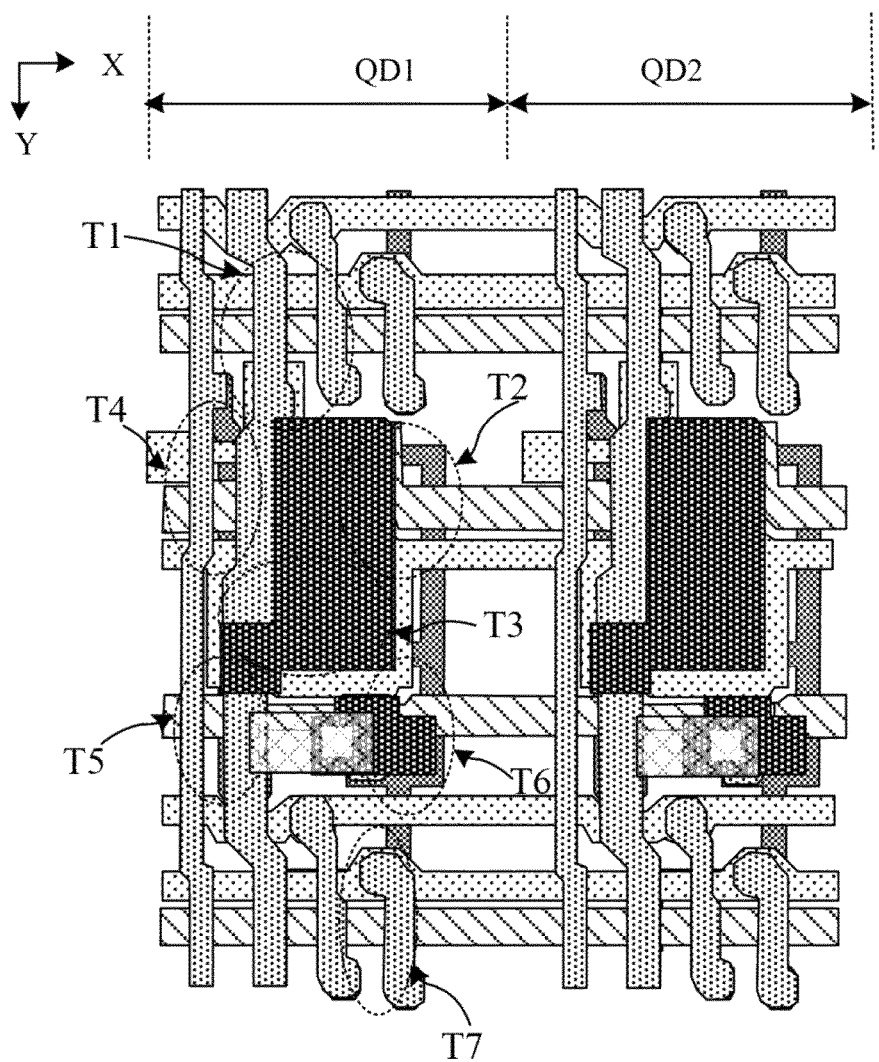
FIG. 21A is a schematic diagram of an embodiment of the present disclosure after a first transparent conductive layer is formed.
Figure 21B:
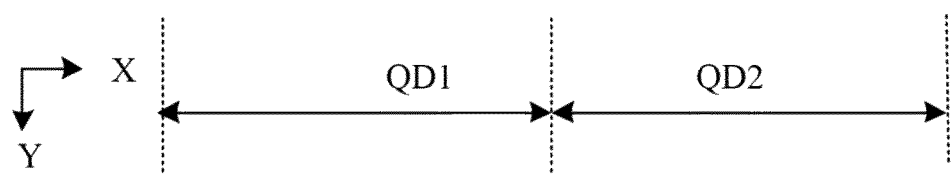
FIG. 21B is a schematic planar view of a first transparent conductive layer in FIG. 21A.
Figure 21B:

In an exemplary embodiment, a sixth insulating thin film and a first transparent conductive thin film are deposited on a substrate on which the foregoing pattern is formed, and the first transparent conductive thin film is patterned by a patterning process to form a sixth insulating layer covering the fourth conductive layer and a first transparent conductive layer disposed on the sixth insulating layer, as shown in FIGS. 21A and 21B.

In an exemplary embodiment, the first transparent conductive layer may include a sixth connection electrode 61.

In an exemplary embodiment, the shape of the sixth connection electrode 61 may be a rectangular shape. An orthographic projection of the sixth connection electrode 61 on the substrate at least partially overlaps with an orthographic projection of the fifth connection electrode 50 on the substrate. When the first light emitting device is electrically connected to the first pixel drive circuit QD1 of the transition display region AAG through the first transparent conductive line L1 located in the first transparent conductive layer, the sixth connection electrode 61 may serve as a transfer electrode of the first light emitting device. The sixth connection electrode 61 is connected to the fifth connection electrode 50 through a via hole of the sixth insulating layer and is configured to be connected to the anode electrode formed subsequently.

In an exemplary embodiment, the first transparent conductive layer may further include a first transparent conductive line L1. For example, one terminal of the first transparent conductive line L1 may be connected to a sixth connection electrode 61 located in the first display region AA1, and the other terminal of the first transparent conductive line L1 may be connected to a sixth connection electrode 61 in the first pixel drive circuit QD1 located in the transition display region AAG in the second display region AA2, so that the anode electrode formed subsequently may be connected to the first pixel drive circuit QD1 in the transition display region AAG.

(9) A Second Transparent Conductive Layer is Formed

Figure 22A:
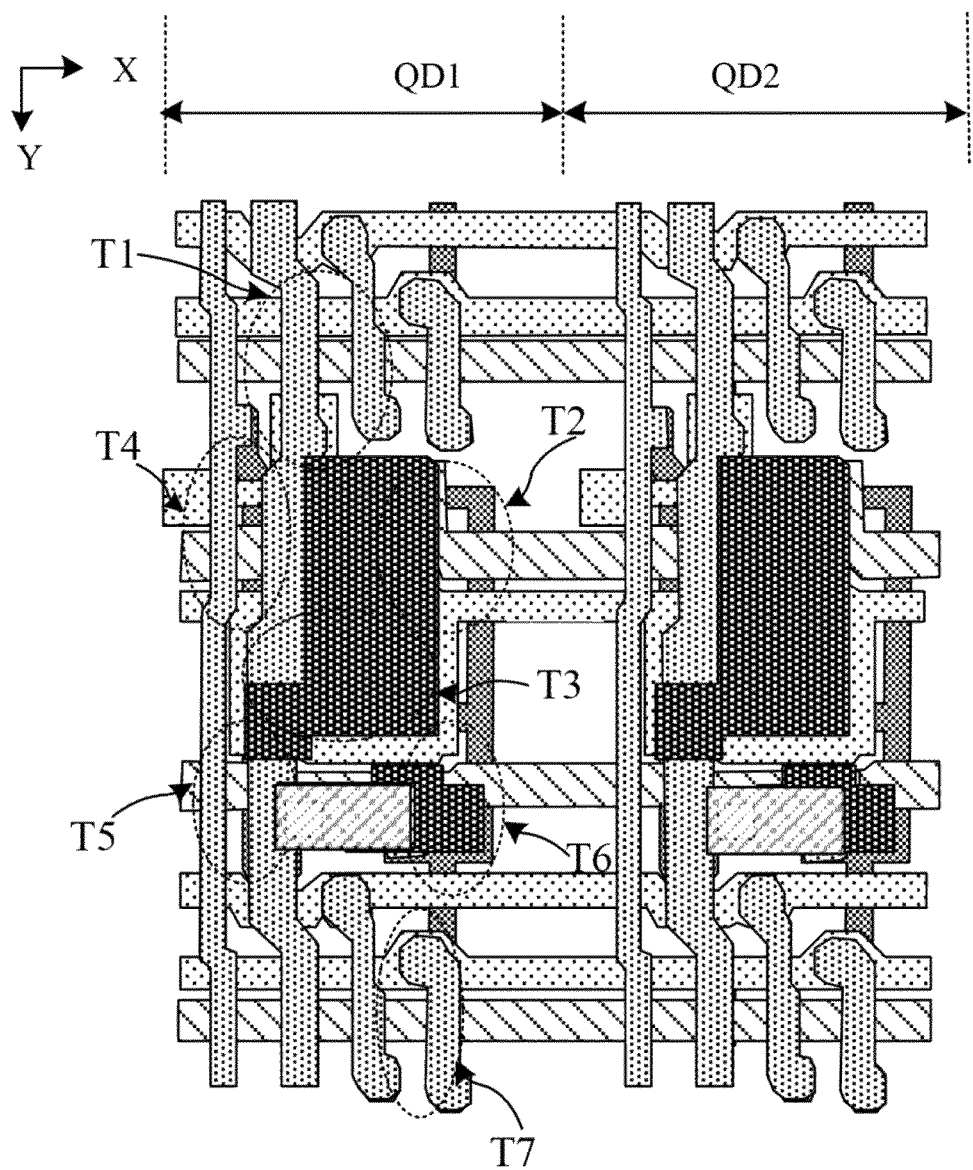
FIG. 22A is a schematic diagram of an embodiment of the present disclosure after a second transparent conductive layer is formed.
Figure 22B:
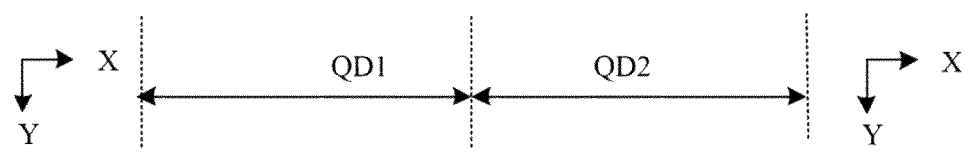
FIG. 22B is a schematic planar view of a second transparent conductive layer in FIG. 22A.
Figure 22B:

In an exemplary embodiment, a first planarization thin film is coated on a substrate on which the pattern is formed, and a first planarization layer is formed by a patterning process. Subsequently, a second transparent conductive thin film is deposited and patterned through a patterning process to form a second transparent conductive layer disposed on the first planarization layer, as shown in FIGS. 22A and 22B.

In an exemplary embodiment, the second transparent conductive layer may include a seventh connection electrode 71.

In an exemplary embodiment, the shape of the seventh connection electrode 71 may be a rectangular shape. An orthographic projection of the seventh connection electrode 71 on the substrate at least partially overlaps with an orthographic projection of the sixth connection electrode 61 on the substrate. When the first light emitting device is electrically connected to the first pixel drive circuit QD1 of the transition display region AAG through the second transparent conductive line L2 located in the second transparent conductive layer, the seventh connection electrode 71 may serve as a transfer electrode of the first light emitting device. The seventh connection electrode 71 is connected to the sixth connection electrode 61 through a via hole of the first flat layer and is configured to be connected to the anode electrode formed subsequently.

In an exemplary embodiment, the second transparent conductive layer may further include a second transparent conductive line L2. For example, one terminal of the second transparent conductive line L2 may be connected to a seventh connection electrode 71 located in the first display region AA1, and the other terminal of the second transparent conductive line L2 may be connected to a seventh connection electrode 71 in the first pixel drive circuit QD1 located in the transition display region AAG in the second display region AA2, so that the anode electrode formed subsequently may be connected to the first pixel drive circuit QD1 in the transition display region AAG.

(10) A Third Transparent Conductive Layer is Formed

Figure 23A:
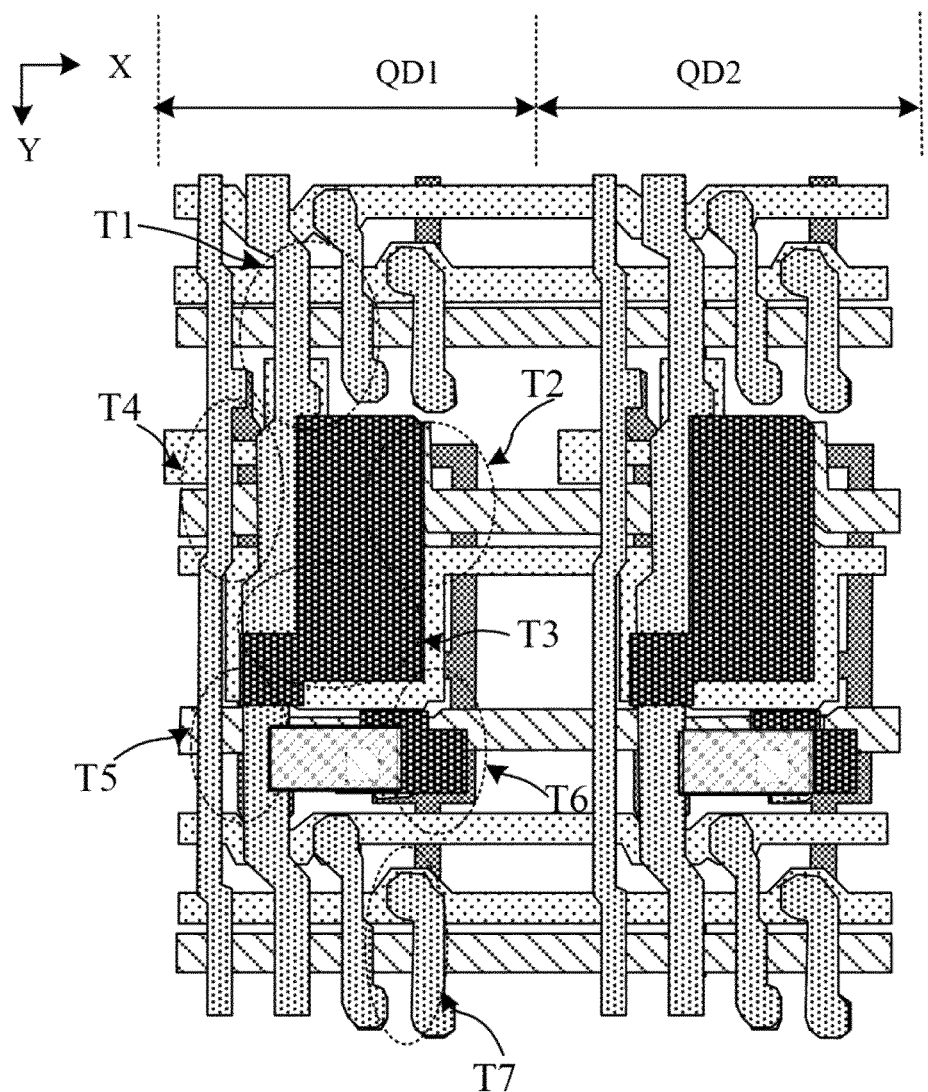
FIG. 23A is a schematic diagram of an embodiment of the present disclosure after a third transparent conductive layer is formed.
Figure 23B:
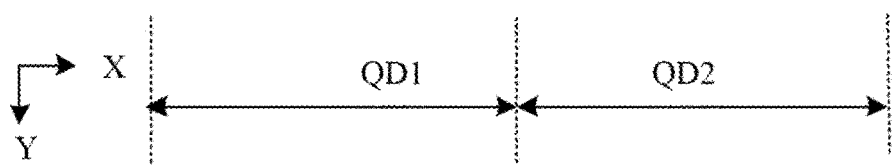
FIG. 23B is a schematic planar view of a third transparent conductive layer in FIG. 23A.
Figure 23B:

In an exemplary embodiment, a second planarization thin film is coated on a substrate on which the pattern is formed, and a second planarization layer is formed by a patterning process. Subsequently, a third transparent conductive thin film is deposited and patterned through a patterning process to form a third transparent conductive layer disposed on the second planarization layer, as shown in FIGS. 23A and 23B.

In an exemplary embodiment, the third transparent conductive layer may include an eighth connection electrode 81.

In an exemplary embodiment, the shape of the eighth connection electrode 81 may be a rectangular shape. An orthographic projection of the eighth connection electrode 81 on the substrate at least partially overlaps with an orthographic projection of the seventh connection electrode 71 on the substrate. When the first light emitting device is electrically connected to the first pixel drive circuit QD1 located in the transition display region AAG in the second display region AA2 through the third transparent conductive line L3 located in the third transparent conductive layer, the eighth connection electrode 81 may serve as a transfer electrode of the first light emitting device. The eighth connection electrode 81 is connected to the seventh connection electrode 71 through a via hole of the second planarization layer and is configured to be connected to the anode electrode formed subsequently.

In an exemplary embodiment, the third transparent conductive layer may further include a third transparent conductive line L3. For example, one terminal of the third transparent conductive line L3 may be connected to an eighth connection electrode 81 located in the first display region AA1, and the other terminal of the third transparent conductive line L3 may be connected to an eighth connection electrode 81 in the first pixel drive circuit QD1 located in the transition display region AAG in the second display region AA2, so that the anode electrode formed subsequently may be connected to the first pixel drive circuit QD1 in the transition display region AAG.

In an exemplary embodiment, the conductive line L may include one or more of a first transparent conductive line L1, a second transparent conductive line L2, and a third transparent conductive line L3. For example, an orthographic projection of the conductive line L1 on the substrate partially overlaps with an orthographic projection of the first pixel drive circuit QD1 on the substrate. For example, an orthographic projection of the conductive line L1 on the substrate partially overlaps with an orthographic projection of the first gate signal line SL1 in the first pixel drive circuit QD1 on the substrate. The shield electrode 60 is located between the conductive line L1 and the first gate signal line SL1. In the embodiment of the present disclosure, after the pixel drive circuit is formed, the shield electrode 60 is formed, and then the conductive line L1 (such as the first transparent conductive line L1, the second transparent conductive line L2 and the third transparent conductive line L3) is formed, and then the light emitting device is formed, so that the film layer where the shield electrode 60 is located is between the film layer where the conductive line L1 is located and the film layer where the first gate signal line SL1 is located, and the film layer where the shield electrode 60 is located is between the film layer where the conductive line L1 is located and the film layer where the gate electrode of the third transistor T3 is located.

(11) A Light Emitting Structure Layer is Formed

Figure 24A:
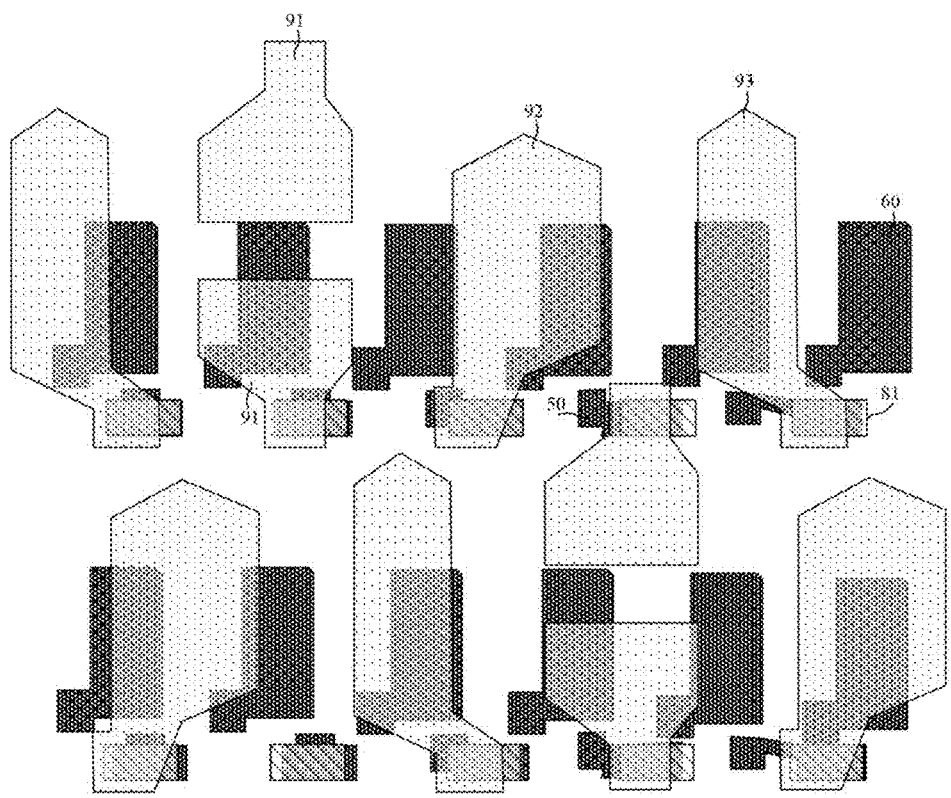
FIG. 24A is a first schematic diagram of an embodiment of the present disclosure after an anode layer is formed.
Figure 24B:
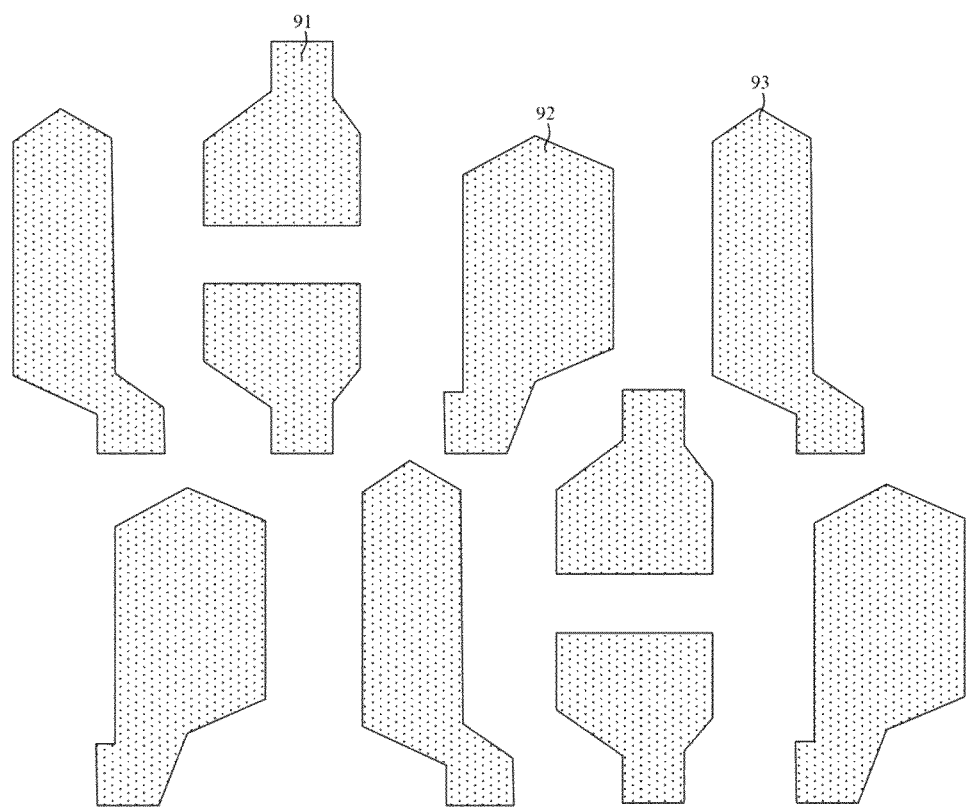
FIG. 24B is a schematic planar view of an anode layer of FIG. 23A.
Figure 24C:
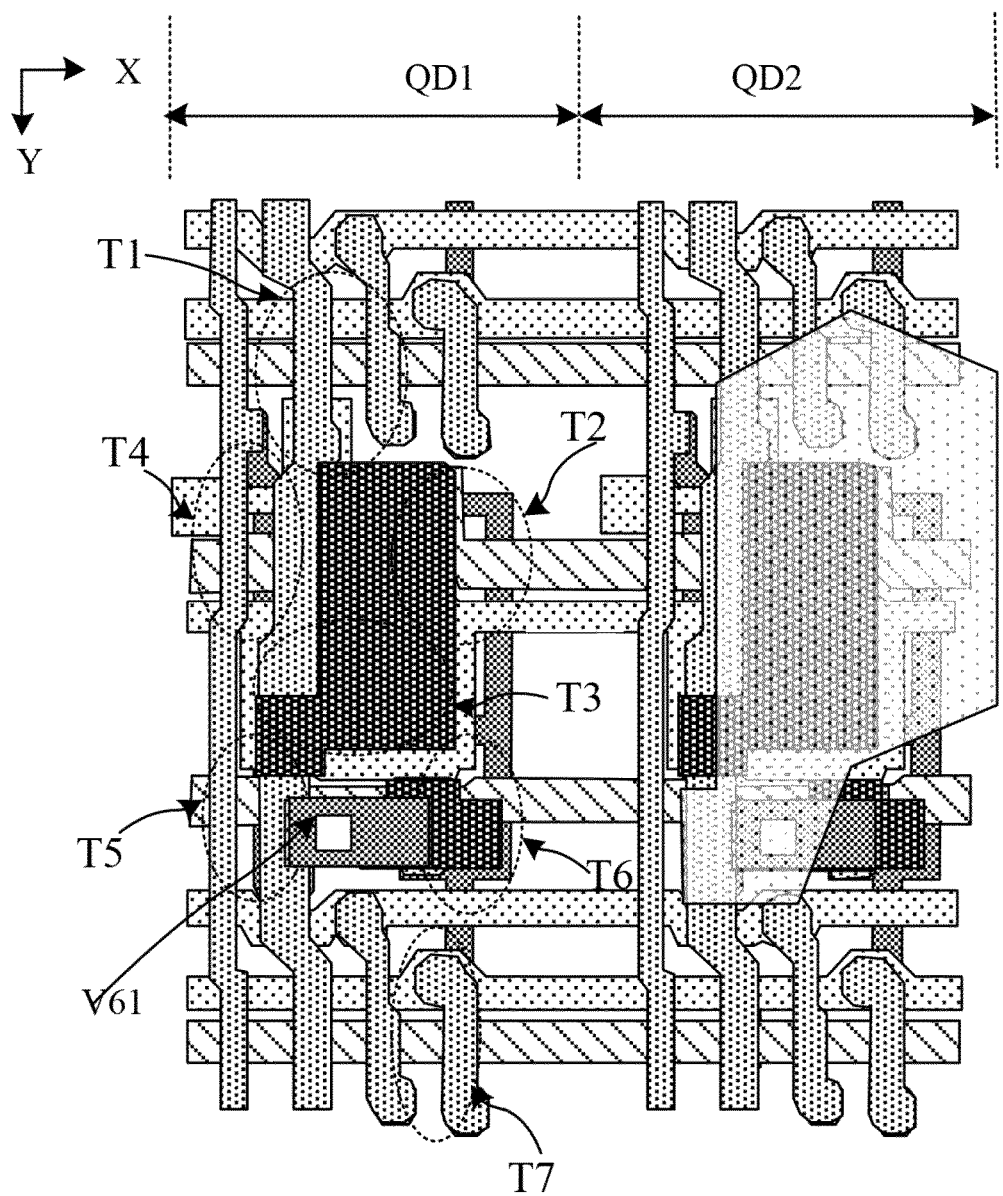
FIG. 24C is a second schematic diagram of an embodiment of the present disclosure after an anode layer is formed.
Figure 25:
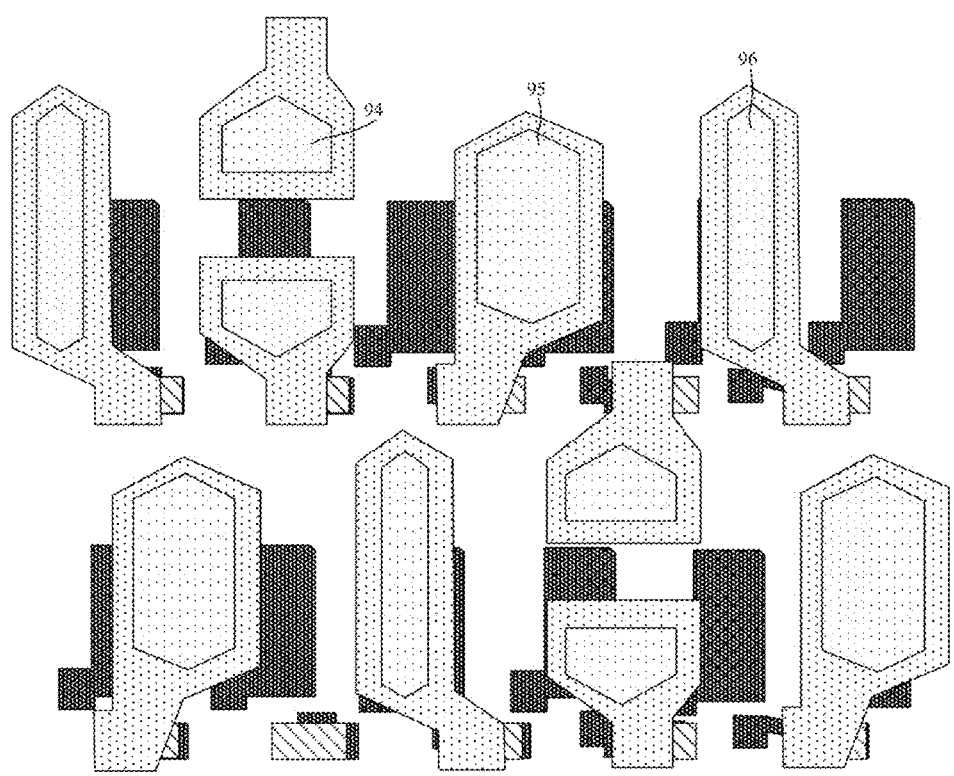
FIG. 25 is a schematic diagram after a pattern of a pixel define layer is formed according to an embodiment of the present disclosure.

In an exemplary embodiment, a third planarization thin film is coated on a substrate on which the pattern is formed, and a third planarization layer is formed by a patterning process. Subsequently, an anode conductive thin film is deposited, and the anode conductive thin film is patterned by a patterning process to form an anode layer disposed on the third planarization layer, as shown in FIGS. 24A and 24B. Subsequently, a pixel define thin film is coated on the substrate on which the aforementioned patterns are formed, and a pixel define layer (PDL) is formed by masking, exposure and development processes. The pixel define layer is formed with multiple pixel openings exposing the anode layer, and the pixel openings are configured to define a light emitting region of the pixel unit, as shown in FIG. 25. An organic light emitting layer is formed in the aforementioned pixel openings, and the organic light emitting layer is connected to an anode. Then, a cathode thin film is deposited and patterned through a patterning process to form a pattern of a cathode. The cathode is electrically connected to the organic light emitting layer and the second power supply line respectively. Then, an encapsulation layer is formed on the cathode. The encapsulation layer may include a stacked structure of an inorganic material/an organic material/an inorganic material. FIG. 24A, FIG. 24B and FIG. 25 are schematically illustrated with eight light emitting devices in the second display region AA2 and a second pixel drive circuit QD2 partially omitted as an example. FIG. 24C schematically illustrates the connection of the second anode of one second light emitting device in the second display region AA2 to the second pixel drive circuit QD2. The structure of the light emitting devices in the first display region AA1 may be substantially similar and will be understood by those skilled in the art with reference to the relevant description and the embodiments of the present disclosure, which will not be described in detail herein.

In an exemplary embodiment, the anode layer may include a first anode electrode 91, a second anode electrode 92, and a third anode electrode 93.

In an exemplary embodiment, the first anode electrode 91 may serve as an anode of the green light emitting device. An orthographic projection of the first anode electrode 91 on the substrate may partially overlap with an orthographic projection of the eighth connection electrode 81, the seventh connection electrode 71, the sixth connection electrode 61, and the fifth connection electrode 50 on the substrate.

In an exemplary embodiment, the second anode electrode 92 may serve as an anode of the red light emitting device. An orthographic projection of the second anode electrode 92 on the substrate may partially overlap with an orthographic projection of the eighth connection electrode 81, the seventh connection electrode 71, the sixth connection electrode 61, and the fifth connection electrode 50 on the substrate.

In an exemplary embodiment, the third anode electrode 93 may serve as an anode of the blue light emitting device. An orthographic projection of the third anode electrode 93 on the substrate may partially overlap with an orthographic projection of the eighth connection electrode 81, the seventh connection electrode 71, the sixth connection electrode 61, and the fifth connection electrode 50 on the substrate.

In an exemplary embodiment, the multiple pixel openings may include a first pixel opening 94, a second pixel opening 95 and a third pixel opening 96.

In an exemplary embodiment, the shape of the first pixel opening 94 may be pentagonal. An orthographic projection of the first pixel opening 94 on the substrate falls within the boundary of an orthographic projection of the first anode electrode 91 on the substrate.

In an exemplary embodiment, the shape of the second pixel opening 95 may be hexagonal. An orthographic projection of the second pixel opening 95 on the substrate falls within the boundary of an orthographic projection of the second anode electrode 92 on the substrate.

In an exemplary embodiment, the shape of the third pixel opening 96 may be hexagonal. An orthographic projection of the third pixel opening 96 on the substrate falls within the boundary of an orthographic projection of the third anode electrode 93 on the substrate.

In an exemplary embodiment, the first to third transparent conductive layers may be made of a transparent conductive material such as indium tin oxide (ITO). The sixth insulating layer, the first planarization layer to the third planarization layer may be made of organic materials such as polyimide, acrylic or polyethylene terephthalate. The pixel define layer may be made of an organic material, such as polyimide, acrylic, or polyethylene terephthalate. The anode layer may be made of a reflective material such as a metal, and the cathode may be made of a transparent conductive material. Here, no limitation is made thereto in embodiments of the present disclosure.

The structure and the manufacturing process of the display panel of this embodiment of the present disclosure are merely illustrative. In some exemplary embodiments, changes in corresponding structures and, addition or deletion of patterning processes may be made according to actual application scenarios. The preparation process of this exemplary embodiment may be implemented using a mature preparation device at present, and may be well compatible with an existing preparation process, simple in process implementation, easy to implement, high in a production efficiency, low in a production cost, and high in a yield.

In an exemplary embodiment, the display panel may include four or more transparent conductive layers. The transparent conductive lines electrically connecting the first type first light emitting devices and the second type first light emitting device in the first sub-region of the first display region may be located in two different transparent conductive layers, and at least one transparent conductive layer may be spaced between the two different transparent conductive layers.

In the display panel provided by the embodiment of the present disclosure, the uniformity of the conductive lines may be ensured by adjusting the routing mode of the transparent conductive lines electrically connected to the first type first light emitting device and the second type first light emitting device in the first display region, thereby improving the display uniformity of the first display region and improving the display effect of the first display region.

An embodiment of the present disclosure also provides a display apparatus. The display apparatus may include the display panel in one or more of the above exemplary embodiments.

In an exemplary embodiment, the display apparatus may further include a sensor located on a non-display side of the display panel, and an orthographic projection of the sensor on the display panel overlaps with a first display region of the display panel.

The display apparatus may be a product having a function for displaying an image (including a static image or a dynamic image, wherein the dynamic image may be a video).

In an exemplary embodiment, the display apparatus may include, but is not limited to, a mobile phone, a tablet computer, a television, a display, a laptop computer, a digital photo frame, a billboard, a laser printer with display function, a drawing screen, a Personal Digital Assistant (PDA), a digital camera, a portable camcorder, a viewfinder, a navigator, a vehicle, a large area wall, an information inquiry device (such as business inquiry device of e-government, bank, hospital, power and other departments), or any product or component with display function such as monitor. Here, no limitation is made thereto in embodiments of the present disclosure.

In an exemplary embodiment, the sensors may include, but are not limited to, a camera sensor, a fingerprint sensor, a light sensor, an infrared sensor, or an ultrasonic sensor or the like. Here, no limitation is made thereto in embodiments of the present disclosure.

The above descriptions of embodiments of the display apparatus are similar to the above descriptions of embodiments of the display panel, and the embodiments of the display apparatus have similar beneficial effects as the embodiments of the display panel. Technical details undisclosed in the embodiments of the display apparatus of the present disclosure may be understood by those skilled in the art with reference to the descriptions in the embodiments of the display panel of the present disclosure, which will not be repeated here.

Although implementations of the present disclosure are disclosed above, the above contents are only implementations for easily understanding the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display panel comprising: a substrate, a circuit structure layer and a light emitting structure layer stacked on the substrate, and a plurality of conductive layers disposed between the circuit structure layer and the light emitting structure layer; wherein the substrate comprises a first display region and a second display region, wherein the second display region is located on at least one side of the first display region, and the light transmittance rate of the first display region is greater than the light transmittance rate of the second display region;

the circuit structure layer comprises: a first gate signal line located in the second display region, a constant voltage line, a plurality of shield electrodes and a plurality of pixel circuits, wherein the pixel circuit comprises a drive transistor, the drive transistor comprises a gate, and the plurality of pixel circuits comprise a plurality of first pixel drive circuits; the first gate signal line is connected to the gate of the drive transistor; the constant voltage line is configured to provide a first constant voltage to the plurality of pixel circuits; the shield electrode is connected to the constant voltage line, and an orthographic projection of the first gate signal line on the substrate falls into an orthographic projection of the shield electrode on the substrate;

the plurality of conductive layers comprise: a plurality of conductive lines, the plurality of conductive lines comprise a plurality of first type conductive lines and a plurality of second type conductive lines, an orthographic projection of a portion of the first type conductive line extending along a first direction on the substrate overlaps with an orthographic projection of at least one of the plurality of shield electrodes on the substrate, and an orthographic projection of a portion of the second type conductive line extending along the first direction on the substrate does not overlap with an orthographic projection of the plurality of shield electrodes on the substrate; and the light emitting structure layer comprises a plurality of first light emitting devices located in the first display region, the plurality of first light emitting devices comprise a plurality of first type first light emitting devices and a plurality of second type first light emitting devices, at least one of the plurality of first type first light emitting devices is connected to at least one of the plurality of first pixel drive circuits through at least one of the plurality of first type conductive lines, at least one of the plurality of second type first light emitting devices is connected to at least one of the plurality of first pixel drive circuits through at least one of the plurality of second type conductive lines, the first pixel drive circuit is configured to drive the first light emitting device to emit light, the first type first light emitting device is configured to emit light of a first color, the second type light emitting device is configured to emit light of a second color, and the light of the second color is different from the light of the first color.

2. The display panel according to claim 1, wherein
the plurality of first light emitting devices of the first display region comprise a plurality of groups of first light emitting devices, the first light emitting devices in each of the plurality of groups of first light emitting devices are arranged along the first direction, the plurality of groups of first light emitting devices are arranged along a second direction, and the second direction intersects with the first direction; and in at least one group of first light emitting devices, a plurality of first pixel drive circuits electrically connected to the plurality of first type first light emitting devices are closer to the first display region than each of a plurality of first pixel drive circuits electrically connected to the plurality of second type first light emitting devices.

3. The display panel according to claim 2, wherein
the plurality of conductive layers comprise a first transparent conductive layer, a second transparent conductive layer, and a third transparent conductive layer arranged in sequence along a side away from the substrate; and the first transparent conductive layer comprises a plurality of first transparent conductive lines, the second transparent conductive layer comprises a plurality of second transparent conductive lines, and the third transparent conductive layer comprises a plurality of third transparent conductive lines.

4. The display panel according to claim 3, wherein
in at least one group of first light emitting devices in the first display region, a plurality of first type first light emitting devices close to the center of the first display region are electrically connected to a plurality of first pixel drive circuits through the first transparent conductive line, and a plurality of first type first light emitting devices close to the edge of the first display region are electrically connected to a plurality of first pixel drive circuits through the third transparent conductive line.

5. The display panel according to claim 3, wherein
in at least one group of first light emitting devices in the first display region, a plurality of first type first light emitting devices close to the center of the first display region are electrically connected to a plurality of first pixel drive circuits through the first transparent conductive line, and a plurality of first type first light emitting devices close to an edge of the first display region are electrically connected to a plurality of first pixel drive circuits through the second transparent conductive line.

6. The display panel according to claim 3, wherein
in at least one group of first light emitting devices in the first display region, a plurality of first type first light emitting devices close to the center of the first display region are electrically connected to a plurality of first pixel drive circuits through the second transparent conductive line, and a plurality of first type first light emitting devices close to the edge of the first display region are electrically connected to a plurality of first pixel drive circuits in the second display region through the first transparent conductive line.

7. The display panel according to claim 3, wherein
in at least one group of first light emitting devices in the first display region, a plurality of first type first light emitting devices close to the center of the first display region are electrically connected to a plurality of first pixel drive circuits through the third transparent conductive line, and a plurality of first type first light emitting devices close to the edge of the first display region are electrically connected to a plurality of first pixel drive circuits in the second display region through the first transparent conductive line.

8. The display panel according to claim 4, wherein
in at least one group of first light emitting devices in the first display region, a plurality of second type first light emitting devices close to the center of the first display region are electrically connected to a plurality of first pixel drive circuits through the first transparent conductive line, and a plurality of second type first light emitting devices close to the edge of the first display region are electrically connected to a plurality of first pixel drive circuits through the third transparent conductive line.

9. The display panel according to claim 4, wherein
in the at least one group of first light emitting devices of the first display region, the transparent conductive line electrically connected to a plurality of second type first light emitting devices close to the center of the first display region are of the same type as the transparent conductive line electrically connected to a plurality of first type first light emitting devices close to the center of the first display region, or the transparent conductive line electrically connected to a plurality of second type first light emitting devices close to the edge of the first display region are of the same type as the transparent conductive line electrically connected to a plurality of first type first light emitting devices close to the edge of the first display region.

10. The display panel according to claim 4, wherein
in the at least one group of first light emitting devices of the first display region, the transparent conductive line electrically connected to a plurality of second type first light emitting devices close to the center of the first display region are different in type from a plurality of first type first light emitting devices close to the center of the first display region, or the transparent conductive line electrically connected to a plurality of second type first light emitting devices close to the edge of the first display region are of different type from the transparent conductive line electrically connected to a plurality of first type first light emitting devices close to the edge of the first display region.

11. The display panel according to claim 4, wherein
in at least one group of first light emitting devices in the first display region, a plurality of second type first light emitting devices close to the center of the first display region are electrically connected to a plurality of first pixel drive circuits through the first transparent conductive line, and a plurality of second type first light emitting devices close to the edge of the first display region are electrically connected to a plurality of first pixel drive circuits through the third transparent conductive line.

12. The display panel according to claim 4, wherein
in the at least one group of first light emitting devices of the first display region, the conductive line electrically connected to the plurality of first type first light emitting devices are located on one side of the transfer electrode of the at least one group of first light emitting devices in a second direction.

13. The display panel according to claim 12, wherein
in the at least one group of first light emitting devices of the first display region, the conductive line electrically connected to the plurality of second type first light emitting devices are located on the other side of the transfer electrode of the at least one group of first light emitting devices in a second direction.

14. The display panel according to claim 3, wherein
in the at least one group of first light emitting devices of the first display region, a plurality of first type first light emitting devices close to the center of the first display region are electrically connected to a plurality of first pixel drive circuits through the first transparent conductive line, a plurality of first type first light emitting devices close to the edge of the first display region are electrically connected to a plurality of first pixel drive circuits through the third transparent conductive line, and a plurality of first type first light emitting devices located between the plurality of first type first light emitting devices close to the center of the first display region and the plurality of first type first light emitting devices close to the edge of the first display region are electrically connected to a plurality of first pixel drive circuits through the second transparent conductive line; and
in the at least one group of first light emitting devices of the first display region, a plurality of second type first light emitting devices close to the center of the first display region are electrically connected to a plurality of first pixel drive circuits through the first transparent conductive line, a plurality of second type first light emitting devices close to the edge of the first display region are electrically connected to a plurality of first pixel drive circuits through the third transparent conductive line, and a plurality of second type first light emitting devices located between the plurality of second type first light emitting devices close to the center of the first display region and the plurality of second type first light emitting devices close to the edge of the first display region are electrically connected to a plurality of first pixel drive circuits through the second transparent conductive line.

15. The display panel according to claim 1, wherein
the first display region comprises a first sub-region and a second sub-region, wherein the second sub-region is located between the first sub-region and the second display region;
at least one first light emitting device located in the first sub-region of the plurality of first light emitting devices is connected to at least one of the plurality of first pixel drive circuits through conductive lines of the plurality of conductive layers; and
at least one first light emitting device located in the second sub-region of the plurality of first light emitting devices is connected to at least one first pixel drive circuit of the plurality of first pixel drive circuits through a conductive line of a metal conductive layer in the circuit structure layer.

16. The display panel according to claim 15, wherein the metal conductive layer and the shield electrode are in the same film layer.

17. The display panel according to claim 1, wherein
the light emitting structure layer further comprises a plurality of second light emitting devices located in the second display region;
the plurality of pixel circuits further comprises a plurality of second pixel drive circuits, at least one of the plurality of second pixel drive circuits is electrically connected to at least one of the plurality of second light emitting devices, and the at least one second pixel drive circuit is configured to drive the at least one second light emitting device to emit light.

18. The display panel according to claim 17, wherein
the second display region comprises a transition display region and a normal display region, wherein the transition display region is located between the first display region and the normal display region;
the transition display region comprises a plurality of first pixel drive circuits; and
the normal display region comprises at least portions of the plurality of second light emitting devices and at least portions of the plurality of second pixel drive circuits, at least portions of the plurality of second light emitting devices are connected to at least portions of the plurality of second pixel drive circuits;
wherein the first color light is green light, and the second color light comprises at least one of blue light and red light.

19. A display apparatus, comprising the display panel according to claim 1.

20. The display apparatus according to claim 19, further comprising: a sensor, the sensor is located on a non-display side of the display panel, and an orthographic projection of the sensor on the display panel overlaps with the first display region of the display panel.

* * * * *